(12) United States Patent
Shibayama et al.

(10) Patent No.: US 10,558,119 B2
(45) Date of Patent: *Feb. 11, 2020

(54) COMPOSITION FOR COATING RESIST PATTERN

(71) Applicant: NISSAN CHEMICAL INDUSTRIES, LTD., Tokyo (JP)

(72) Inventors: Wataru Shibayama, Toyama (JP); Makoto Nakajima, Toyama (JP); Shuhei Shigaki, Toyama (JP); Hiroaki Yaguchi, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 15/577,015

(22) PCT Filed: May 20, 2016

(86) PCT No.: PCT/JP2016/065090
§ 371 (c)(1),
(2) Date: Nov. 27, 2017

(87) PCT Pub. No.: WO2016/190261
PCT Pub. Date: Dec. 1, 2016

(65) Prior Publication Data
US 2018/0149977 A1 May 31, 2018

(30) Foreign Application Priority Data

May 25, 2015 (JP) .................................. 2015-105781
Sep. 11, 2015 (JP) .................................. 2015-180167
Dec. 21, 2015 (JP) .................................. 2015-248927

(51) Int. Cl.
| | |
|---|---|
| *G03F 7/11* | (2006.01) |
| *C09D 183/04* | (2006.01) |
| *C08G 77/04* | (2006.01) |
| *H01L 21/308* | (2006.01) |
| *G03F 7/16* | (2006.01) |
| *G03F 7/20* | (2006.01) |
| *G03F 7/38* | (2006.01) |
| *G03F 7/32* | (2006.01) |
| *C08G 77/26* | (2006.01) |
| *C09D 183/08* | (2006.01) |
| *G03F 7/40* | (2006.01) |
| *C08G 77/00* | (2006.01) |

(52) U.S. Cl.
CPC ............. *G03F 7/11* (2013.01); *C08G 77/04* (2013.01); *C08G 77/045* (2013.01); *C08G 77/26* (2013.01); *C09D 183/04* (2013.01); *C09D 183/08* (2013.01); *G03F 7/162* (2013.01); *G03F 7/168* (2013.01); *G03F 7/2006* (2013.01); *G03F 7/322* (2013.01); *G03F 7/38* (2013.01); *G03F 7/405* (2013.01); *H01L 21/3081* (2013.01); *H01L 21/3086* (2013.01); *C08G 77/70* (2013.01)

(58) Field of Classification Search
None
See application file for complete search history.

(56) References Cited

U.S. PATENT DOCUMENTS

| | | | | |
|---|---|---|---|---|
| 10,139,729 | B2 * | 11/2018 | Yaguchi | .................... G03F 7/40 |
| 2010/0086872 | A1 * | 4/2010 | Ogihara | ............... C09D 183/04 430/272.1 |
| 2012/0028195 | A1 * | 2/2012 | Wu | ...................... C09D 183/08 430/323 |
| 2013/0071560 | A1 * | 3/2013 | Rao | ....................... G03F 7/0752 427/162 |
| 2014/0356792 | A1 * | 12/2014 | Noya | ........................ G03F 7/11 430/325 |
| 2016/0251546 | A1 * | 9/2016 | Nakajima | ................ C09D 1/00 438/695 |
| 2017/0154766 | A1 * | 6/2017 | Ogihara | .................. G03F 7/038 |
| 2017/0283649 | A1 * | 10/2017 | Fukaumi | ................. B05D 7/24 |
| 2018/0197731 | A1 * | 7/2018 | Shigaki | ................. C08G 77/20 |

FOREIGN PATENT DOCUMENTS

| | | |
|---|---|---|
| JP | H07-050286 A | 2/1995 |
| JP | 2005-277052 A | 10/2005 |
| JP | 2009-301007 A | 12/2009 |
| JP | 2010-066597 A | 3/2010 |
| JP | 2010-096896 A | 4/2010 |
| JP | 2011-027980 A | 2/2011 |
| JP | 2013-536463 A | 9/2013 |
| JP | 2014-157301 A | 8/2014 |
| WO | 2012/128251 A1 | 9/2012 |
| WO | 2013/012068 A1 | 1/2013 |

(Continued)

OTHER PUBLICATIONS

Aug. 16, 2016 Written Opinion issued in International Patent Application No. PCT/JP2016/065090.

(Continued)

*Primary Examiner* — Angel Roman
(74) *Attorney, Agent, or Firm* — Oliff PLC

(57) ABSTRACT

The invention provides a composition for coating a resist pattern and reversing the pattern by utilizing a difference in etching rates. A composition for applying to a resist pattern includes a component (A) which is at least one compound selected from the group consisting of a metal oxide (a1), a polyacid (a2), a polyacid salt (a3), a hydrolyzable silane (a4), a hydrolysis product (a5) of the hydrolyzable silane, and a hydrolysis condensate (a6) of the hydrolyzable silane; and a component (B), which is an aqueous solvent, in which the hydrolyzable silane (a4) is (i) a hydrolyzable silane containing an organic group having an amino group, (ii) a hydrolyzable silane containing an organic group having an ionic functional group, (iii) a hydrolyzable silane containing an organic group having hydroxy group, or (iv) a hydrolyzable silane containing an organic group having a functional group convertible to hydroxy group.

15 Claims, No Drawings

(56) References Cited

FOREIGN PATENT DOCUMENTS

| | | |
|---|---|---|
| WO | 2013/022081 A1 | 2/2013 |
| WO | 2014/080835 A1 | 5/2014 |
| WO | 2015/025665 A1 | 2/2015 |
| WO | 2015/053194 A1 | 4/2015 |
| WO | 2016/031563 A1 | 3/2016 |

OTHER PUBLICATIONS

Aug. 16, 2016 International Search Report issued in International Patent Application No. PCT/JP2016/065090.

* cited by examiner

COMPOSITION FOR COATING RESIST PATTERN

TECHNICAL FIELD

The present invention relates to a coating composition for coating a resist pattern in a process formed from a resist during development by a lithographic process or for coating a resist pattern after development, and a technology of reversing the pattern by applying the coating composition to fill the resist pattern with the coating composition, and thereafter etching and removing the resist by dry etching or the like.

BACKGROUND ART

In recent years, a phenomenon in which a pattern is collapsed during development carried out after exposure of a resist in a lithography process and a process of rinsing a development liquid due to formation of finer patterns has caused a problem.

This pattern collapse is considered to be caused by the surface tension when the development liquid or a rinsing liquid is dried and force acting between the patterns due to a force accompanied by the flow of the liquids, that is, Laplace force. The pattern collapse is also considered to be caused by Laplace force generated when the development liquid and the rinsing liquid are flown out to the outside by using a centrifugal force.

In order to solve such problems, a method for forming a pattern including steps of forming a resist film on a substrate; selectively irradiating the resist film with energy rays in order to form a latent image in the resist film; supplying a development liquid (an alkaline development liquid) onto the resist film in order to form a resist pattern from the resist film in which the latent image is formed; supplying a rinsing liquid on the substrate in order to replace the development liquid with the rinsing liquid onto the substrate; supplying a material for a coating film on the substrate in order to replace the rinsing liquid with the material for a coating film containing at least a part of the solvent in the rinsing liquid and a solute different from the resist film; volatilizing the solvent in the material for a coating film in order to form a coating film covering the resist film on the substrate; setting back at least a part of the surface of the coating film in order to expose at least a part of the upper surface of the resist pattern and to form a mask pattern configured by the coating film; and processing the substrate using the mask pattern has been disclosed (refer to Patent Document 1).

A method for producing a resist structure including treating an exposed photoresist layer with an aqueous solution or a hydroalcoholic solution of polyfunctional aminosiloxane or hydroxysiloxane and etching in an oxygen-containing plasma has also been disclosed (refer to Patent Document 2).

Moreover, a method for forming a pattern including forming a resist pattern by a resist material containing a base generator, coating the resist pattern with a silicon-containing substance to form a crosslinked part and an uncrosslinked part of the silicon-containing material, and removing the uncrosslinked part has been disclosed (refer to Patent Document 3). Hydroxy group-containing organic groups are included in the silicon-containing substance.

A method for forming a pattern using an organic solvent of a novolak resin or a polyalkylsiloxane as a rinsing liquid or a subsequent coating liquid to be used has also been disclosed (refer to Patent Document 4).

A method for forming a pattern using an aqueous solvent of a polyalkylsiloxane as a rinsing liquid or a subsequent coating liquid to be used has also been disclosed (refer to Patent Document 5).

PRIOR ART DOCUMENTS

Patent Documents

Patent Document 1: Japanese Patent Application Publication No. 2005-277052 (JP 2005-277052 A)
Patent Document 2: Japanese Patent Application Publication No. H7-050286 (JP H7-050286 A)
Patent Document 3: Japanese Patent Application Publication No. 2011-027980 (JP 2011-027980 A)
Patent Document 4: WO 2012/128251 Pamphlet
Patent Document 5: WO 2015/025665 Pamphlet

SUMMARY OF THE INVENTION

Problem to be Solved by the Invention

As described above, the conventional technology is the method including developing a resist surface after exposure with a development liquid, thereafter rinsing with a rinsing liquid, replacing the rinsing liquid with a coating liquid containing a polymer component, coating the resist pattern with the polymer component, and removing the resist by dry etching to form a reverse pattern with the replaced polymer component.

In the above method, however, Laplace force may act to cause pattern collapse when a resist is removed with the development liquid or the rinsing liquid to form a resist pattern.

Furthermore, when the resist pattern becomes fine, the pattern collapse due to Laplace force also occurs at the time of spin-drying the development liquid at development. The present invention provides a material and a method for preventing such pattern collapse.

More specifically, the present invention provides a material, in which in order not to cause resist pattern collapse when a fine pattern is formed the polymer-containing coating composition is filled into the spaces of the pattern by applying the coating composition onto the resist pattern, the layer made of the polymer in the composition is formed in the spaces of the resist pattern after drying, and difference between gas etching rates of the resist pattern and the polymer layer in the spaces of the resist pattern is used to reverse the pattern with gas etching.

Means for Solving the Problem

The present invention includes, as a first aspect, a composition for applying to a resist pattern comprising: a component (A), which is at least one compound selected from the group consisting of a metal oxide (a1), a polyacid (a2), a polyacid salt (a3), a hydrolyzable silane (a4), a hydrolysis product (a5) of the hydrolyzable silane, and a hydrolysis condensate (a6) of the hydrolyzable silane; and
a component (B), which is an aqueous solvent,
in which the hydrolyzable silane (a4) is (i) a hydrolyzable silane containing an organic group having an amino group, (ii) a hydrolyzable silane containing an organic group having an ionic functional group, (iii) a hydrolyzable silane containing an organic group having hydroxy group, or (iv) a hydrolyzable silane containing an organic group having a functional group convertible to hydroxy group, as a second aspect, the composition according to the first aspect, in which the metal oxide (a1) is an oxide of titanium, tungsten, zirconium, aluminum, or hafnium, as a third aspect, the composition according to the first aspect, in which the polyacid (a2) is an isopolyacid selected from metatungstic acid or molybdic acid, as a fourth aspect, the composition according to the first aspect, in which the polyacid (a2) is a heteropolyacid selected from silicotungstic acid or phosphomolybdic acid, as a fifth aspect, the composition according to the first aspect, in which the polyacid salt (a3) is an ammonium salt of the isopolyacid according to the third aspect or an ammonium salt of the heteropolyacid according to the fourth aspect, as a sixth aspect, the composition according to the first aspect, in which the hydrolysis product of the hydrolyzable silane (a4) is a product obtained by hydrolyzing the hydrolyzable silane (a4) in the presence of an alkaline substance, as a seventh aspect, the composition according to the sixth aspect, in which the alkaline substance is an alkaline catalyst to be added at the time of hydrolysis of the hydrolyzable silane or is an amino group present in molecule of the hydrolyzable silane, as an eighth aspect, the composition according to the first aspect, in which the hydrolysis product of the hydrolyzable silane (a4) is a product obtained by hydrolyzing the hydrolyzable silane (a4) in the presence of an acidic substance, as a ninth aspect, the composition according to the first aspect, in which the hydrolyzable silane (a4) is a hydrolyzable silane of Formula (1) or Formula (1-1):

   Formula (1)

   Formula (1-1)

(wherein $R^3$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom; $R^1$ is an alkyl group, an aryl group, a halogenated alkyl group, a halogenated aryl group, an alkenyl group, or an organic group having an epoxy group, acryloyl group, methacryloyl group, mercapto group, or cyano group and bonding to a silicon atom through a Si—C bond; $R^2$ is an alkoxy group, an acyloxy group, or a halogen group; $a_0$ is an integer of 0 or 1; $b_0$ is an integer of 1 to 3; $c_0$ is an integer of 1 or 2;

$R^{10}$ and $R^{20}$ each are hydroxy group, an alkoxy group, an acyloxy group, or a halogen group; $R^{30}$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom; and n0 is an integer of 1 to 10), as a tenth aspect, the composition according to the ninth aspect, in which the composition comprises a combination of the hydrolyzable silane (a4) of Formula (1) or Formula (1-1) and at least one hydrolyzable silane (b) selected from the group consisting of hydrolyzable silanes of Formula (2):

   Formula (2)

(wherein $R^4$ is an alkyl group, an aryl group, a halogenated alkyl group, a halogenated aryl group, an alkenyl group, or an organic group having acryloyl group, methacryloyl group, mercapto group, or cyano group and bonding to a silicon atom through a Si—C bond; $R^5$ is an alkoxy group, an acyloxy group, or a halogen group; and a is an integer of 0 to 3) and Formula (3):

   Formula (3)

(wherein $R^6$ is an alkyl group; $R^7$ is an alkoxy group, an acyloxy group, or a halogen group; Z is an alkylene group or an arylene group; b is an integer of 0 or 1; and c is an integer of 0 or 1), as an eleventh aspect, the composition according to the tenth aspect, in which the hydrolyzable silane is a hydrolyzable silane containing the hydrolyzable silane (a4) and the hydrolyzable silane (b) in a molar ratio of (a4):(b)=3:97 to 100:0, as a twelfth aspect, the composition according to the first aspect, in which the hydrolysis condensate (a6) of the hydrolyzable silane is a random-type, ladder-type, or cage-type silsesquioxane, as a thirteenth aspect, the composition according to any one of the first aspect to the twelfth aspect, further comprising an acid or a base, as a fourteenth aspect, the composition according to any one of the first aspect to the thirteenth aspect, further comprising a surfactant, as a fifteenth aspect, the composition according to any one of the first aspect to the fourteenth aspect, further comprising a photoacid generator, as a sixteenth aspect, a method for producing a semiconductor device comprising: (1) a step of applying a resist onto a substrate; (2) a step of exposing and developing the resist; (3) a step of applying the composition according to any one of the first aspect to the fifteenth aspect to the resist pattern during development or after development; and (4) a step of etching and removing the resist pattern to reverse the pattern, as a seventeenth aspect, the method for producing a semiconductor device according to the sixteenth aspect, further comprising (1-1) a step of forming a resist underlayer film on the substrate before the step (1), as a eighteenth aspect, the method for producing a semiconductor device according to the sixteenth aspect or the seventeenth aspect, further comprising (3-1) a step of exposing a surface of the resist pattern by etching back a surface of a formed coating film after the step (3), and as a nineteenth aspect, a method for producing a semiconductor device comprising: (a) a step of forming a resist underlayer film on a substrate; (b) a step of forming a hard mask on the resist underlayer film; (c) a step of forming a resist film on the hard mask; (d) a step of forming a resist pattern by light or electron beam irradiation and development; (e) a step of etching the hard mask using the resist pattern; (f) a step of etching the resist underlayer film using the patterned hard mask; (g) a step of applying the composition according to any one of the first aspect to the fifteenth aspect to the patterned resist underlayer film; and (h) a step of etching and removing the resist underlayer film to reverse the pattern.

Effects of the Invention

The coating composition containing the polymer for pattern formation of the present invention can prevent the collapse of the resist pattern by contacting the composition to the resist surface after mask exposure or during or after development of the resist by filling the spaces of the resist pattern with the polymer. Thereafter, the filled polymer forms a new resist pattern by dry etching the surface at which the polymer is filled into the spaces of the resist pattern and removing the resist pattern. The present invention allows the fine pattern without collapse to be formed by this reverse process.

The pattern can be reversed by using the coating composition applied onto the resist pattern and filled into the spaces of the resist pattern by etching back by dry etching to expose the resist surface and thereafter dry etching using a gas having the high etching rate (oxygen-based gas) of the resist in order to reverse the pattern when the resist pattern is fully coated with the coating composition.

MODES FOR CARRYING OUT THE INVENTION

The present invention includes a composition for applying to a resist pattern comprising:

a component (A), which is at least one compound selected from the group consisting of a metal oxide (a1), a polyacid (a2), a polyacid salt (a3), a hydrolyzable silane (a4), a hydrolysis product (a5) of the hydrolyzable silane, and a hydrolysis condensate (a6) of the hydrolyzable silane; and a component (B), which is an aqueous solvent, in which the hydrolyzable silane (a4) is (i) a hydrolyzable silane containing an organic group having an amino group, (ii) a hydrolyzable silane containing an organic group having an ionic functional group, (iii) a hydrolyzable silane containing an organic group having hydroxy group, or (iv) a hydrolyzable silane containing an organic group having a functional group convertible to hydroxy group.

The composition is a composition in which at least one compound selected from the group consisting of the metal oxide (a1), the polyacid (a2), the polyacid salt (a3), the hydrolyzable silane (a4), the hydrolysis product (a5) of the hydrolyzable silane, and the hydrolysis condensate (a6) of the hydrolyzable silane is dissolved in a solvent. The solid content of the composition is 0.5% by mass to 20.0% by mass or 1.0% by mass to 10.0% by mass. The solid content is the ratio of the remaining substances of the composition formed by removing the solvent from the composition. (a6) is a polysiloxane.

The ratio of the at least one compound selected from the group consisting of the metal oxide (a1), the polyacid (a2), the polyacid salt (a3), the hydrolyzable silane (a4), the hydrolysis product (a5) of the hydrolyzable silane, and the hydrolysis condensate (a6) of the hydrolyzable silane contained in the solid content is 50% by mass to 100% by mass or 80% by mass to 100% by mass.

The concentration of the at least one compound selected from the group consisting of the metal oxide (a1), the polyacid (a2), the polyacid salt (a3), the hydrolyzable silane (a4), the hydrolysis product (a5) of the hydrolyzable silane, and the hydrolysis condensate (a6) of the hydrolyzable silane in the composition is 0.5% by mass to 20.0% by mass.

When the component (A) is classified into a component (A1) selected from the metal oxide (a1), the polyacid (a2), and the polyacid salt (a3) and a component (A2) selected from the hydrolyzable silane (a4), the hydrolysis product (a5) of the hydrolyzable silane, and the hydrolysis condensate (a6) of the hydrolyzable silane, there are cases of using the component (A1) alone, using the component (A2) alone, and using the component (A1) and the component (A2) with mixing. When (A1) and (A2) are used with mixing, these components can be used in a mass ratio of (A1):(A2) of 50:1 to 0.05:1.

In the present invention, the composition for coating is a composition used after exposure of the resist and thus the composition is filled onto the resist pattern during development or after development subsequently carried out after the exposure of the resist though the mask.

The hydrolyzable silane, the hydrolysis product thereof, and the hydrolysis condensate thereof have a resin component different from the resin component of the resist.

As a result, the resist is selectively dry-etched and removed in the later dry etching process by selecting the gas species and a new pattern is formed by the filled hydrolysis condensate (polysiloxane) or an inorganic compound.

Water is preferably used as the solvent used in the composition and preferably the solvent is constituted of 100% of water, that is, water alone. This is because a solvent that may dissolve the resist pattern cannot be used due to the application of the composition onto the resist pattern. However, a water-soluble organic solvent that can be mixed with a water solvent and does not dissolve the resist pattern, for example, an alcohol-based solvent or an ether-based solvent can be included.

The above-described hydrolyzable silane, the hydrolysis product thereof, and the hydrolysis condensate thereof can be used as a mixture thereof. A compound formed by condensing a hydrolysis product obtained by hydrolyzing the hydrolyzable silane can be used as the condensate. A mixture of a partial hydrolysis product in which hydrolysis is not fully completed at the time of obtaining the hydrolysis condensate and the silane compound is mixed with the hydrolysis condensate can also be used. The condensate is a polymer having a polysiloxane structure.

The at least one compound selected from the group consisting of the metal oxide (a1), the polyacid (a2), the polyacid salt (a3), the hydrolyzable silane (a4), the hydrolysis product (a5) of the hydrolyzable silane, and the hydrolysis condensate (a6) of the hydrolyzable silane can be contained in an amount of 0.001 part by mass to 100 parts by mass relative to 100 parts by mass of the composition applied to the resist pattern.

As the metal oxide (a1), an oxide of titanium, tungsten, zirconium, aluminum, or hafnium can be selected.

As the polyacid (a2), an isopolyacid selected from metatungstic acid or molybdic acid can be used.

As the polyacid (a2), a heteropoly acid selected from silicotungstic acid or phosphomolybdic acid can also be used.

As the polyacid salt (a3), an ammonium salt of the isopolyacid or an ammonium salt of the heteropolyacid can be used.

As the metal oxide, a partial metal oxide can also be used. Examples of the metal oxide and the partial metal oxide include a hydrolysis condensate containing $TiO_x$ (titanium oxide, x=1 to 2), a hydrolysis condensate containing WO, (tungsten oxide, x=1 to 3), a hydrolyzed condensate containing $HfO_x$ (hafnium oxide, x=1 to 2), a hydrolysis condensate containing $ZrO_x$ (zirconium oxide, x=1 to 2), a hydrolytic condensate containing $AlO_x$ (aluminum oxide, x=1 to 1.5), metatungstic acid, ammonium metatungstate, silicotungstic acid, ammonium silicotungstate, molybdic acid, ammonium molybdate, phosphomolybdic acid, and ammonium phosphomolybdate. The metal oxide to be added may be contained in an amount of 0.001 part by mass to 100 parts by mass relative to 100 parts by mass of the composition applied to the resist pattern. The metal oxide or the partial metal oxide can be obtained as the hydrolysis condensate of a metal alkoxide and the partial metal oxide may contain alkoxide groups.

As the hydrolyzable silane (a4), the hydrolyzable silane of Formula (1) or Formula (1-1) can be used.

The hydrolysis product (a5) of the hydrolyzable silane corresponds to the hydrolysis product of the hydrolyzable silane (a4). The hydrolysis condensate (a6) of the hydrolyzable silane is the condensate of the hydrolysis product (a5) of the hydrolyzable silane (a4).

In Formula (1), $R^3$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom; $R^1$ is an alkyl group, an aryl group, a halogenated alkyl group, a halogenated aryl group, an alkenyl group, or an organic group having an epoxy group, acryloyl group, methacryloyl group, mercapto group, or cyano group and bonding to a silicon atom through a Si—C bond; $R^2$ is an alkoxy group, an acyloxy group, or a halogen group; $a_0$ is an integer of 0 or 1; $b_0$ is an integer of 1 to 3, and $c_0$ is an integer of 1 or 2.

In Formula (1-1), $R^{10}$ and $R^{20}$ each are hydroxy group, an alkoxy group, an acyloxy group, or a halogen group and $R^{30}$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom. Examples of n0 include an integer of 0 or 10, an integer of 1 to 5, or an integer of 1.

Examples of $R^3$ in Formula (1) or $R^{30}$ in Formula (1-1) may include an organic group having an amino group. As the amino group, a primary amino group, a secondary amino group, and a tertiary amino group can be used and one amino group or a plurality (two or three) of amino groups can be contained in one molecule. As these amino groups, aliphatic amino groups and aromatic amino groups can be used.

Examples of $R^3$ in Formula (1) or $R^{30}$ in Formula (1-1) may also include an organic group having an ionic functional group. Examples of the ionic functional group include an ammonium cation, a carboxylate anion, a sulfonate anion, a nitrate anion, a phosphate anion, a sulfonium anion, and an alcoholate anion. Examples of the ammonium cations include a primary ammonium, a secondary ammonium, a tertiary ammonium, and a quaternary ammonium.

Examples of counter ions of the ionic functional group include anions such as a chloride anion, a fluoride anion, a bromide anion, a iodide anion, a nitrate anion, a sulfate anion, a phosphate anion, a formate anion, an acetate anion, a propionate anion, a maleate anion, an oxalate anion, a malonate anion, a methylmalonate anion, a succinate anion, a malate anion, a tartrate anion, a phthalate anion, a citrate anion, a glutarate anion, a citrate anion, a lactate anion, a salicylate anion, a methanesulfonate anion, an octanoate anion, a decanoate anion, an octanesulfonate anion, a decanesulfonate anion, a dodecylbenzenesulfonate anion, a phenolsulfonate anion, a sulfosalicylate anion, a camphorsulfonate anion, a nonafluorobutanesulfonate anion, a toluenesulfonate anion, a cumenesulfonate anion, a p-octylbenzenesulfonate anion, a p-decylbenzenesulfonate anion, a 4-octyl-2-phenoxybenzenesulfonate anion, and a 4-carboxybenzenesulfonate anion. The counter ions may also include a silane having an anionic functional group, a polysiloxane having an anionic functional group, or a unit structure of a polysiloxane having an anionic functional group for forming an intramolecular salt.

Examples of the counter ions of the ionic functional group include cations such as a hydrogen cation, an ammonium cation, a sulfonium cation, an iodonium cation, a phosphonium cation, and an oxonium cation.

Examples of $R^3$ in Formula (1) or $R^{30}$ in Formula (1-1) may include an organic group having hydroxy group or an organic group having a functional group convertible to hydroxy group by hydrolysis.

As the organic group having hydroxy group or the organic group having a functional group convertible to hydroxy group by hydrolysis, examples of the organic group include an alkyl group and an aryl group that optionally include an ether bond or an amino group.

Examples of the organic group having a functional group convertible to hydroxy group include acyloxy groups such as acetoxy group, epoxy groups such as glycidyl group, alkoxy groups such as methoxy group, ethoxy group, propoxy group, and butoxy group, and halogen groups such as fluoro group, chloro group, bromo group, and iodo group.

The above-described alkyl group is a linear or branched alkyl group having a carbon atom number of 1 to 10 and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The cyclic alkyl group can also be used and examples of a cyclic alkyl group having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethylcyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The above-described aryl group includes a $C_{6-20}$ aryl group and examples of the aryl group include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The above-described halogenated alkyl group and halogenated aryl group include a group in which the hydrogen atom of the above-described alkyl group and aryl group is substituted with a halogen atom such as fluorine, chlorine, bromine, and iodine.

The above-described alkenyl group is a $C_{2-10}$ alkenyl group and examples of the alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, I-methyl-2-propenyl group, I-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and a 3-cyclohexenyl group.

Organic groups formed by substituting the hydrogen atoms of these alkenyl groups with halogen atoms such as fluorine, chlorine, bromine, and iodine may also be included.

Examples of the above-described organic group having an epoxy group include glycidoxymethyl group, glycidoxyethyl group, glycidoxypropyl group, glycidoxybutyl group, and epoxycyclohexyl group.

Examples of the above-described organic group having acryloyl group include acryloylmethyl group, acryloylethyl group, and acryloylpropyl group.

Examples of the above-described organic group having methacryloyl group include methacryloylmethyl group, methacryloylethyl group, and methacryloylpropyl group.

Examples of the above-described organic group having mercapto group include ethylmercapto group, butylmercapto group, hexylmercapto group, and octylmercapto group.

Examples of the above-described organic group having cyano group include cyanoethyl group and cyanopropyl group.

The above-described alkoxy groups included in $R^2$ of Formula (1), $R^{10}$ and $R^{20}$ in Formula (1-1), $R^5$ in Formula (2), and $R^7$ in Formula (3) include alkoxy groups having the linear, branched and cyclic alkyl moiety having a carbon atom number of 1 to 20. Examples of the alkoxy groups having the linear and branched alkyl moiety having a carbon atom number of 1 to 20 include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the alkoxy groups having the cyclic alkyl moiety having a carbon atom number of 1 to 20 include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The above-described acyloxy group included in $R^2$ in Formula (1), $R^{10}$ and $R^{20}$ in Formula (1-1), $R^5$ in Formula (2), and $R^7$ in Formula (3) includes a $C_{1-20}$ acyloxy group. Examples of the acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1,2-trimethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-described halogen group included in $R^2$ in Formula (1), $R^{10}$ and $R^{20}$ in Formula (1-1), $R^5$ in Formula (2), and $R^7$ in Formula (3) include fluorine group, chlorine group, bromine group, and iodine group.

Examples of the above-described alkylene group or arylene group in Z include divalent organic groups derived from the above-described alkyl group or aryl group.

Examples of the hydrolyzable silanes of Formula (1) in which $R^3$ contains an organic group having an amino group are illustrated below. In the exemplified compounds illustrated below, T means a hydrolyzable group, for example, an alkoxy group, an acyloxy group, or a halogen group, and specific examples of these groups include the above-described examples. In particular, the alkoxy group such as methoxy group and ethoxy group is preferable.

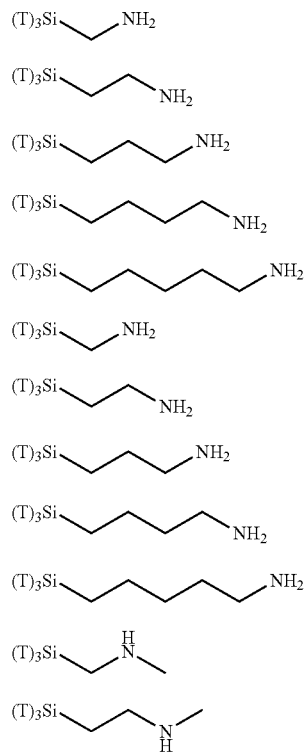
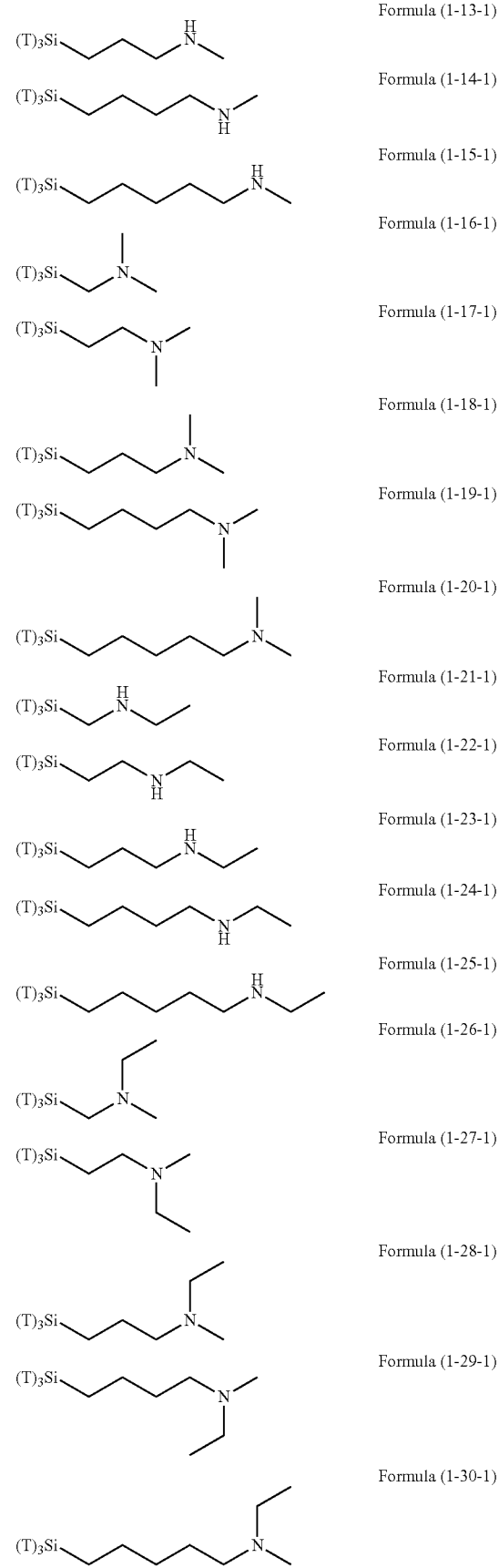

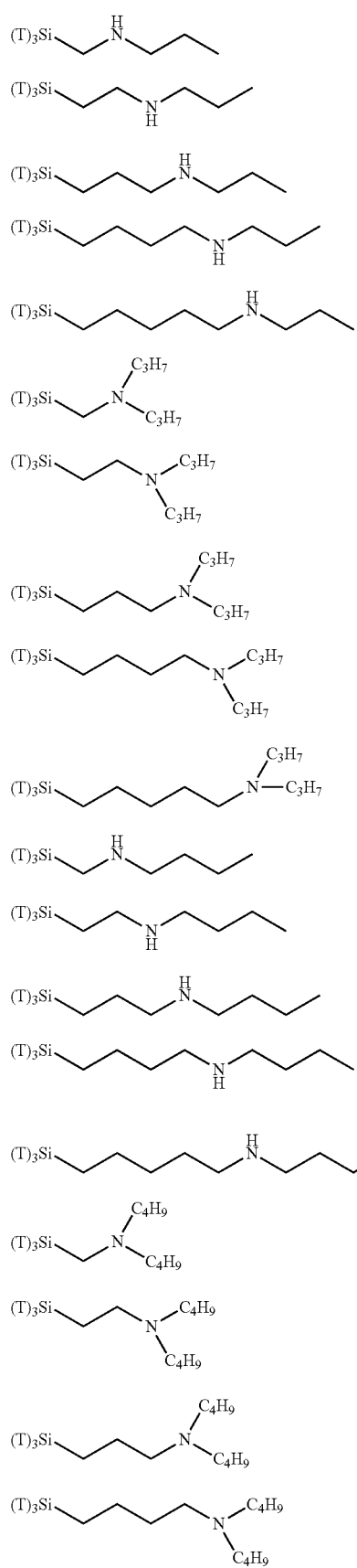
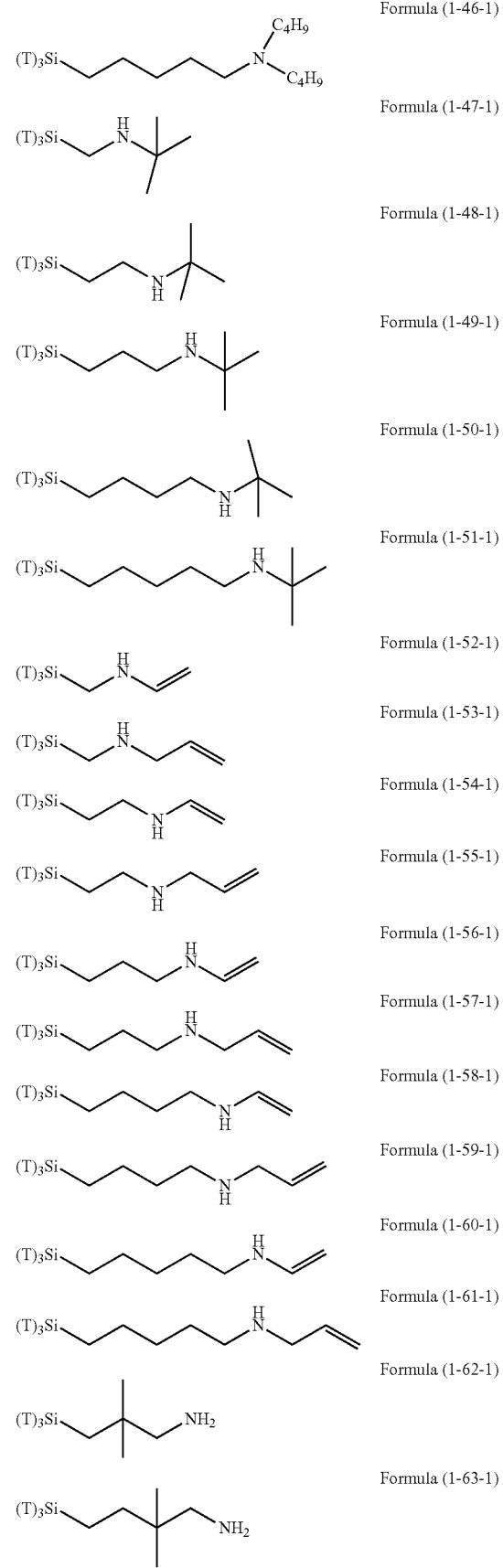

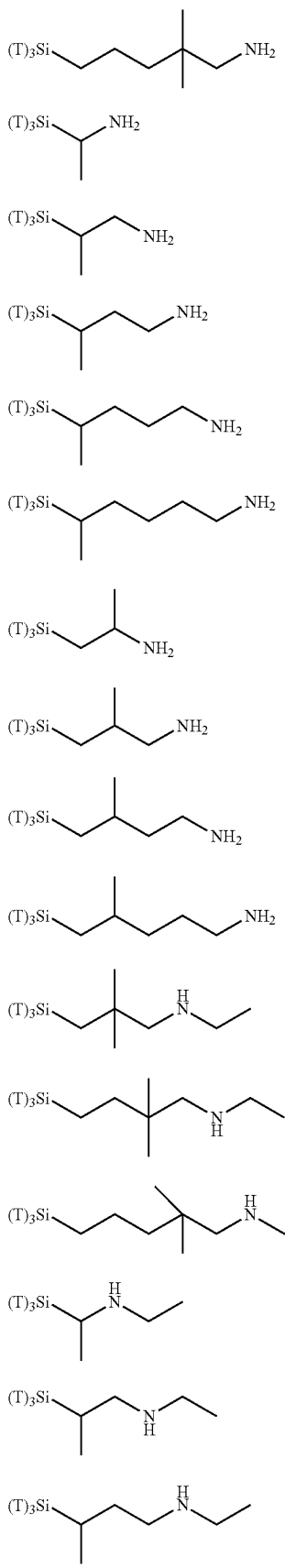
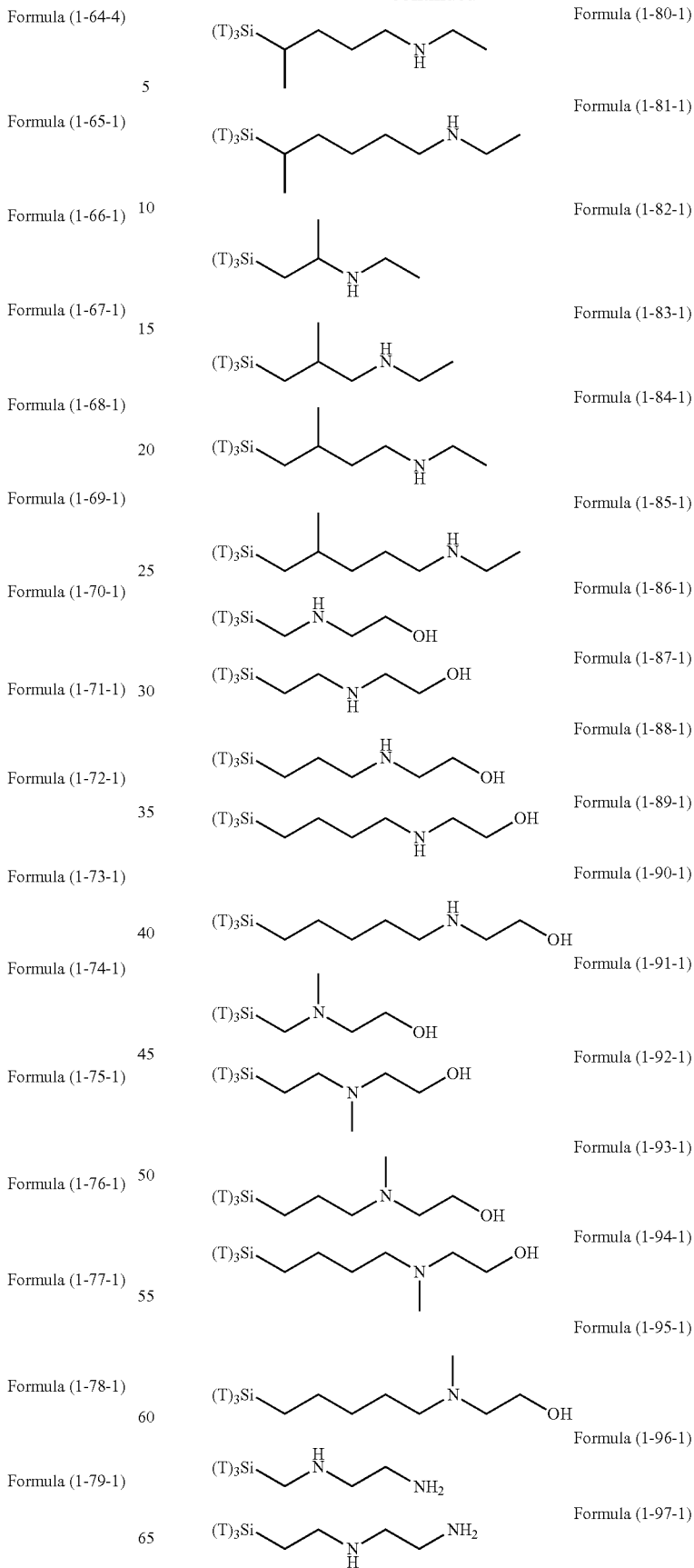

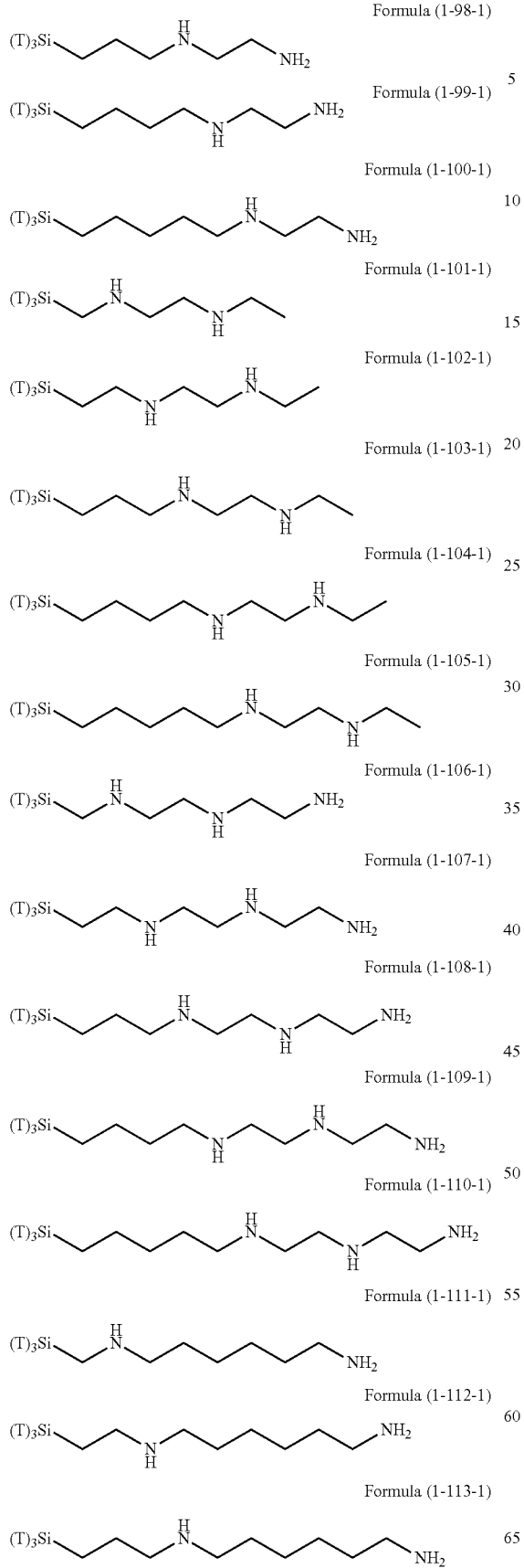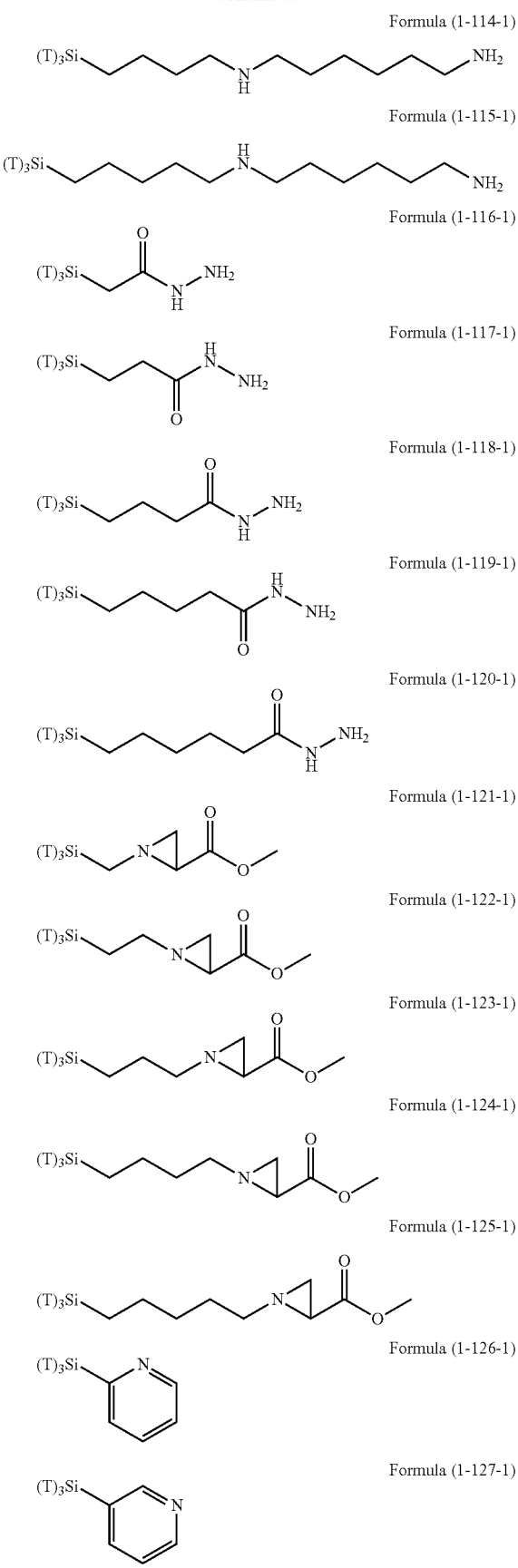

-continued
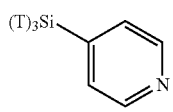 Formula (1-128-1)
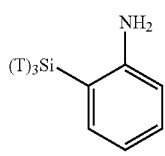 Formula (1-129-1)
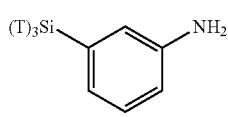 Formula (1-130-1)
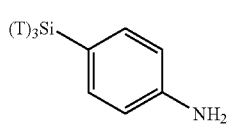 Formula (1-131-1)
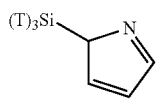 Formula (1-132-1)
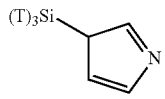 Formula (1-133-1)
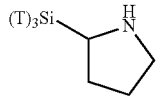 Formula (1-134-1)
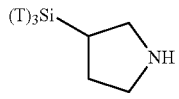 Formula (1-135-1)
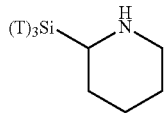 Formula (1-136-1)
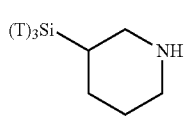 Formula (1-137-1)
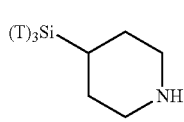 Formula (1-138-1)
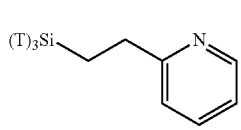 Formula (1-139-1)
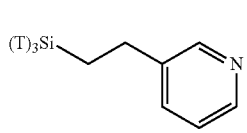 Formula (1-140-1)
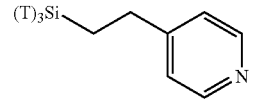 Formula (1-141-1)
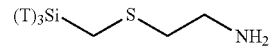 Formula (1-142-1)
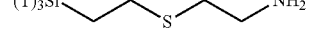 Formula (1-143-1)
 Formula (1-144-1)
 Formula (1-145-1)
 Formula (1-146-1)
 Formula (1-147-1)
 Formula (1-148-1)
 Formula (1-149-1)
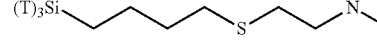 Formula (1-150-1)
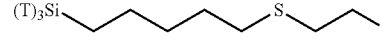 Formula (1-151-1)
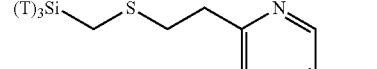 Formula (1-152-1)
 Formula (1-153-1)
Formula (1-154-1)
Formula (1-155-1)
Formula (1-156-1)
Formula (1-157-1)

-continued
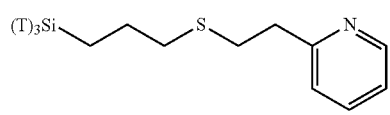
Formula (1-158-1)
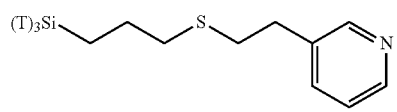
Formula (1-159-1)
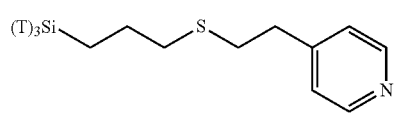
Formula (1-160-1)
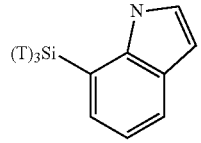
Formula (1-161-1)
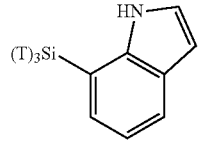
Formula (1-162-1)
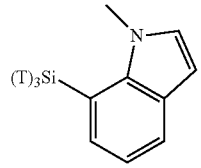
Formula (1-163-1)
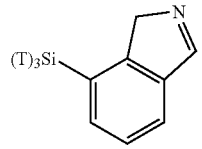
Formula (1-164-1)
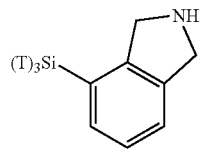
Formula (1-165-1)
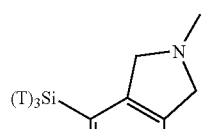
Formula (1-166-1)
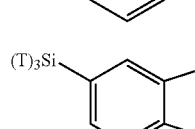
Formula (1-167-1)
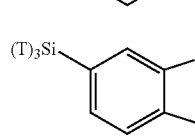
Formula (1-168-1)
-continued
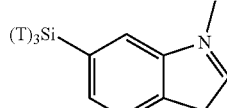
Formula (1-169-1)
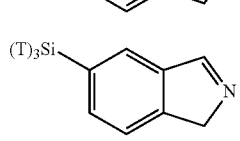
Formula (1-170-1)
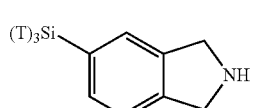
Formula (1-171-1)
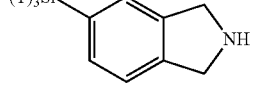
Formula (1-172-1)
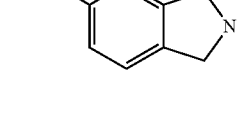
Formula (1-173-1)
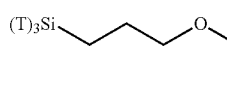
Formula (1-174-1)
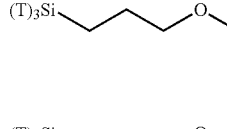
Formula (1-175-1)
Formula (1-176-1)
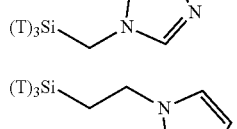
Formula (1-177-1)
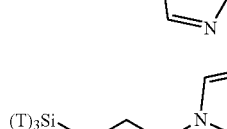
Formula (1-178-1)
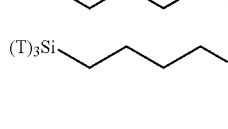
Formula (1-179-1)
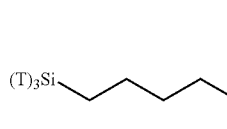
Formula (1-180-1)
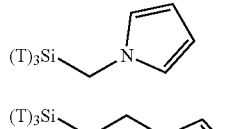
Formula (1-181-1)
Formula (1-182-1)

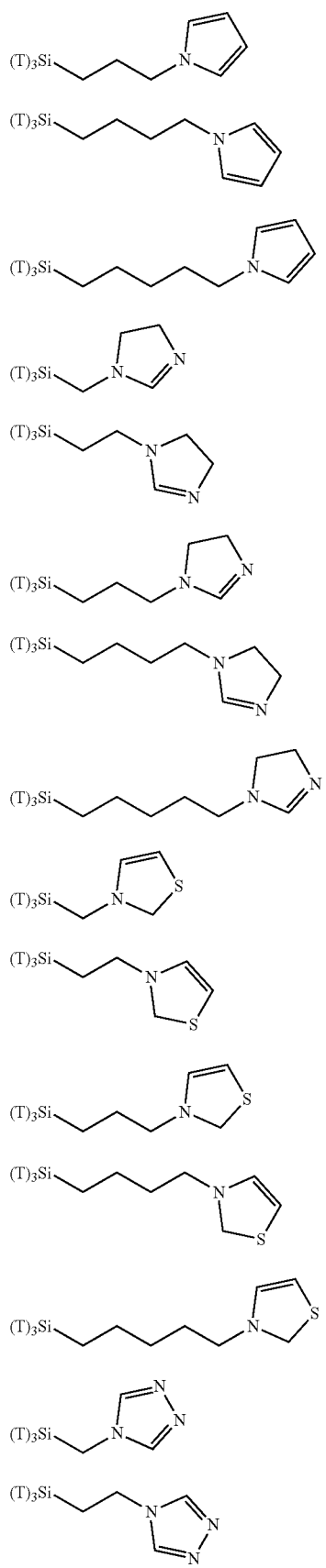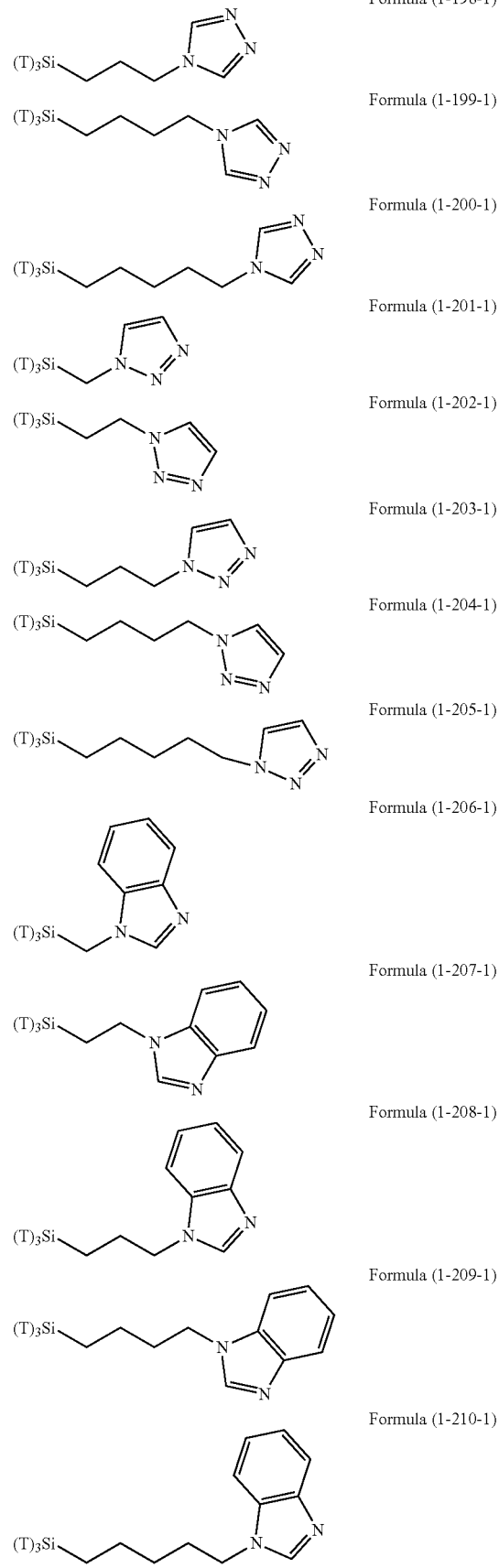

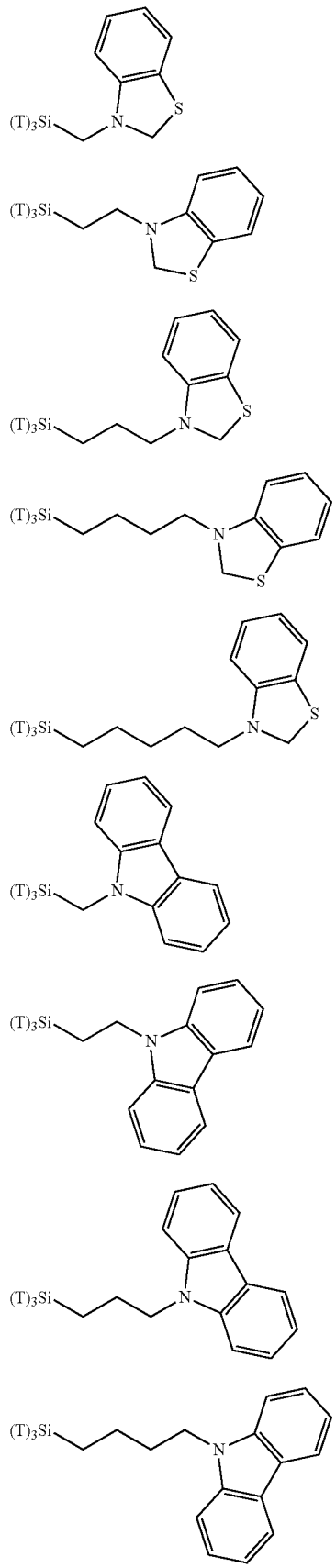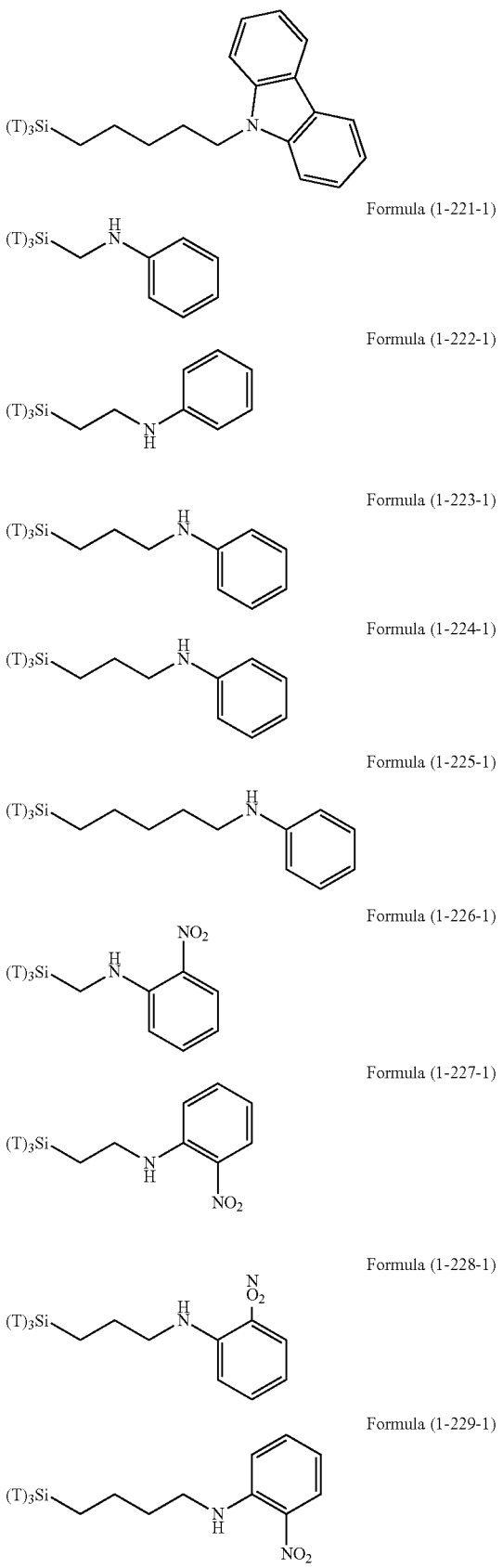

Formula (1-230-1)
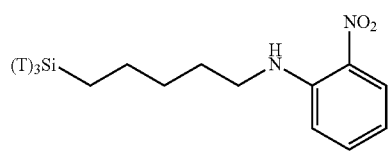
Formula (1-231-1)
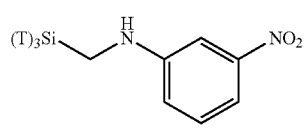
Formula (1-232-1)
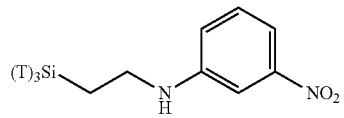
Formula (1-233-1)
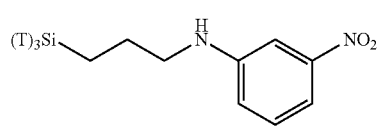
Formula (1-234-1)
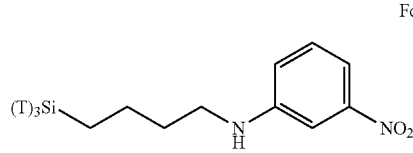
Formula (1-235-1)
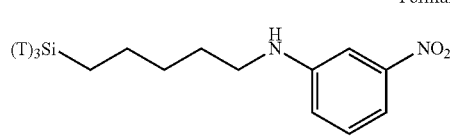
Formula (1-236-1)
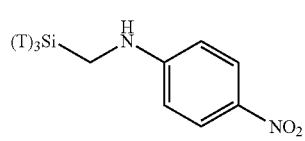
Formula (1-237-1)
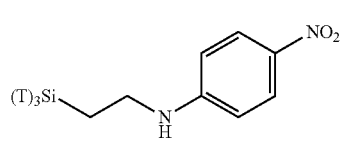
Formula (1-238-1)
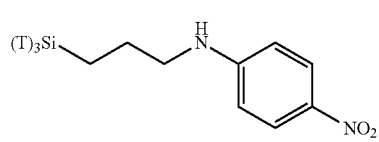
Formula (1-239-1)
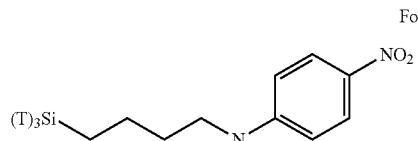
Formula (1-240-1)
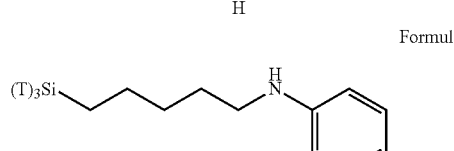
Formula (1-241-1)
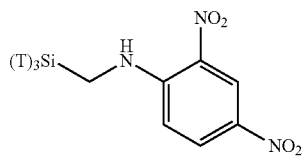
Formula (1-242-1)
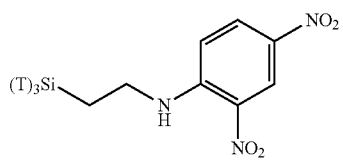
Formula (1-243-1)
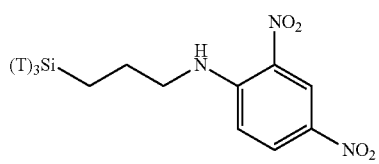
Formula (1-244-1)
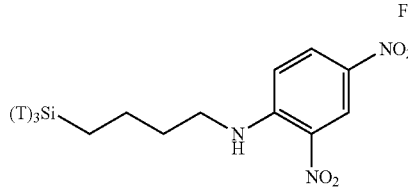
Formula (1-245-1)
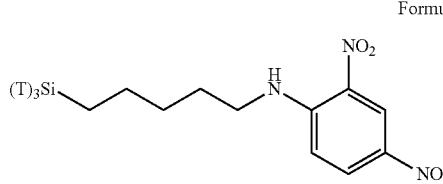
Formula (1-246-1)
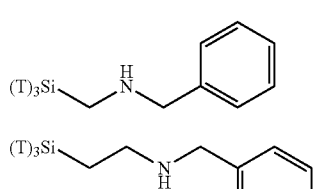
Formula (1-247-1)
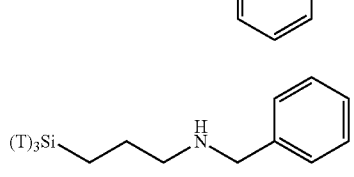
Formula (1-248-1)
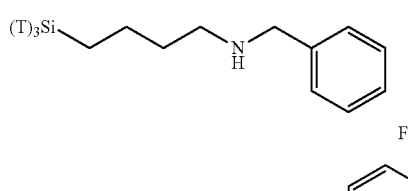
Formula (1-249-1)
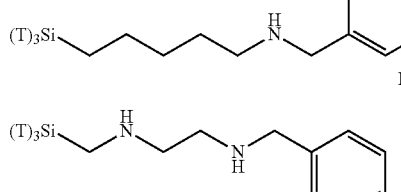
Formula (1-250-1)
Formula (1-251-1)

Formula (1-252-1)
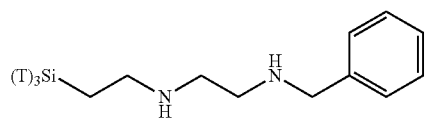
Formula (1-253-1)
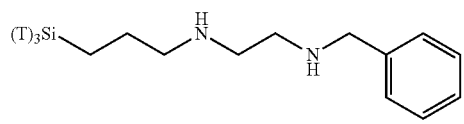
Formula (1-254-1)
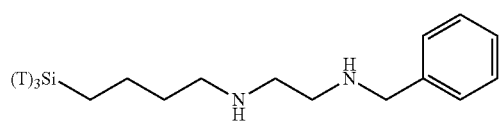
Formula (1-255-1)
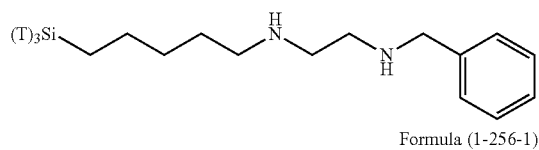
Formula (1-256-1)
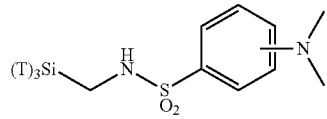
Formula (1-257-1)
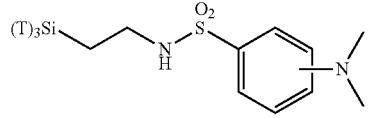
Formula (1-258-1)
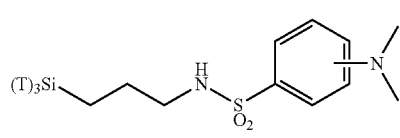
Formula (1-259-1)
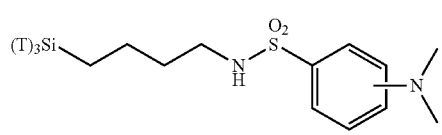
Formula (1-260-1)
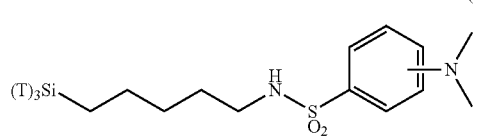
Formula (1-261-1)
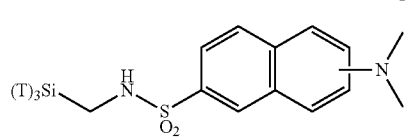
Formula (1-262-1)
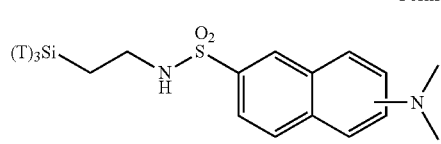
Formula (1-263-1)
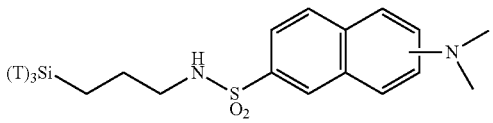
Formula (1-264-1)
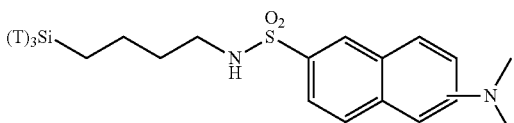
Formula (1-265-1)
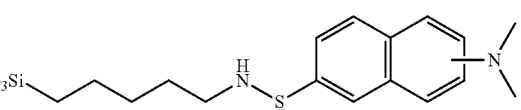
Formula (1-266-1)
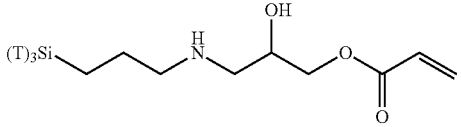
Formula (1-267-1)
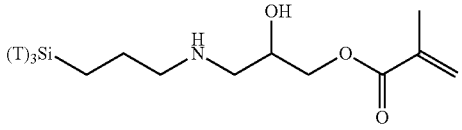
Formula (1-268-1)
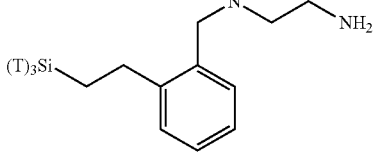
Formula (1-269-1)
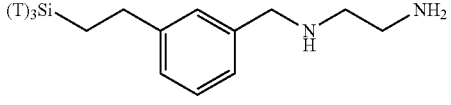
Formula (1-270-1)
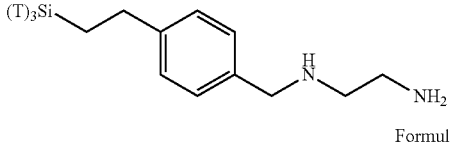
Formula (1-271-1)
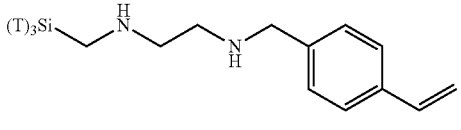
Formula (1-272-1)
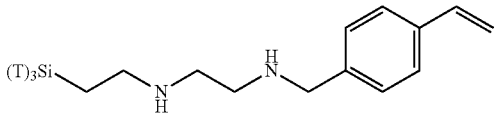

Formula (1-273-1)
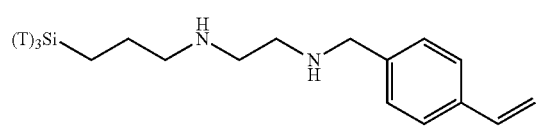
Formula (1-274-1)
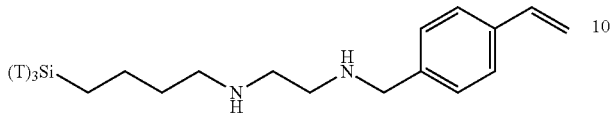
Formula (1-275-1)
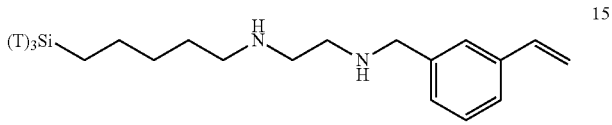
Formula (1-276-1)
Formula (1-277-1)
Formula (1-278-1)
Formula (1-279-1)
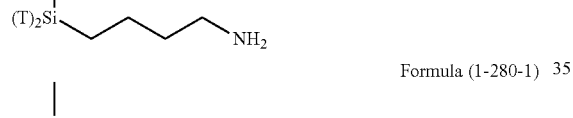
Formula (1-280-1)
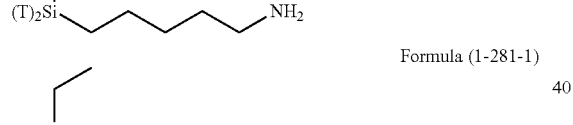
Formula (1-281-1)
Formula (1-282-1)
Formula (1-283-1)
Formula (1-284-1)
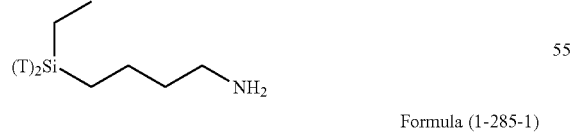
Formula (1-285-1)
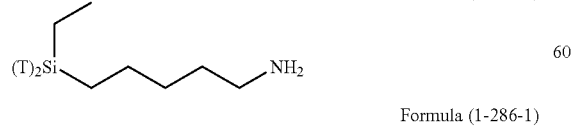
Formula (1-286-1)
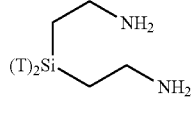
Formula (1-287-1)
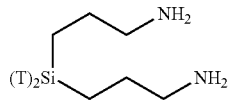
Formula (1-288-1)
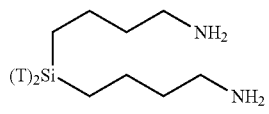
Formula (1-289-1)
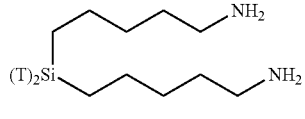
Formula (1-290-1)
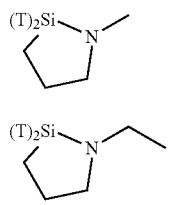
Formula (1-291-1)
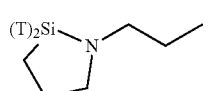
Formula (1-292-1)
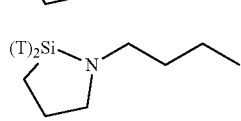
Formula (1-293-1)
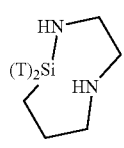
Formula (1-294-1)
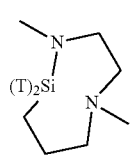
Formula (1-295-1)
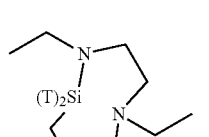
Formula (1-296-1)
Formula (1-297-1)
Formula (1-298-1)
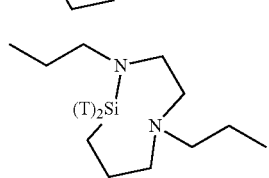

Formula (1-299-1)
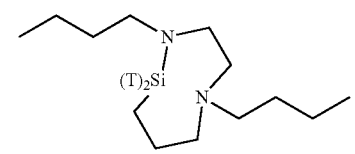

Formula (1-300-1)
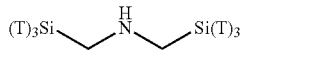

Formula (1-301-1)
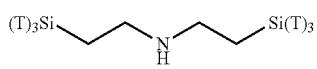

Formula (1-302-1)
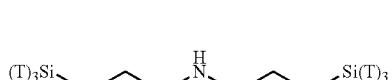

Formula (1-303-1)
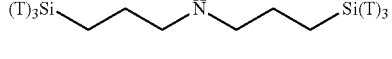

Formula (1-304-1)
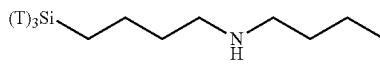

Formula (1-305-1)
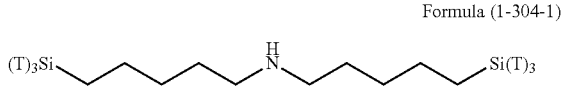

Formula (1-306-1)
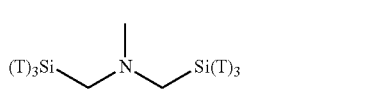

Formula (1-307-1)
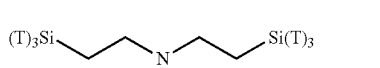

Formula (1-308-1)

Formula (1-309-1)
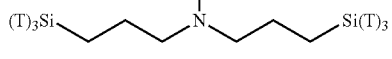

Formula (1-310-1)
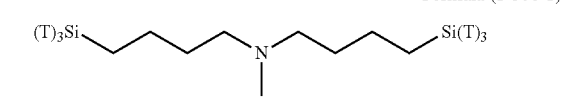

Formula (1-311-1)

Formula (1-312-1)
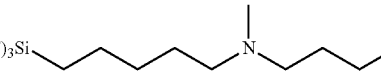

Formula (1-313-1)

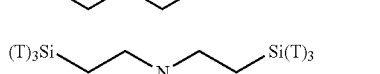

Formula (1-314-1)
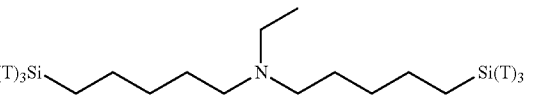

Formula (1-315-1)
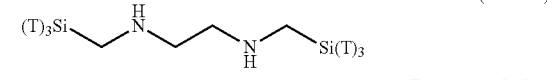

Formula (1-316-1)
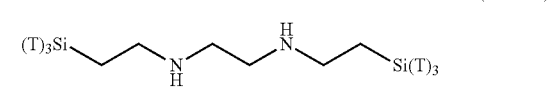

Formula (1-317-1)
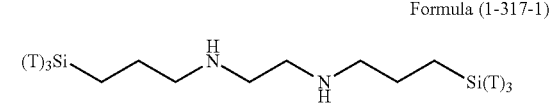

Formula (1-318-1)

Formula (1-319-1)

Formula (1-320-1)
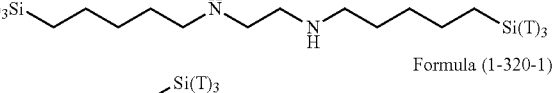

Formula (1-321-1)
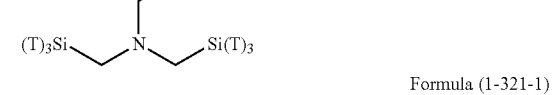

Formula (1-322-1)
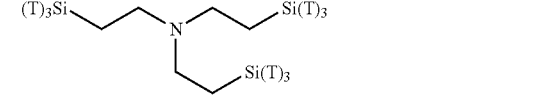

Formula (1-323-1)
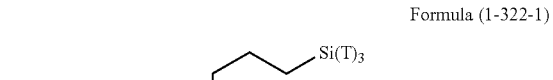

Formula (1-324-1)

In the hydrolyzable silane of the Formula (1), examples of the compounds in which $R^3$ contains an organic group having an ionic functional group and in the hydrolyzable silane of Formula (1-1), examples of the compounds in which $R^{30}$ contains an organic group having an ionic functional group include the following compounds. In the exemplified compounds illustrated below, T means a hydrolyzable group, that is, an alkoxy group, an acyloxy group, or a halogen group, and specific examples of these groups include the above-described examples. In particular, the alkoxy group such as methoxy group and ethoxy group is preferable. X and Y in the following formulas mean counter ions of ionic functional groups and specific examples of the counter ions of the ionic functional groups include anions and cations as counter ions of the ionic functional groups described above. In the formulas, $X^-$ and $Y^+$ each are illustrated as a monovalent anion or a monovalent cation. When $X^-$ and $Y^+$ are divalent ions in the above-described exemplified ions, the coefficient before the ion illustration is a value multiplied by ½. Similarly, when $X^-$ and $Y^+$ are trivalent ions in the above-described exemplified ions, the coefficient of the ion illustration is a value multiplied by ⅓.

```
Formula (1-36b-2)
Formula (1-36c-2)
Formula (1-36d-2)
Formula (1-36e-2)
Formula (1-37-2)
Formula (1-38-2)
Formula (1-39-2)
Formula (1-40-2)
Formula (1-41-2)
Formula (1-42-2)
Formula (1-43-2)
Formula (1-44-2)
Formula (1-45-2)
Formula (1-46-2)
Formula (1-47-2)
Formula (1-48-2)
Formula (1-49-2)
Formula (1-50-2)
Formula (1-51-2)
Formula (1-52-2)
Formula (1-53-2)
Formula (1-54-2)
Formula (1-55-2)
Formula (1-56-2)
Formula (1-57-2)
Formula (1-58-2)
Formula (1-59-2)
Formula (1-60-2)
Formula (1-61-2)
Formula (1-62-2)
Formula (1-63-2)
Formula (1-64-2)
```

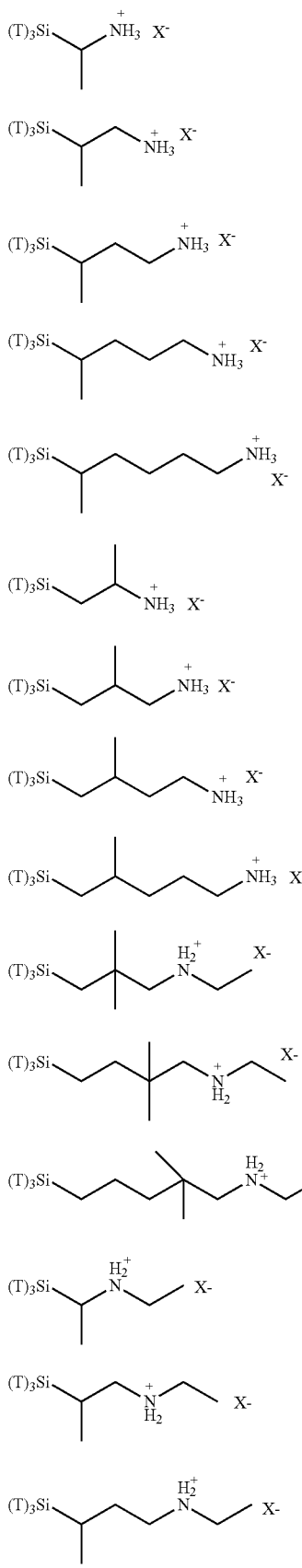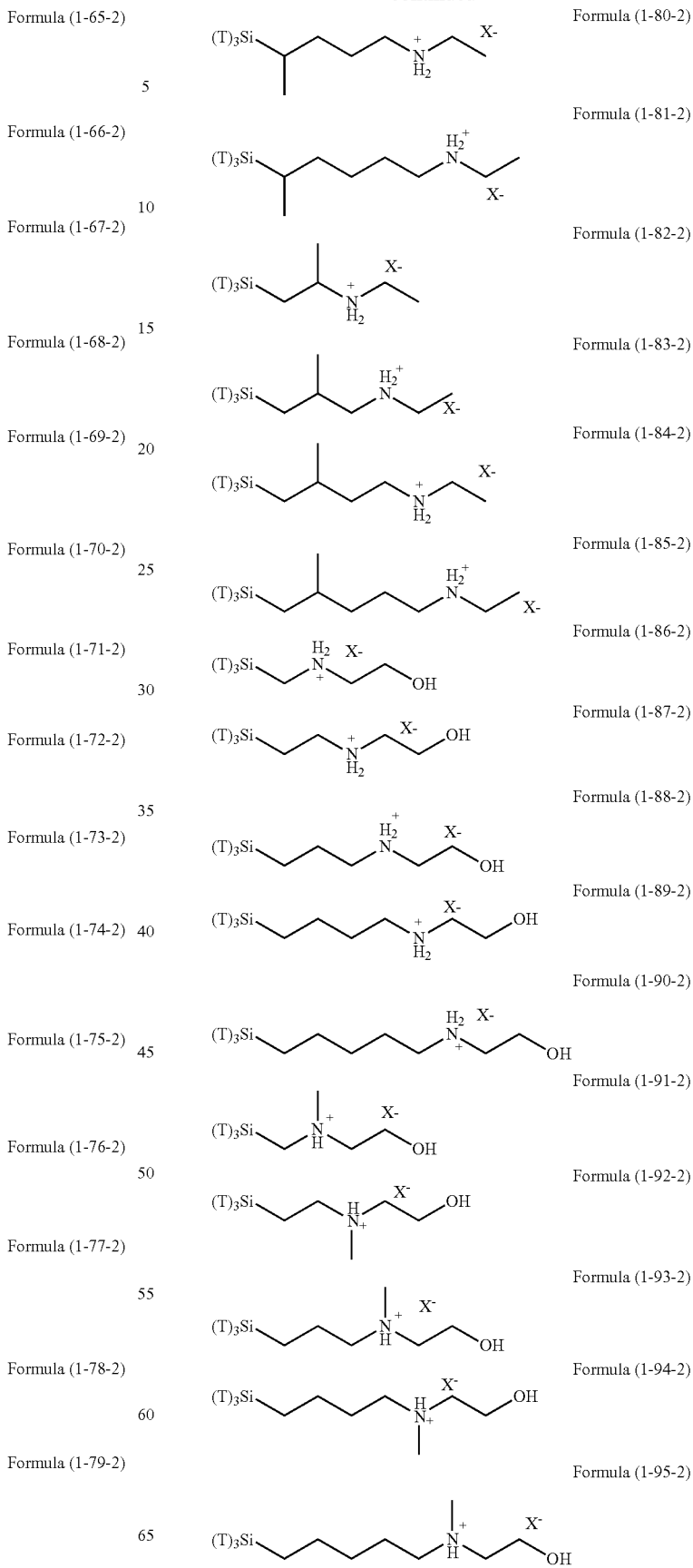

-continued (T)₃Si−CH₂−N⁺H₂−NH₂ X⁻  Formula (1-96-2)

(T)₃Si−CH₂CH₂−N⁺H₂−NH₂ X⁻  Formula (1-97-2)

(T)₃Si−(CH₂)₃−N⁺H₂−NH₂ X⁻  Formula (1-98-2)

(T)₃Si−(CH₂)₄−N⁺H₂−NH₂ X⁻  Formula (1-99-2)

(T)₃Si−(CH₂)₅−N⁺H₂−NH₂ X⁻  Formula (1-100-2)

(T)₃Si−CH₂−N⁺H₂−CH₂CH₂−N⁺H₂−Et 2X⁻  Formula (1-101-2)

(T)₃Si−CH₂CH₂−N⁺H₂−CH₂CH₂−N⁺H₂−Et 2X⁻  Formula (1-102-2)

(T)₃Si−(CH₂)₃−N⁺H₂−CH₂CH₂−N⁺H₂−Et 2X⁻  Formula (1-103-2)

(T)₃Si−(CH₂)₄−N⁺H₂−CH₂CH₂−N⁺H₂−Et 2X⁻  Formula (1-104-2)

(T)₃Si−(CH₂)₅−N⁺H₂−CH₂CH₂−N⁺H₂−Et 2X⁻  Formula (1-105-2)

(T)₃Si−CH₂−N⁺H₂−CH₂CH₂−N⁺H₂−CH₂CH₂−N⁺H₃ 3X⁻  Formula (1-106-2)

(T)₃Si−CH₂CH₂−N⁺H₂−CH₂CH₂−N⁺H₂−CH₂CH₂−N⁺H₃ 3X⁻  Formula (1-107-2)

(T)₃Si−(CH₂)₃−N⁺H₂−CH₂CH₂−N⁺H₂−CH₂CH₂−N⁺H₃ 3X⁻  Formula (1-108-2)

(T)₃Si−(CH₂)₄−N⁺H₂−CH₂CH₂−N⁺H₂−CH₂CH₂−N⁺H₃ 3X⁻  Formula (1-109-2)

(T)₃Si−(CH₂)₅−N⁺H₂−CH₂CH₂−N⁺H₂−CH₂CH₂−N⁺H₃ 3X⁻  Formula (1-110-2)

(T)₃Si−CH₂−N⁺H₂−(CH₂)₅−N⁺H₃ 2X⁻  Formula (1-111-2)

(T)₃Si−CH₂CH₂−N⁺H₂−(CH₂)₅−N⁺H₃ 2X⁻  Formula (1-112-2)

(T)₃Si−(CH₂)₃−N⁺H₂−(CH₂)₅−N⁺H₃ 2X⁻  Formula (1-113-2)

(T)₃Si−(CH₂)₄−N⁺H₂−(CH₂)₅−N⁺H₃ 2X⁻  Formula (1-114-2)

(T)₃Si−(CH₂)₅−N⁺H₂−(CH₂)₅−N⁺H₃ 2X⁻  Formula (1-115-2)

(T)₃Si−CH₂−C(=O)−NH−N⁺H₃ X⁻  Formula (1-116-2)

(T)₃Si−CH₂CH₂−C(=O)−NH−N⁺H₃ X⁻  Formula (1-117-2)

(T)₃Si−(CH₂)₃−C(=O)−NH−N⁺H₃ X⁻  Formula (1-118-2)

(T)₃Si−(CH₂)₄−C(=O)−NH−N⁺H₃ X⁻  Formula (1-119-2)

(T)₃Si−(CH₂)₅−C(=O)−NH−N⁺H₃ X⁻  Formula (1-120-2)

(T)₃Si−CH₂−(aziridine-COOMe)⁺ X⁻  Formula (1-121-2)

(T)₃Si−CH₂CH₂−(aziridine-COOMe)⁺ X⁻  Formula (1-122-2)

(T)₃Si−(CH₂)₃−(aziridine-COOMe)⁺ X⁻  Formula (1-123-2)

Formula (1-124-2)
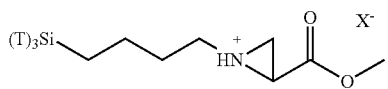
Formula (1-125-2)
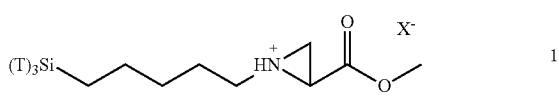
Formula (1-126-2)
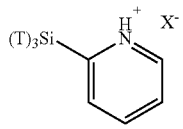
Formula (1-127-2)
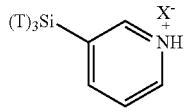
Formula (1-128-2)
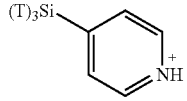
Formula (1-129-2)
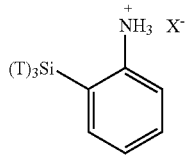
Formula (1-130-2)
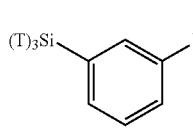
Formula (1-131-2)
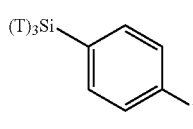
Formula (1-132-2)
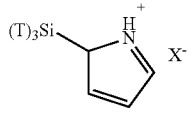
Formula (1-133-2)
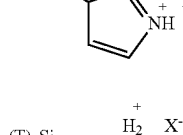
Formula (1-134-2)
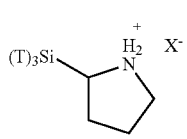
Formula (1-135-2)
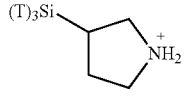
Formula (1-136-2)
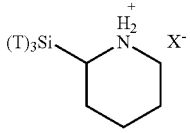
Formula (1-137-2)
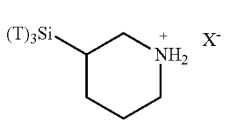
Formula (1-138-2)
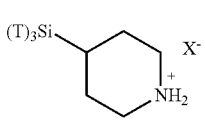
Formula (1-139-2)
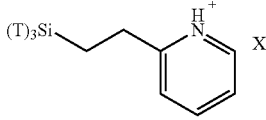
Formula (1-140-2)
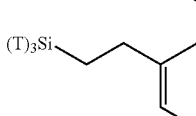
Formula (1-141-2)
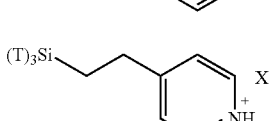
Formula (1-142-2)
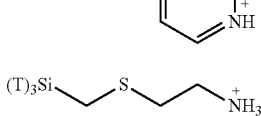
Formula (1-143-2)
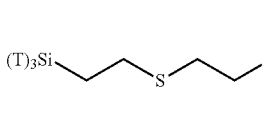
Formula (1-144-2)
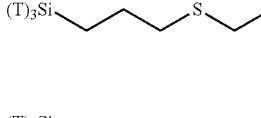
Formula (1-145-2)
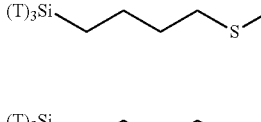
Formula (1-146-2)
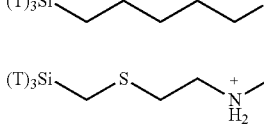
Formula (1-147-2)
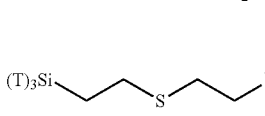
Formula (1-148-2)
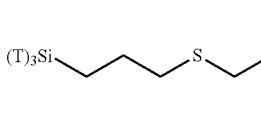
Formula (1-149-2)
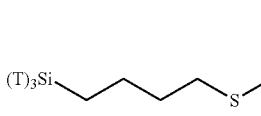
Formula (1-150-2)

Formula (1-151-2)
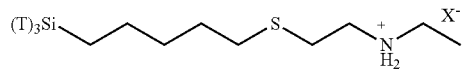
Formula (1-152-2)
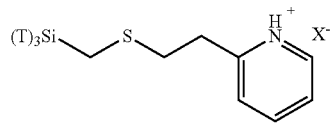
Formula (1-153-2)
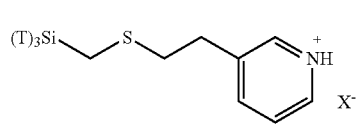
Formula (1-154-2)
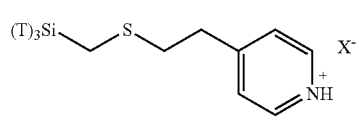
Formula (1-155-2)
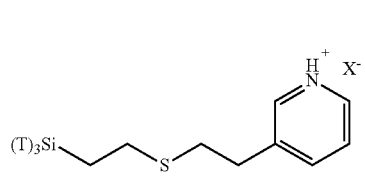
Formula (1-156-2)
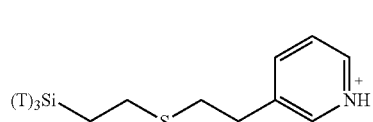
Formula (1-157-2)
Formula (1-158-2)
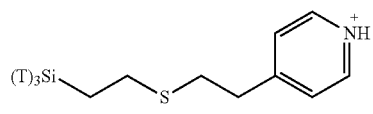
Formula (1-159-2)
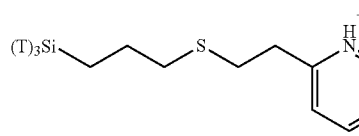
Formula (1-160-2)
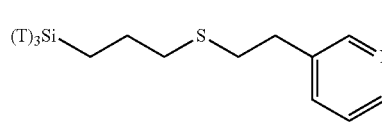
Formula (1-161-2)
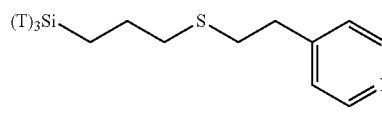
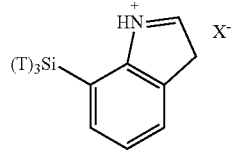
Formula (1-162-2)
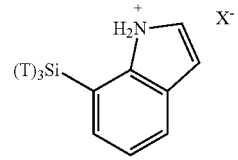
Formula (1-163-2)
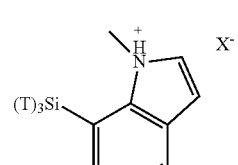
Formula (1-164-2)
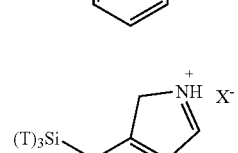
Formula (1-165-2)
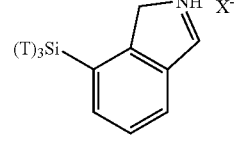
Formula (1-166-2)
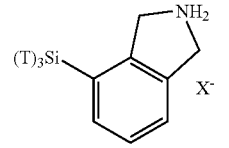
Formula (1-167-2)
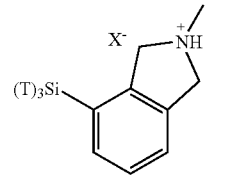
Formula (1-168-2)
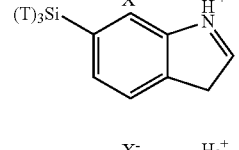
Formula (1-169-2)
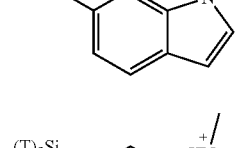
Formula (1-170-2)
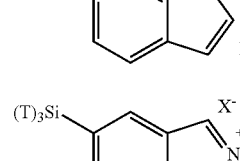
Formula (1-171-2)
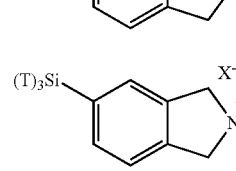

-continued
Formula (1-172-2)
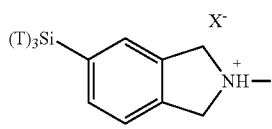
Formula (1-173-2)
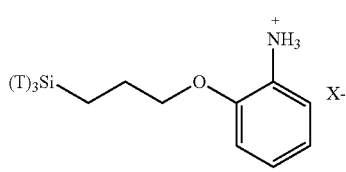
Formula (1-174-2)
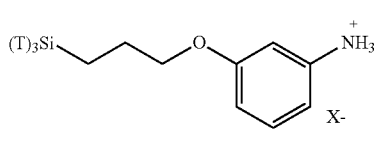
Formula (1-175-2)
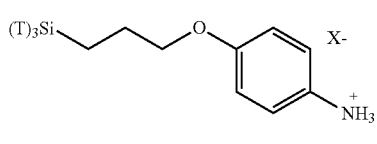
Formula (1-176-2)
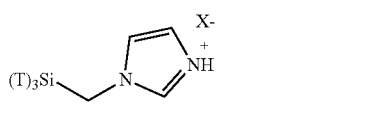
Formula (1-177-2)
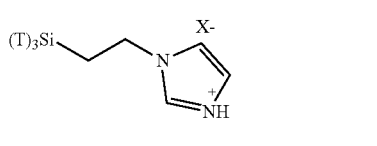
Formula (1-178-2)
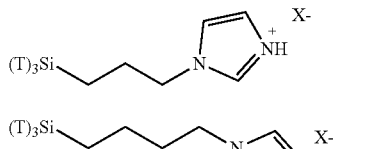
Formula (1-179-2)
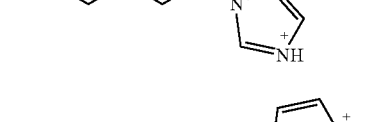
Formula (1-180-2)
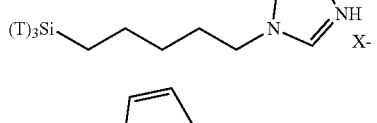
Formula (1-181-2)
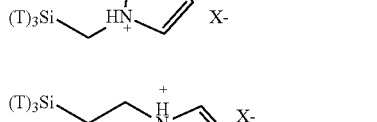
Formula (1-182-2)
Formula (1-183-2)
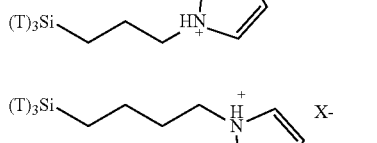
Formula (1-184-2)
-continued
Formula (1-185-2)
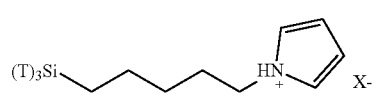
Formula (1-186-2)
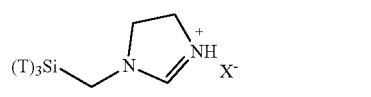
Formula (1-187-2)
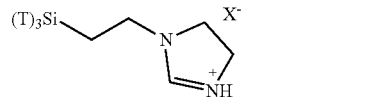
Formula (1-188-2)
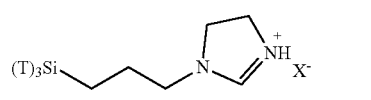
Formula (1-189-2)
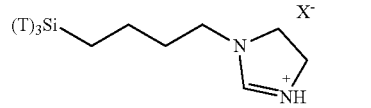
Formula (1-190-2)
Formula (1-191-2)
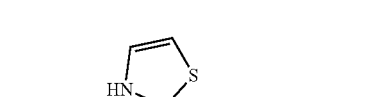
Formula (1-192-2)
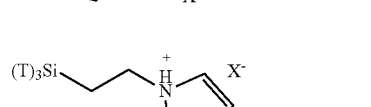
Formula (1-193-2)
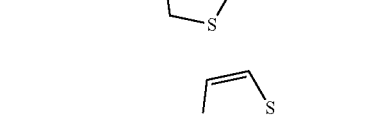
Formula (1-194-2)
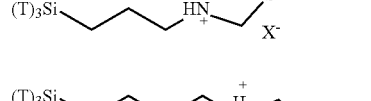
Formula (1-195-2)
Formula (1-196-2)
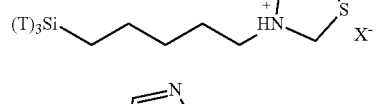
Formula (1-197-2)
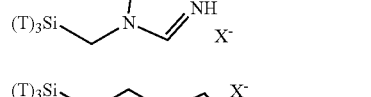
Formula (1-198-2)
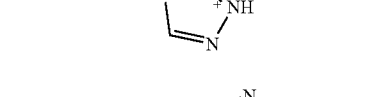

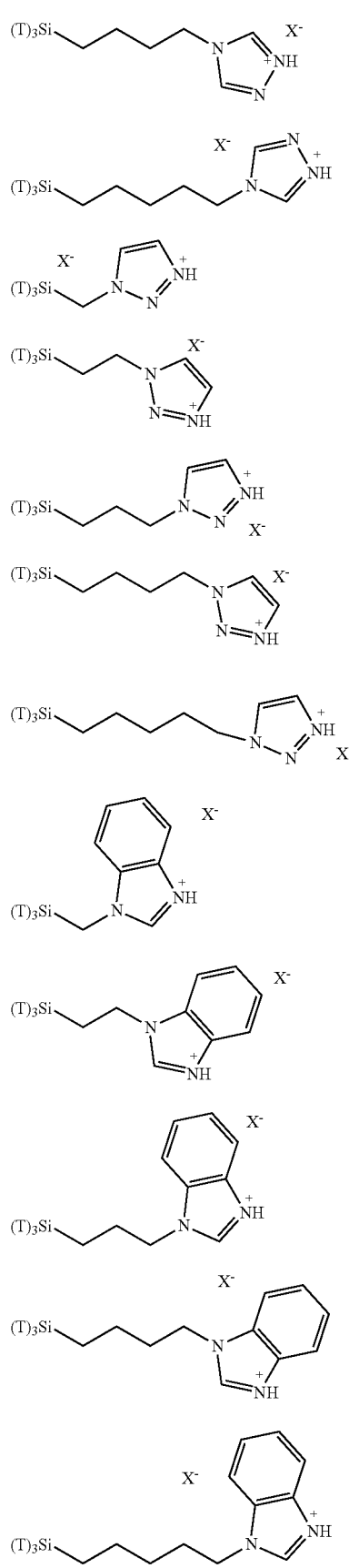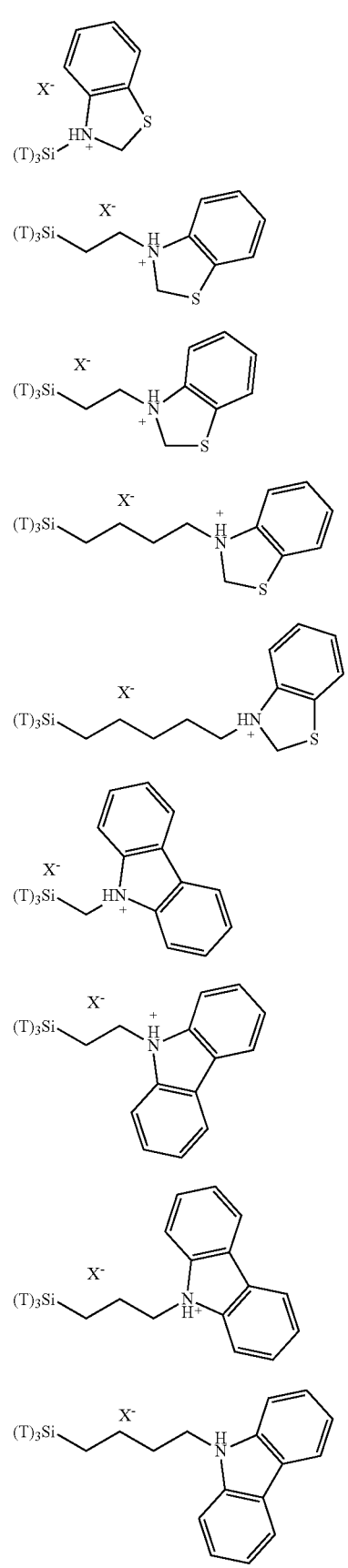

-continued
Formula (1-220-2)
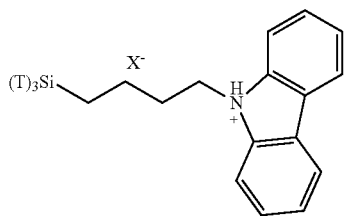
Formula (1-221-2)
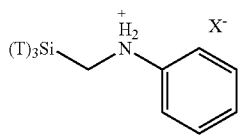
Formula (1-222-2)
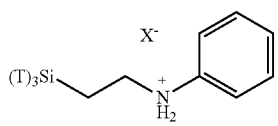
Formula (1-223-2)
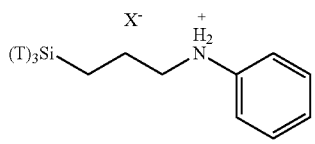
Formula (1-224-2)
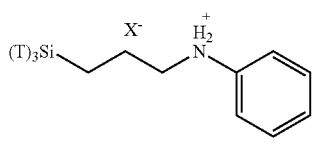
Formula (1-225-2)
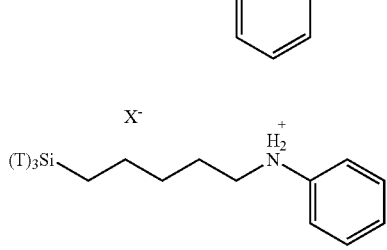
Formula (1-226-2)
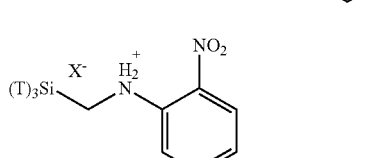
Formula (1-227-2)
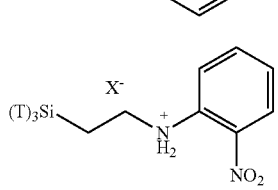
Formula (1-228-2)
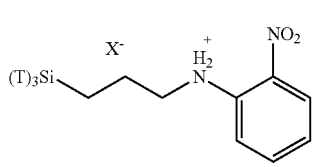
Formula (1-229-2)
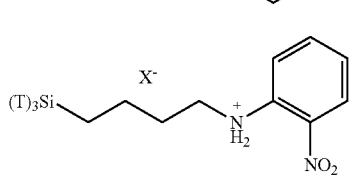
-continued
Formula (1-230-2)
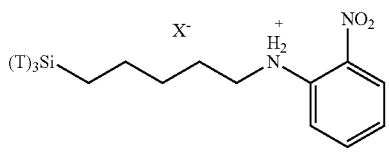
Formula (1-231-2)
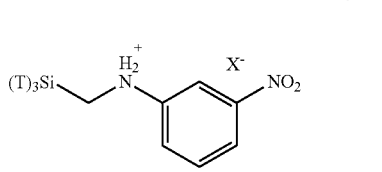
Formula (1-232-2)
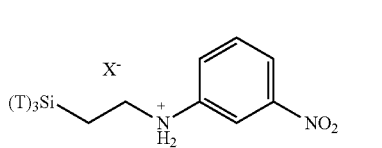
Formula (1-233-2)
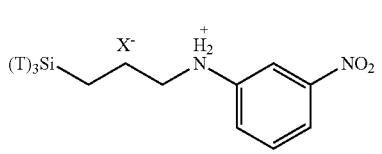
Formula (1-234-2)
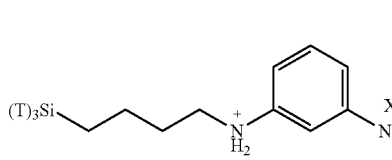
Formula (1-235-2)
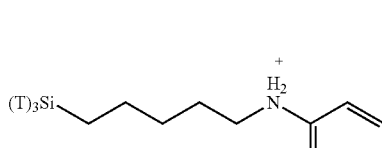
Formula (1-236-2)
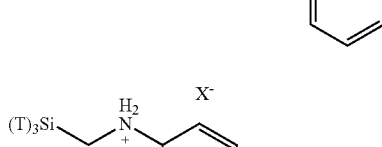
Formula (1-237-2)
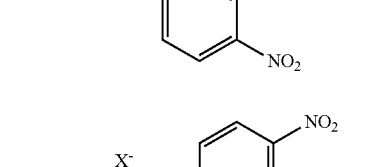
Formula (1-238-2)
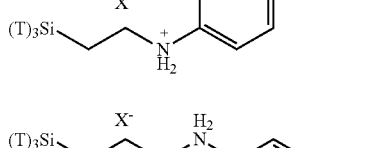
Formula (1-239-2)
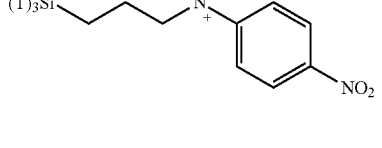

Formula (1-240-2)
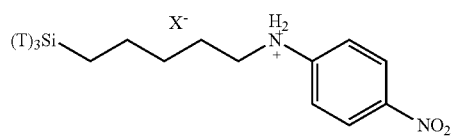
Formula (1-241-2)
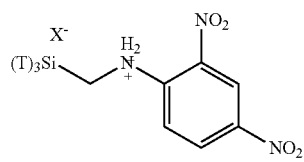
Formula (1-242-2)
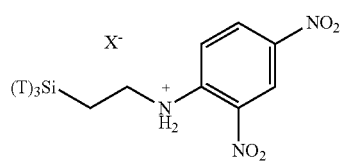
Formula (1-243-2)
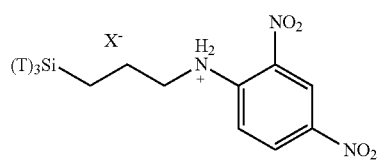
Formula (1-244-2)
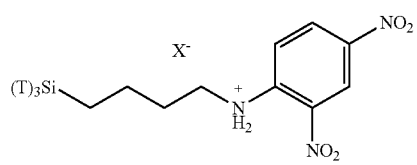
Formula (1-245-2)
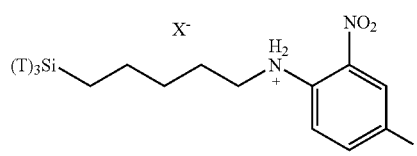
Formula (1-246-2)
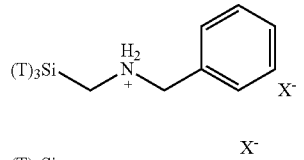
Formula (1-247-2)
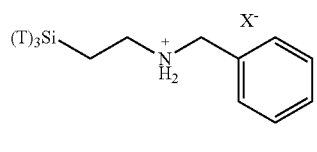
Formula (1-248-2)
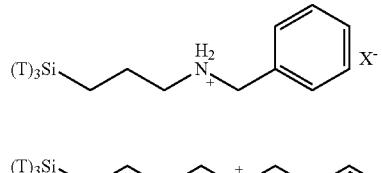
Formula (1-249-2)
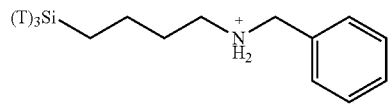
Formula (1-250-2)
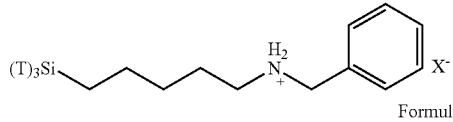
Formula (1-251-2)
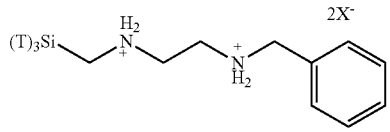
Formula (1-252-2)
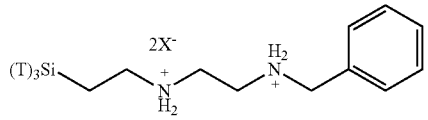
Formula (1-253-2)
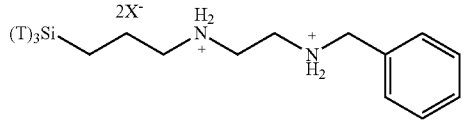
Formula (1-254-2)
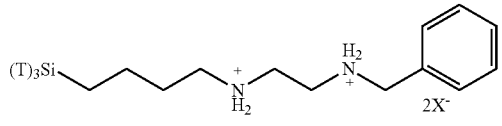
Formula (1-255-2)
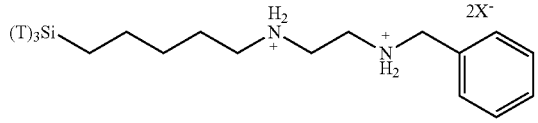
Formula (1-256-2)
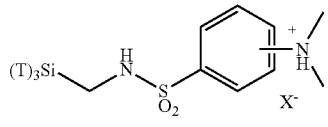
Formula (1-257-2)
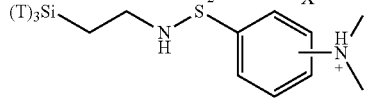
Formula (1-258-2)
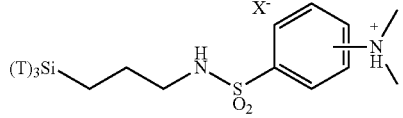
Formula (1-259-2)
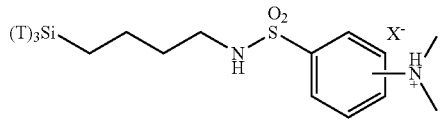

Formula (1-260-2)
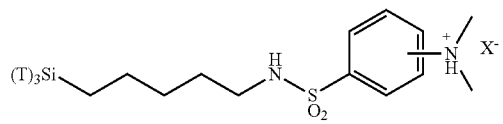
Formula (1-261-2)
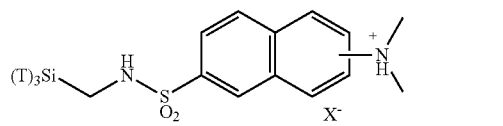
Formula (1-262-2)
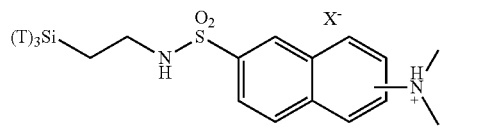
Formula (1-263-2)
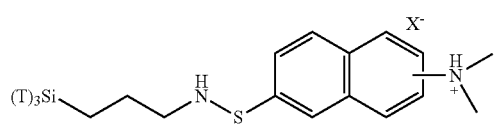
Formula (1-264-2)
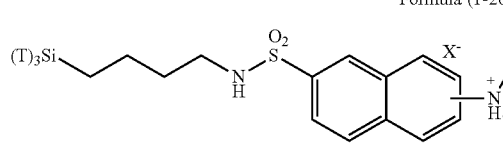
Formula (1-265-2)
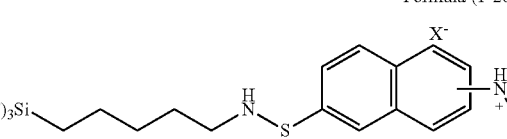
Formula (1-266-2)
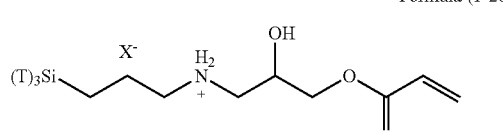
Formula (1-267-2)
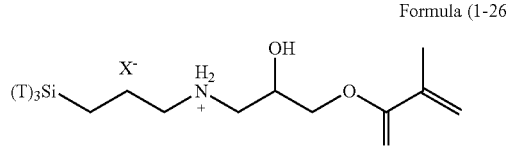
Formula (1-268-2)
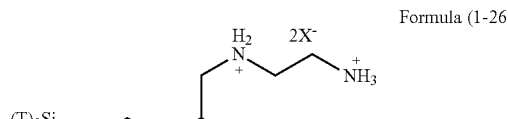
Formula (1-269-2)
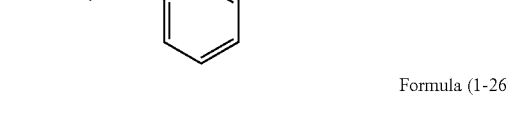
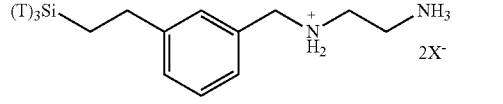
Formula (1-270-2)
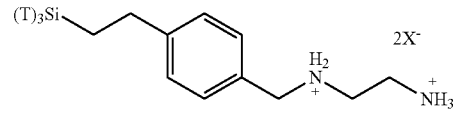
Formula (1-271-2)
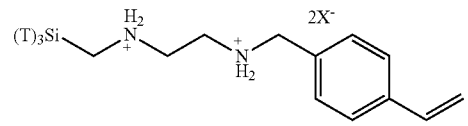
Formula (1-272-2)
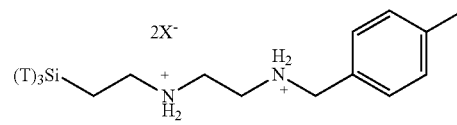
Formula (1-273-2)
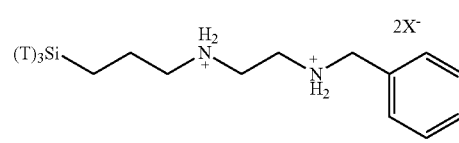
Formula (1-274-2)
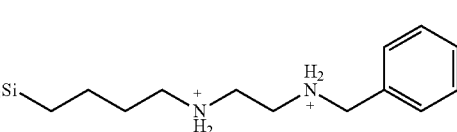
Formula (1-275-2)
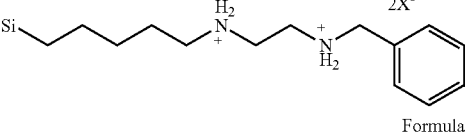
Formula (1-276-2)
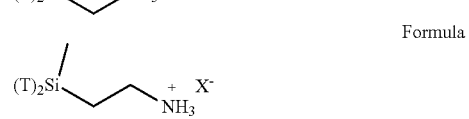
Formula (1-277-2)
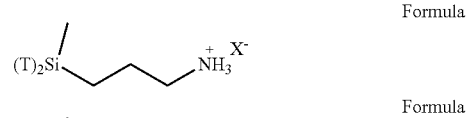
Formula (1-278-2)
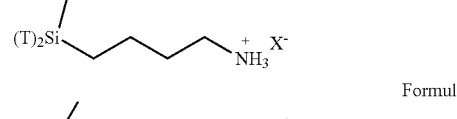
Formula (1-279-2)
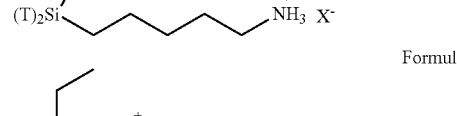
Formula (1-280-2)
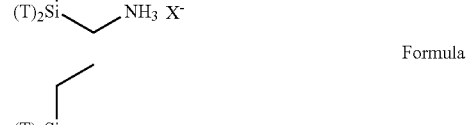
Formula (1-281-2)
Formula (1-282-2)
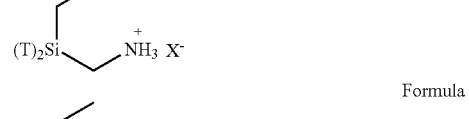

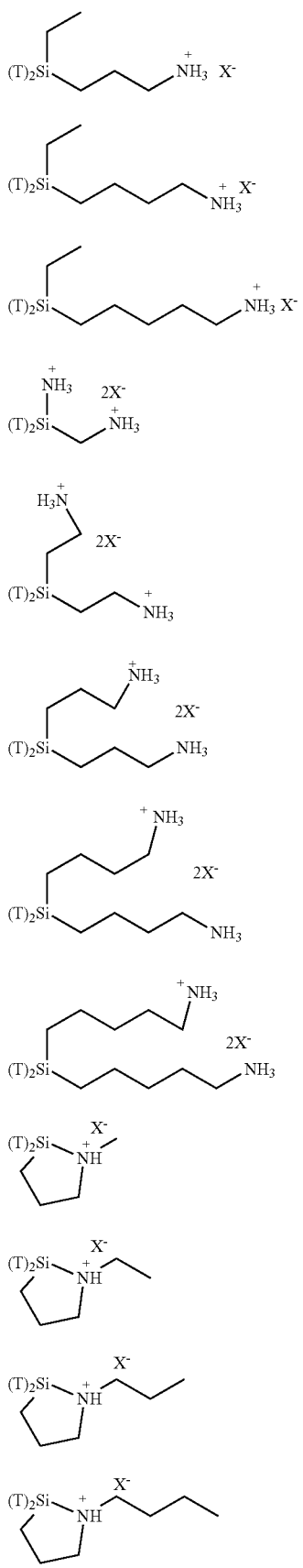
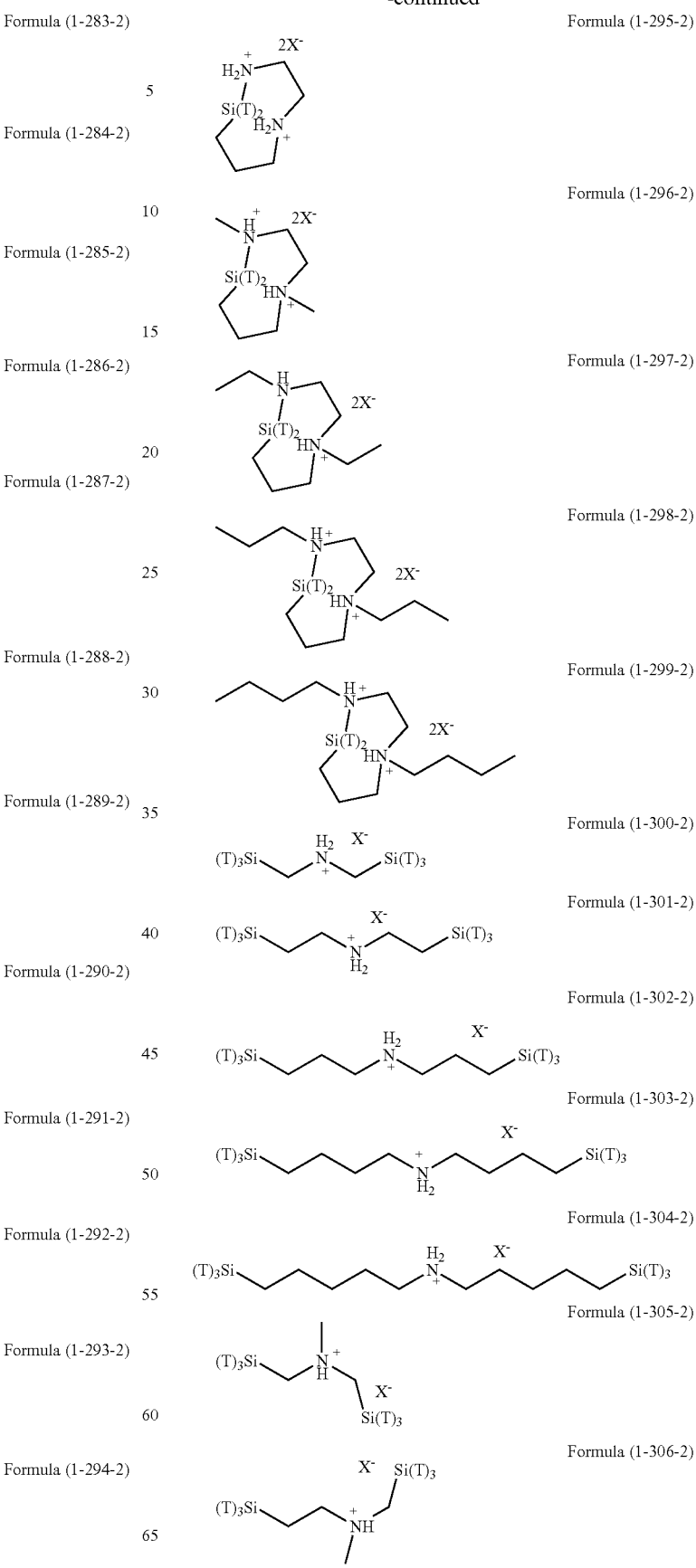

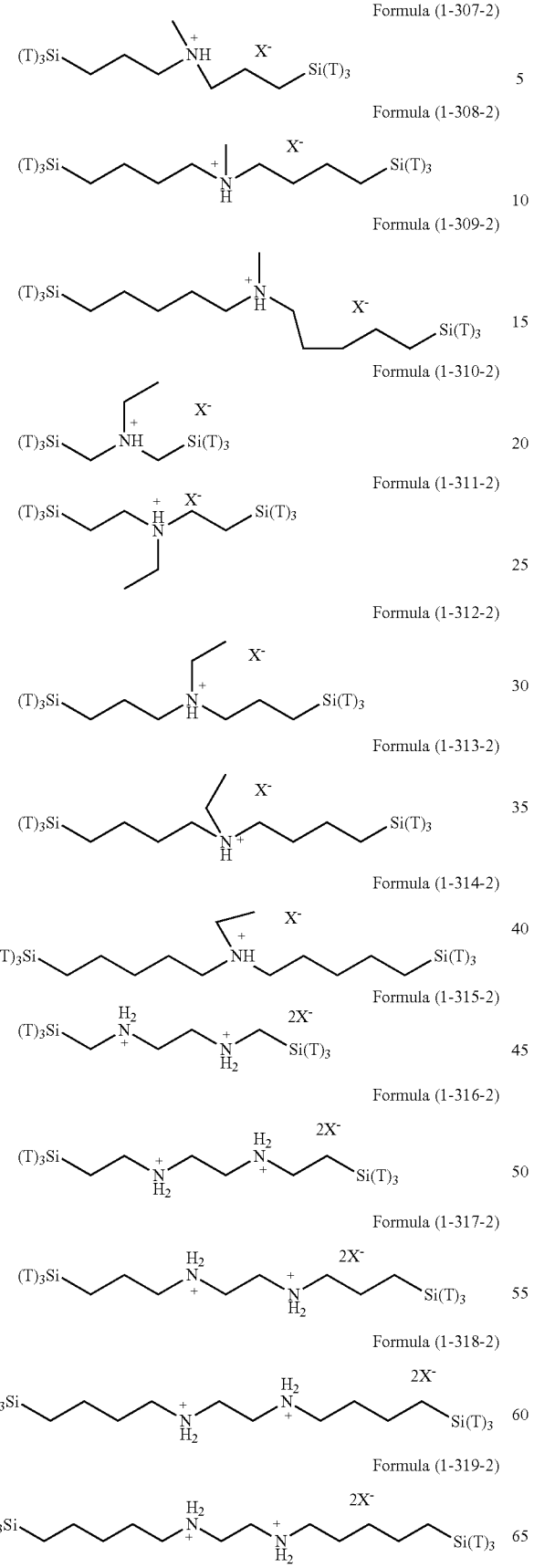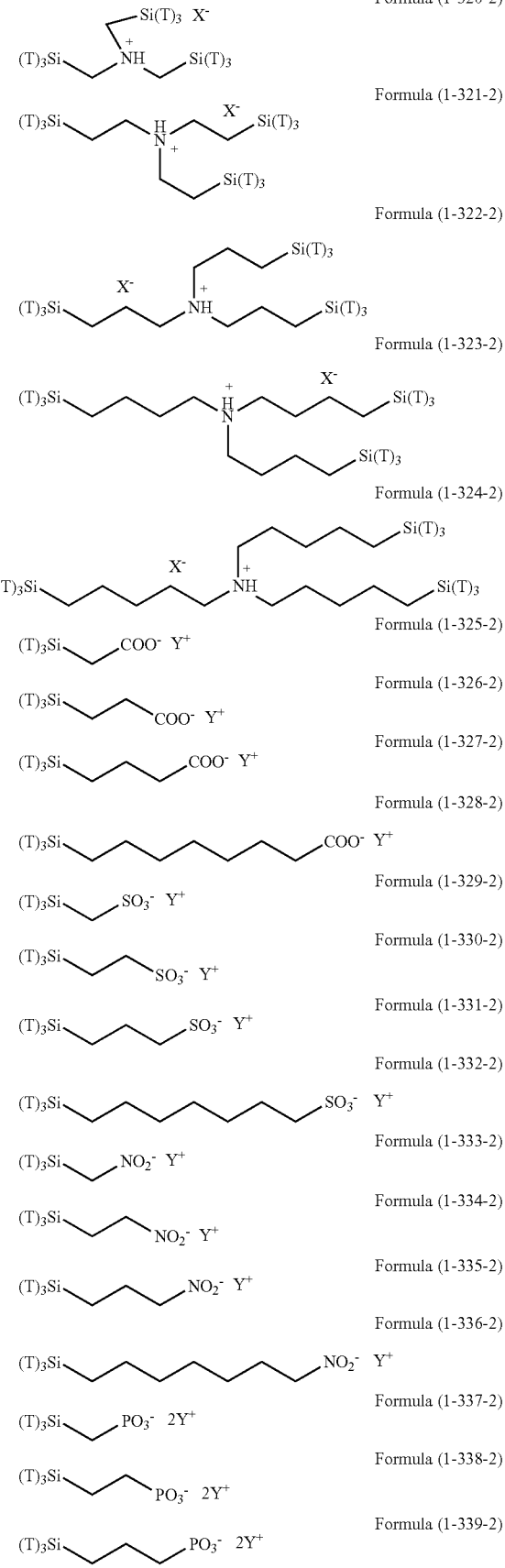

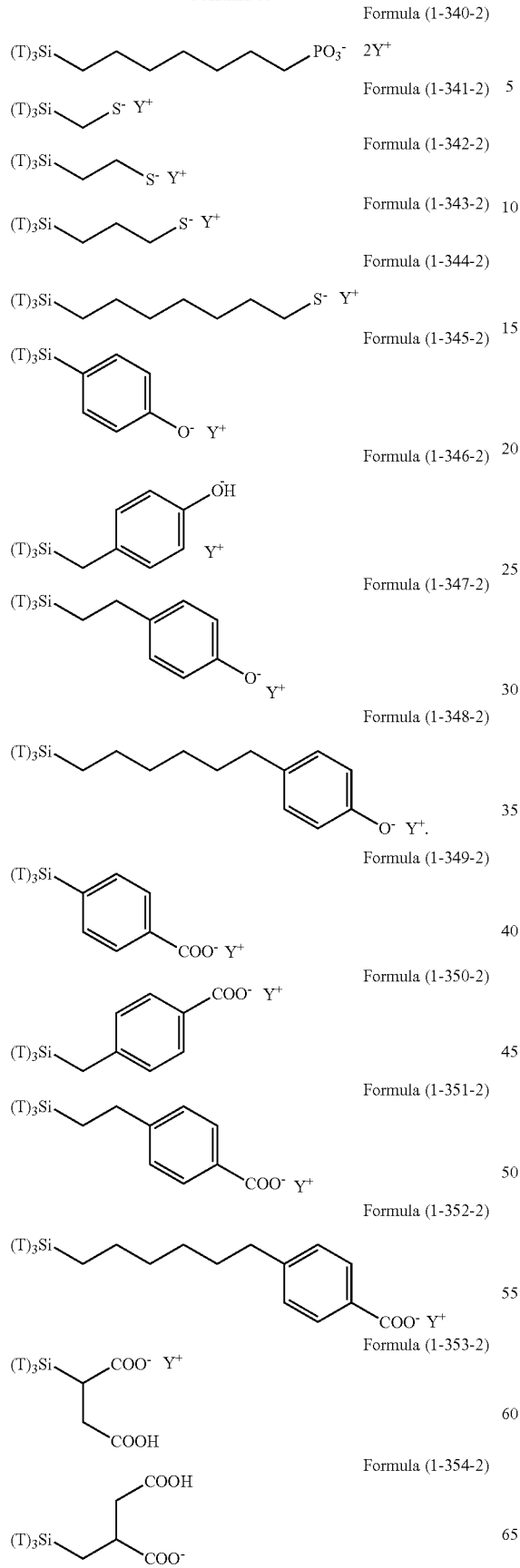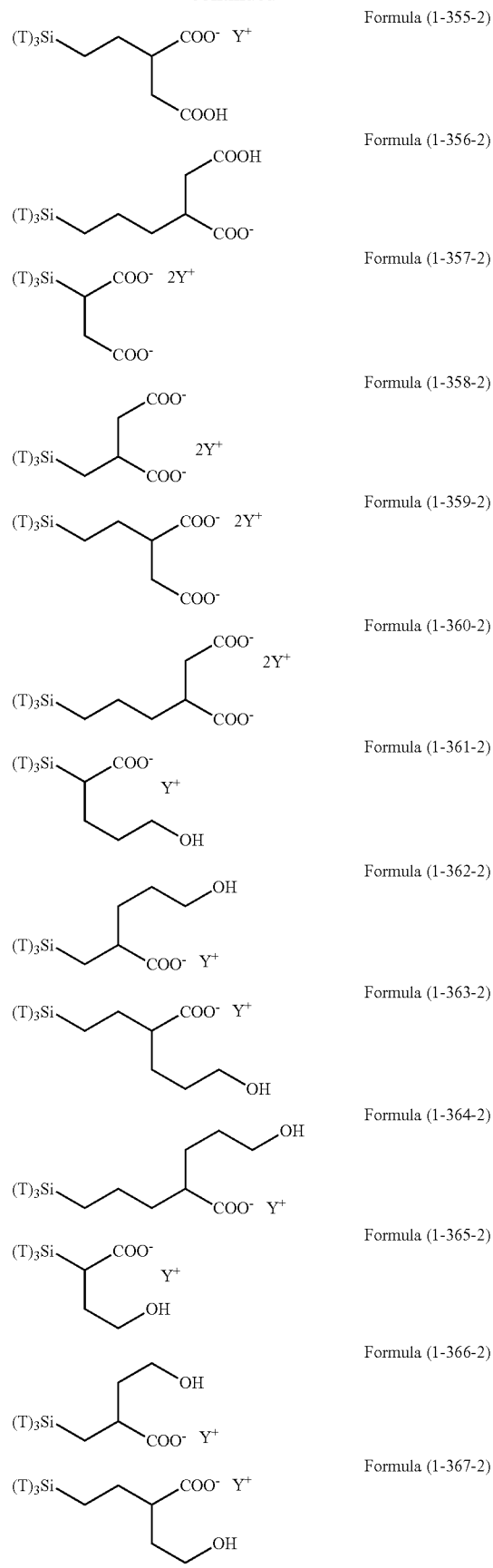

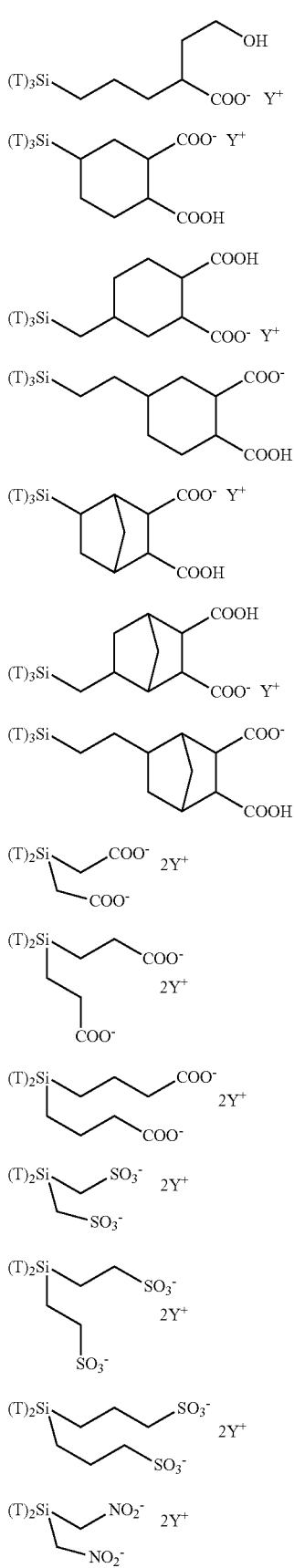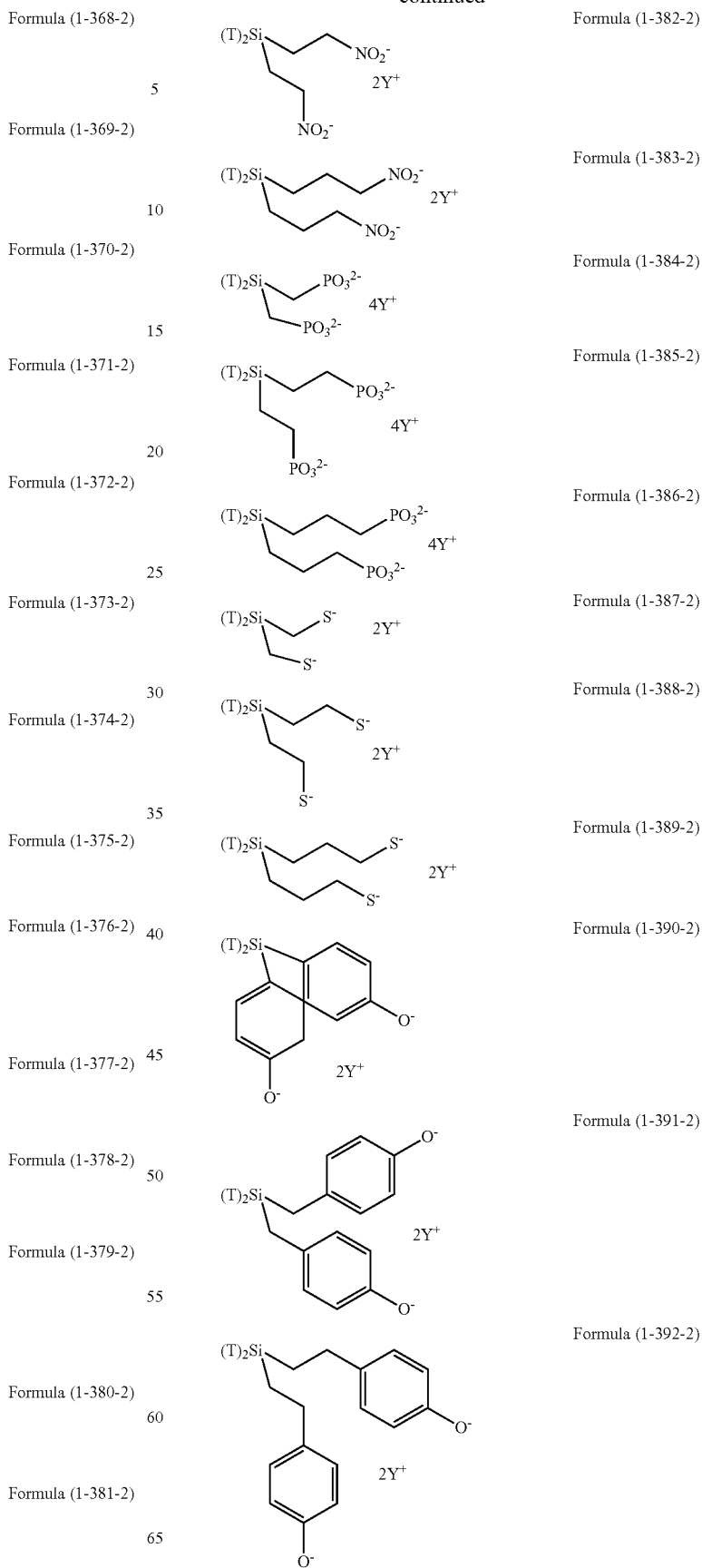

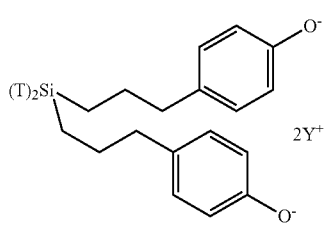

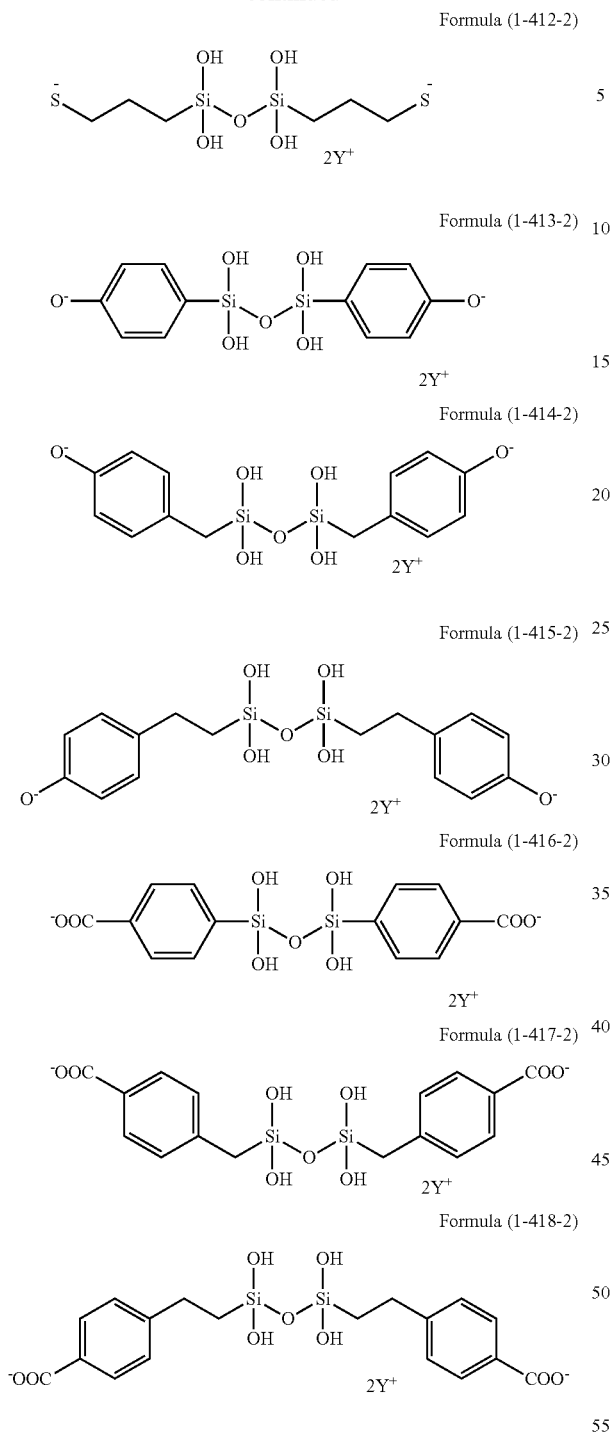
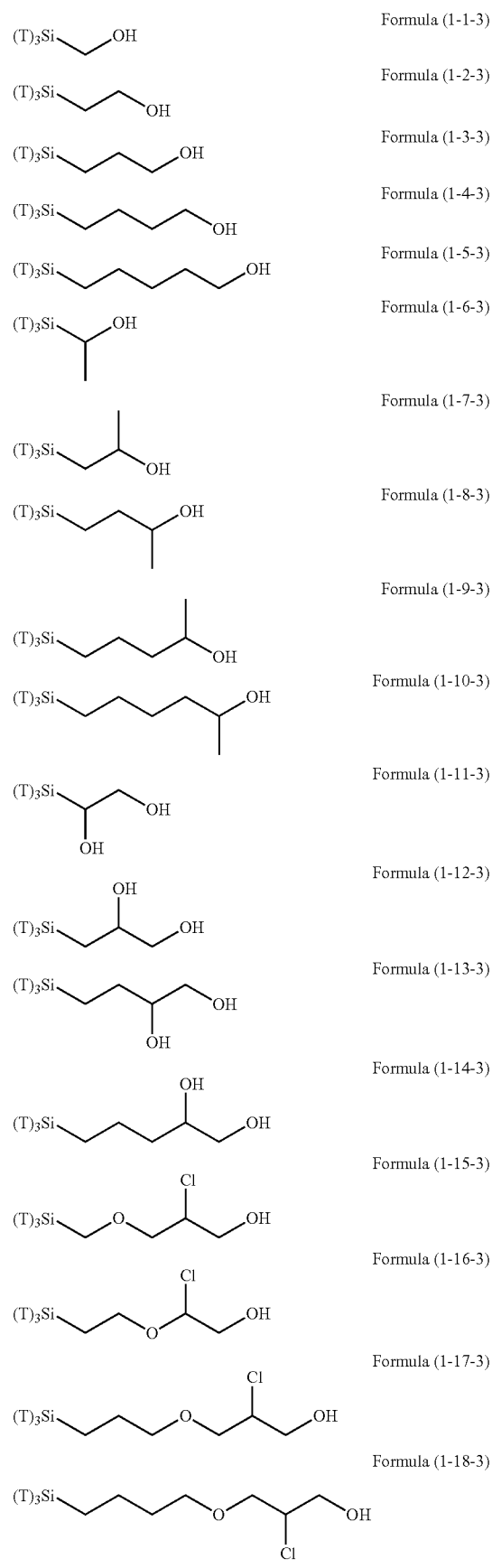

Examples of the compounds in which R³ in the hydrolyzable silane of the Formula (1) and R³⁰ in the hydrolyzable silane of Formula (1-1) contain an organic group having hydroxy group, or an organic group having a functional group convertible to hydroxy group by hydrolysis include the following compounds. In the exemplified compounds illustrated below, T means a hydrolyzable group, for example, an alkoxy group, an acyloxy group, or a halogen group, and examples of these groups can include the above-described examples. In particular, the alkoxy group such as methoxy group and ethoxy group is preferable.

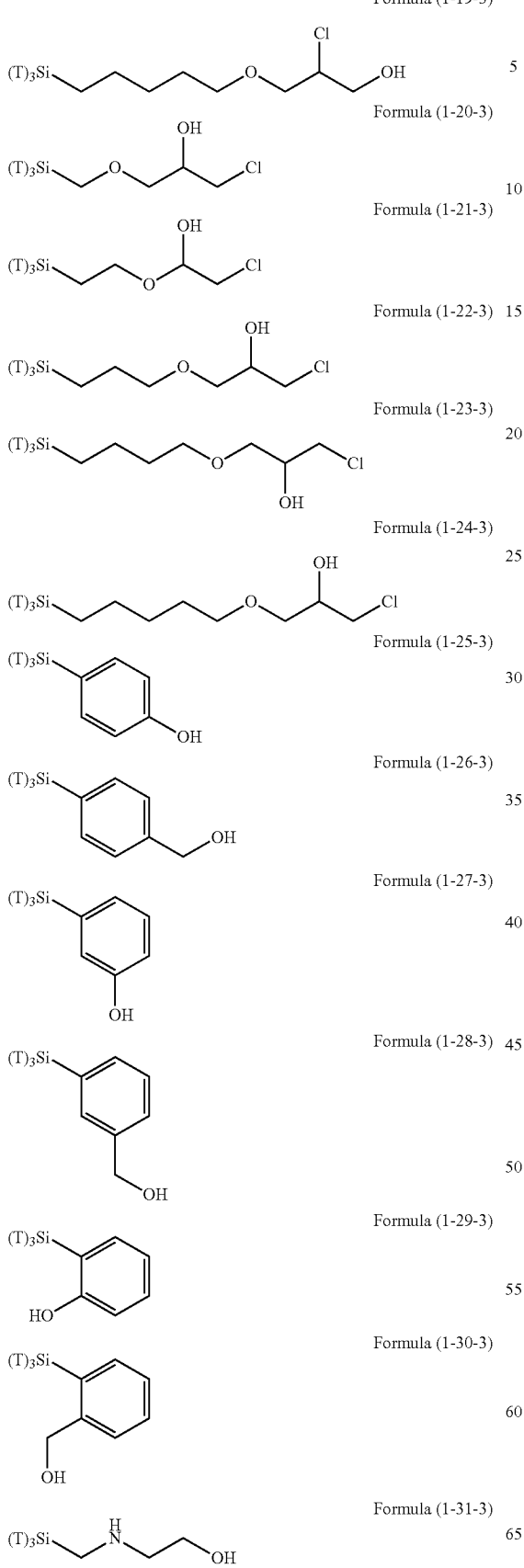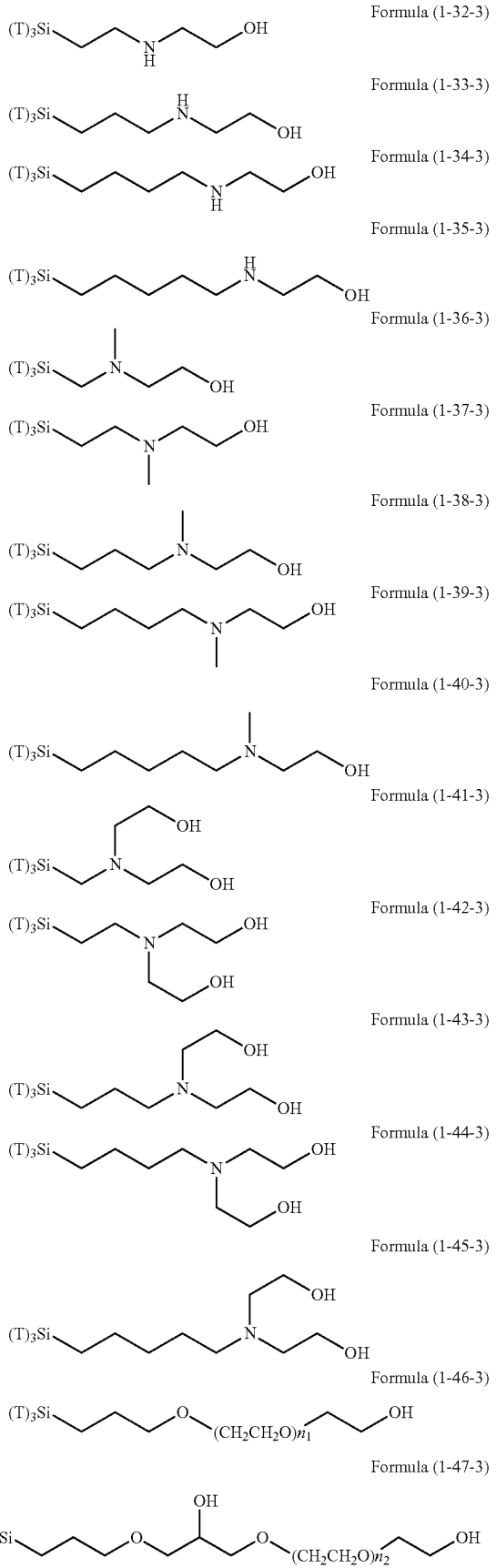

Formula (1-48-3)
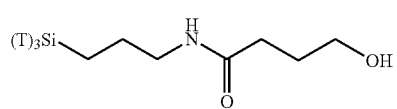
Formula (1-49-3)
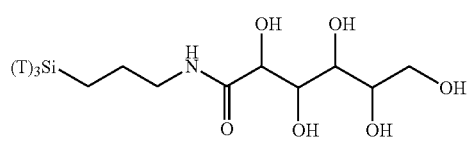
Formula (1-50-3)
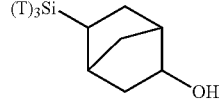
Formula (1-51-3)
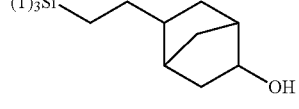
Formula (1-52-3)
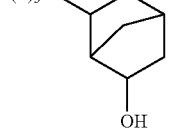
Formula (1-53-3)
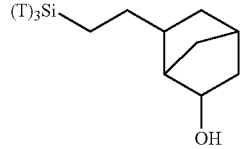
Formula (1-54-3)
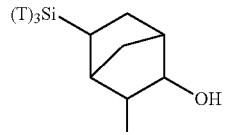
Formula (1-55-3)
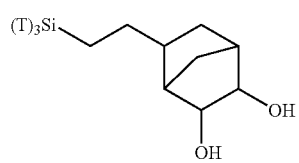
Formula (1-56-3)
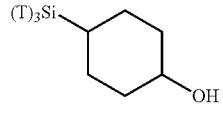
Formula (1-57-3)
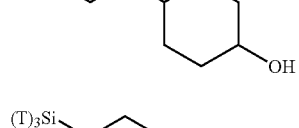
Formula (1-58-3)
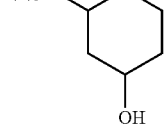
Formula (1-59-3)
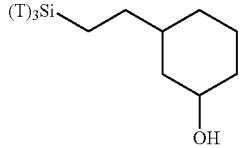
Formula (1-60-3)
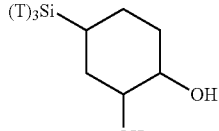
Formula (1-61-3)
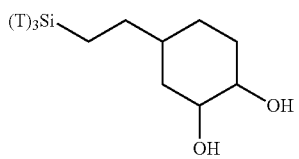
Formula (1-62-3)
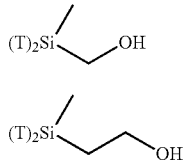
Formula (1-63-3)
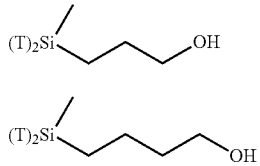 
Formula (1-64-3)
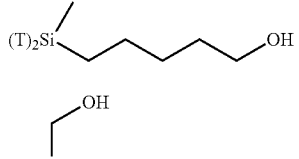
Formula (1-65-3)
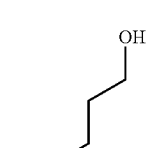
Formula (1-66-3)
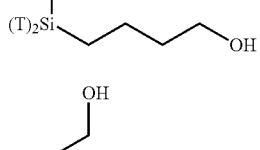
Formula (1-67-3)
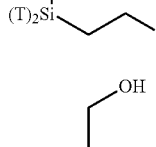
Formula (1-68-3)
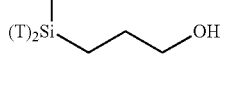
Formula (1-69-3)
Formula (1-70-3)
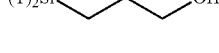

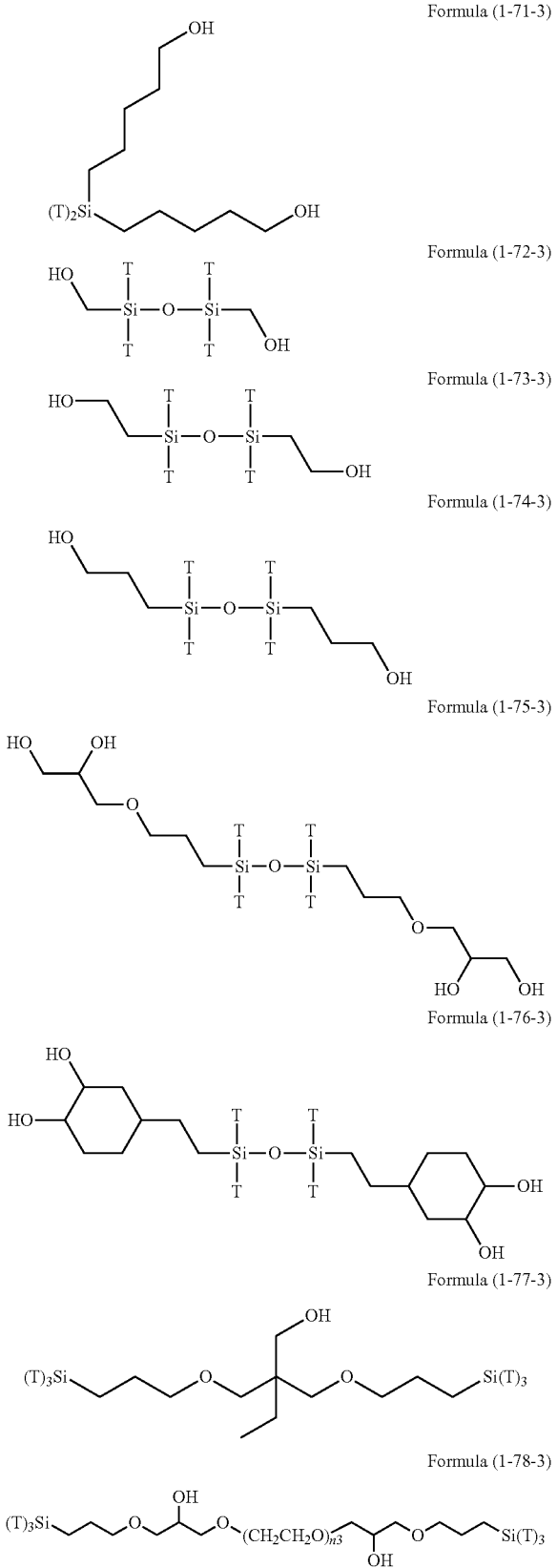

In these formulas, n1 is an integer of 1 to 12, n2 is an integer of 1 to 12, and n3 is an integer of 5 to 8.

The hydrolyzable silane (a4) in the composition of the present invention can be used in combination of the hydrolyzable silane (a4) of Formula (1) or Formula (1-1) and another hydrolyzable silane (b). The hydrolyzable silane (b) used in the present invention is a hydrolyzable silane of Formula (2) and Formula (3). At least one organosilicon compound selected from the group consisting of the hydrolyzable silane of Formula (2) and Formula (3) can be used.

Among the hydrolyzable silane (b) selected from the group consisting of the hydrolyzable silanes of Formula (2) and Formula (3), the hydrolyzable silane of Formula (2) is preferably used.

As the hydrolyzable silane, a hydrolyzable silane containing the hydrolyzable silane (a4) and the hydrolyzable silane (b) in a molar ratio of (a4):(b) of 3:97 to 100:0, 30:70 to 100:0, 50:50 to 100:0, 70:30 to 100:0, or 97:3 to 100:0 can be used.

In Formula (2), $R^4$ is an alkyl group, an aryl group, a halogenated alkyl group, a halogenated aryl group, an alkenyl group, or an organic group having acryloyl group, methacryloyl group, mercapto group, or cyano group and bonding to a silicon atom through a Si—C bond, $R^5$ is an alkoxy group, an acyloxy group, or a halogen group, and a is an integer of 0 to 3.

In Formula (3), $R^6$ is an alkyl group, $R^7$ is an alkoxy group, an acyloxy group, or a halogen group, Z is an alkylene group or an arylene group, b is an integer of 0 or 1, and c is an integer of 0 or 1.

Specific examples of these groups may include the above-described examples.

Examples of the hydrolyzable silane of Formula (2) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltriethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-methacryloxypropyltrimethoxysilane, γ-mercaptopropyltrimethoxysilane, γ-mercaptopropyltriethoxysilane, β-cyanoethyltriethoxysilane, dimethyldimethoxysilane, phenylmethyldimethoxysilane, dimethyldiethoxysilane, phenylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the hydrolyzable silane of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

The hydrolysis condensates used in the present invention are exemplified as follows.

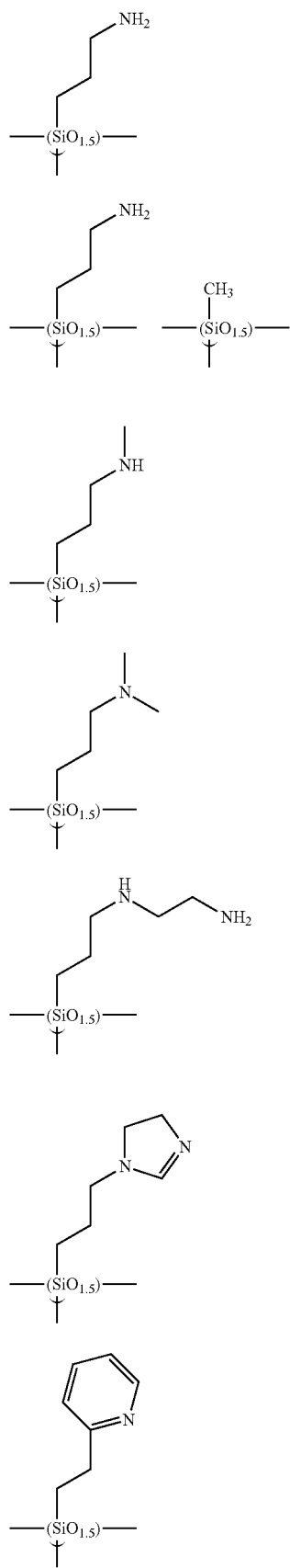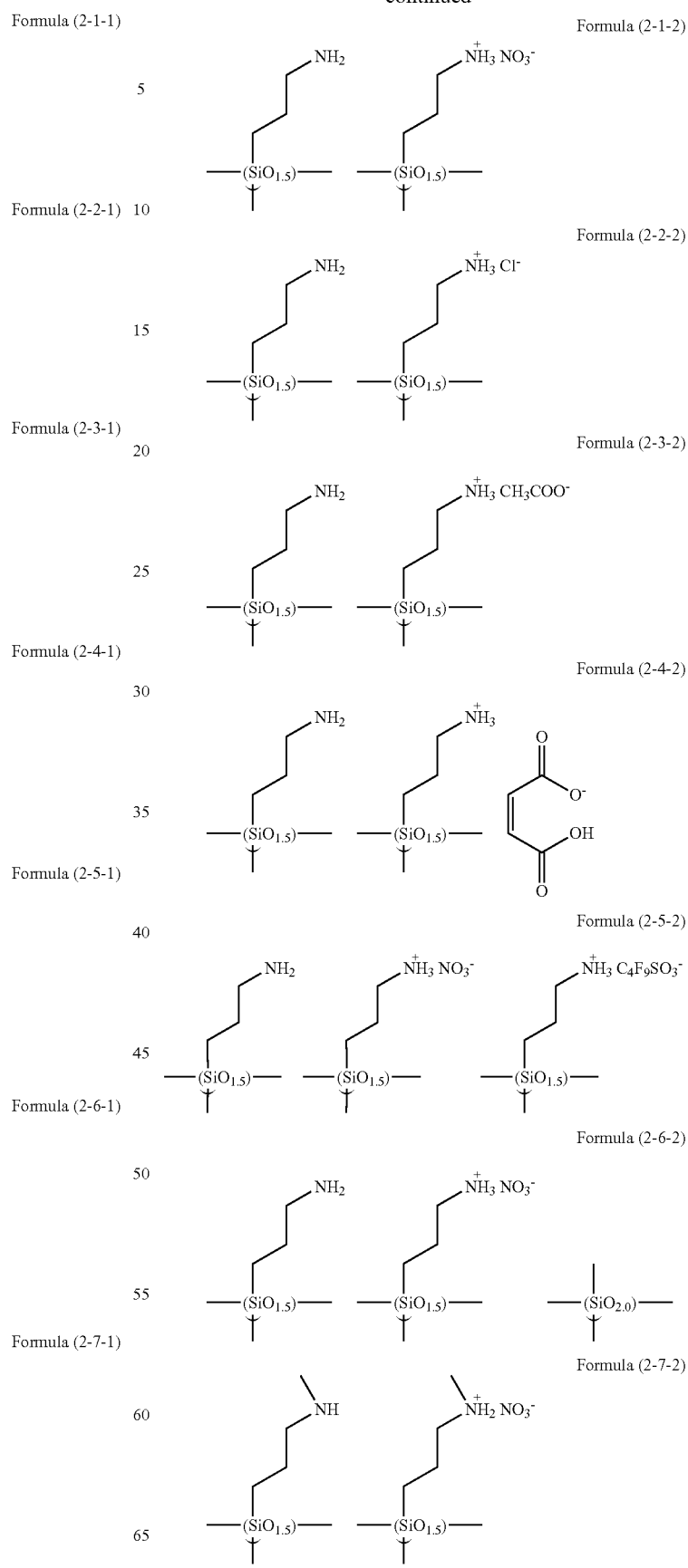

Formula (2-8-2)
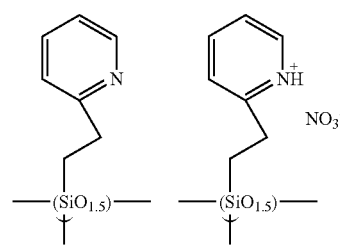
Formula (2-9-2)
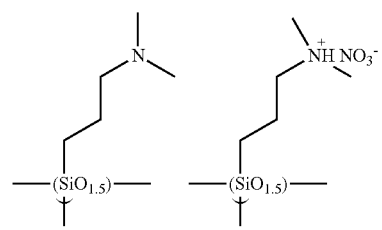
Formula (2-10-2)
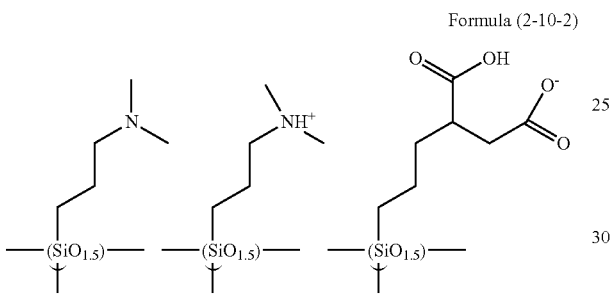
Formula (2-11-2)
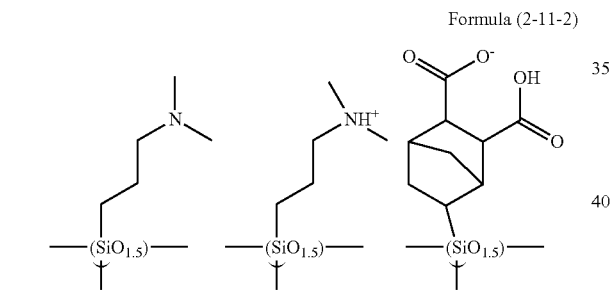
Formula (2-12-2)
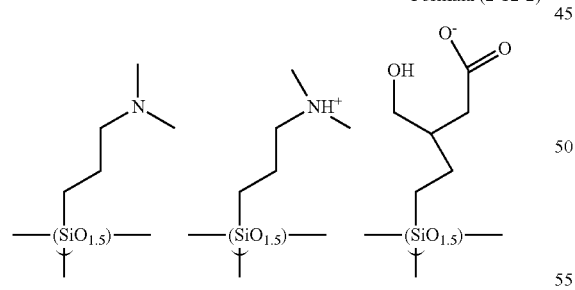
Formula (2-13-2)
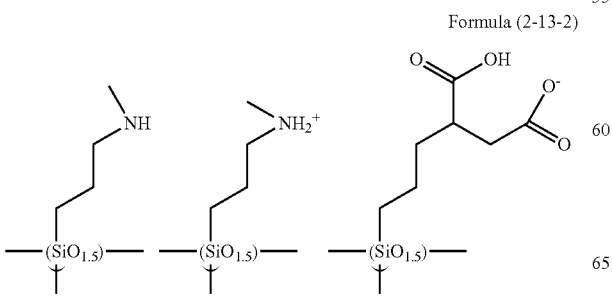
Formula (2-14-2)
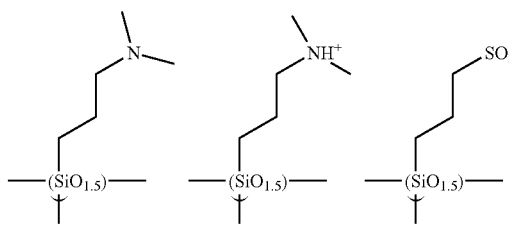
Formula (2-15-2)
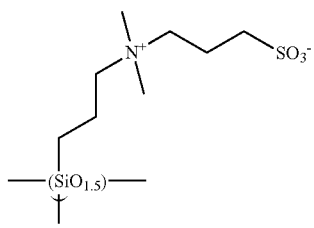
Formula (2-1-3)
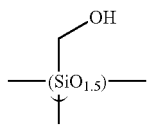
Formula (2-2-3)
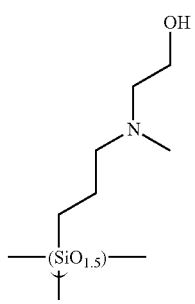
Formula (2-3-3)
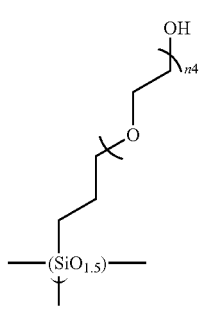
Formula (2-4-3)
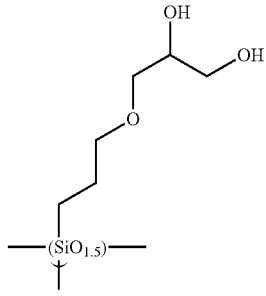
In Formula (2-3-3), n4 is an integer of 8 to 12.

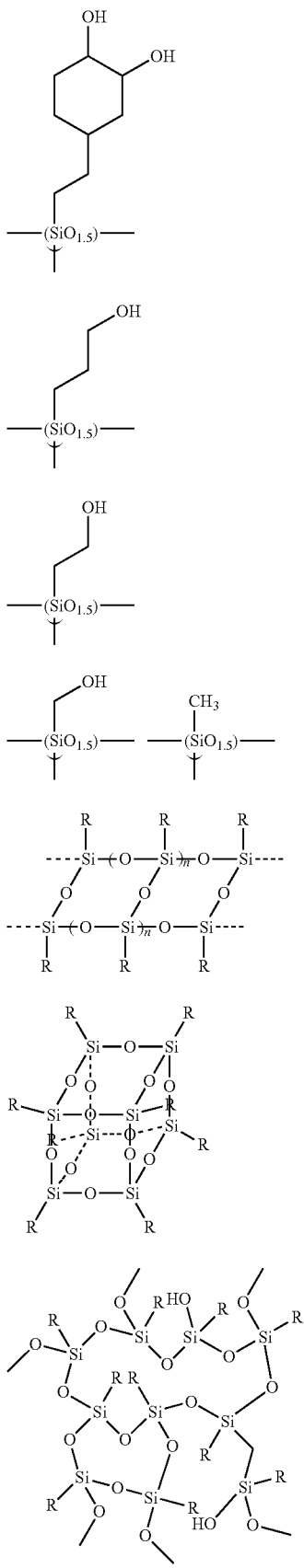
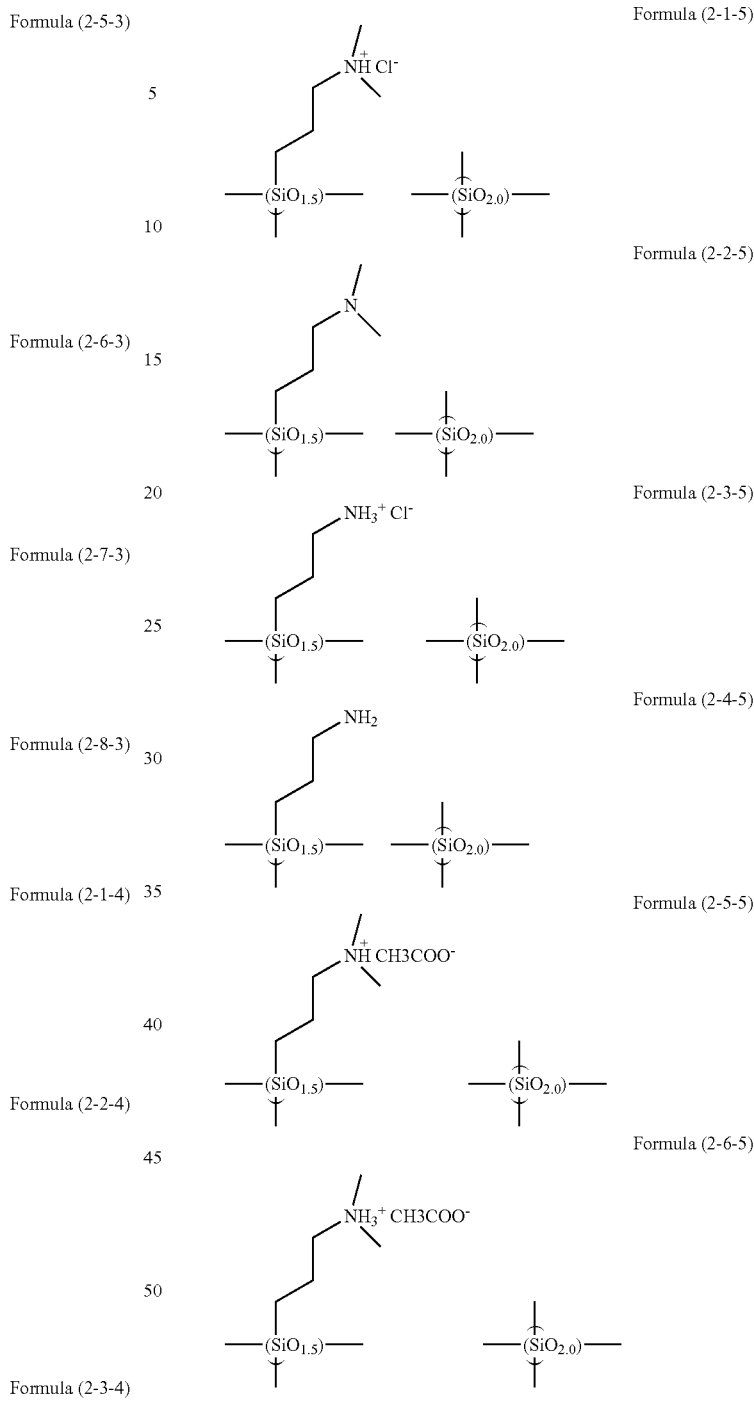

As a silsesquioxane type polysiloxane (also referred to as polysilsesquioxane), the compounds of Formula (2-1-4), Formula (2-2-4), and Formula (2-3-4) are exemplified.

The compound of Formula (2-1-4) is a ladder type silsesquioxane and n is 1 to 1,000, or 1 to 200. The compound of Formula (2-2-4) is a cage type silsesquioxane. The compound of Formula (2-3-4) is a random type silsesquioxane. In Formula (2-1-4), Formula (2-2-4), and Formula (2-3-4), R is an organic group having an amino group, an organic group having an ionic functional group, an organic group having hydroxy group, or an organic group having a functional group convertible to hydroxy group by hydrolysis and bonding to a silicon atom through a Si—C bond or a Si—N bond. Examples of these groups include the above-described examples.

As the hydrolysis condensate (a6) (polysiloxane) of the hydrolyzable silane (a4) of Formula (1) or Formula (1-1) or the hydrolysis condensate (polysiloxane) of the hydrolyzable silane containing the hydrolyzable silane (a4) of Formula (1) or Formula (1-1) and the hydrolyzable silane (b) of Formula (2) and/or Formula (3), a condensate having a weight average molecular weight of 500 to 1,000,000 or 1,000 to 100,000 can be obtained. These molecular weights are molecular weights obtained by GPC analysis in terms of polystyrene and by GFC (aqueous GPC) analysis in terms of PEG/PEO.

For example, measurement conditions of GPC are as follows: GPC equipment (trade name HLC-8220GPC, manufactured by Tosoh Co., Ltd), GPC column (trade name Shodex KF803L, KF802, and KF801, manufactured by Showa Denko KK), Column temperature at 40° C., Eluent (elution solvent) of tetrahydrofuran, and Flow volume (flow rate) at 1.0 ml/min. The measurement can be carried out using polystyrene (manufactured by Showa Denko KK) as a standard sample.

For example, measurement conditions of GFC are as follows: GFC equipment (trade name RID-10A, manufactured by Shimadzu Corporation), GFC column (trade name: Shodex SB-803HQ, manufactured by Showa Denko KK), Column temperature at 40° C., Eluent (elution solvent) of water and 0.5 M acetic acid 0.5 M sodium nitrate aqueous solution, and Flow volume (flow rate) at 1.0 ml/min. The measurement can be carried out using pullulan and PEG/PEO (manufactured by Showa Denko KK) as standard samples.

For hydrolysis of alkoxysilyl groups, acyloxysilyl groups, or halogenated silyl groups, 0.5 mol to 100 mol, preferably 1 mol to 10 mol of water per 1 mol of the hydrolyzable group is used.

Further, the hydrolysis can be carried out using a hydrolysis catalyst or can be carried out without using the hydrolysis catalyst. When the hydrolysis catalyst is used, the hydrolysis catalyst can be used in an amount of 0.001 mol to 10 mol and preferably 0.001 mol to 1 mol per 1 mol of the hydrolyzable group.

The reaction temperature at the time of the hydrolysis and condensation is usually 20° C. to 110° C.

The hydrolysis may be complete hydrolysis or may be partial hydrolysis. In other words, a hydrolysis product or a monomer may remain in the hydrolysis condensate. A catalyst may be used at the time of the hydrolysis and condensation.

Examples of the hydrolysis catalyst include a metal chelate compound, an organic acid, an inorganic acid, an organic base, and an inorganic base.

Examples of the metal chelate compound as the hydrolysis catalyst include titanium chelate compounds such as triethoxy-mono(acetylacetonato) titanium, tri-n-propoxy-mono(acetylacetonato) titanium, tri-i-propoxy-mono(acetylacetonato) titanium, tri-n-butoxy-mono(acetylacetonato) titanium, tri-sec-butoxy-mono(acetylacetonato) titanium, tri-t-butoxy-mono(acetylacetonato) titanium, diethoxy-bis(acetylacetonato) titanium, di-n-propoxy-bis(acetylacetonato) titanium, di-i-propoxy-bis(acetylacetonato) titanium, di-n-butoxy-bis(acetylacetonato) titanium, di-sec-butoxy-bis(acetylacetonato) titanium, di-t-butoxy-bis(acetylacetonato) titanium, monoethoxy-tris(acetylacetonato) titanium, mono-n-propoxy-tris(acetylacetonato) titanium, mono-i-propoxy-tris(acetylacetonato) titanium, mono-n-butoxy-tris(acetylacetonato) titanium, mono-sec-butoxy-tris(acetylacetonato) titanium, mono-t-butoxy-tris(acetylacetonato) titanium, tetrakis(acetylacetonato) titanium, triethoxy-mono(ethyl acetoacetate) titanium, tri-n-propoxy-mono(ethyl acetoacetate) titanium, tri-i-propoxy-mono(ethyl acetoacetate) titanium, tri-n-butoxy-mono(ethyl acetoacetate) titanium, tri-sec-butoxy-mono(ethyl acetoacetate) titanium, tri-t-butoxy-mono(ethyl acetoacetate) titanium, diethoxy-bis(ethyl acetoacetate) titanium, di-n-propoxy-bis(ethyl acetoacetate) titanium, di-i-propoxy-bis(ethyl acetoacetate) titanium, di-n-butoxy-bis(ethyl acetoacetate) titanium, di-sec-butoxy-bis(ethyl acetoacetate) titanium, di-t-butoxy-bis(ethyl acetoacetate) titanium, monoethoxy-tris(ethyl acetoacetate) titanium, mono-n-propoxy-tris(ethyl acetoacetate) titanium, mono-i-propoxy-tris(ethyl acetoacetate) titanium, mono-n-butoxy-tris(ethyl acetoacetate) titanium, mono-sec-butoxy-tris(ethyl acetoacetate) titanium, mono-t-butoxy-tris(ethyl acetoacetate) titanium, tetrakis(ethyl acetoacetate) titanium, mono(acetylacetonato)-tris(ethyl acetoacetate) titanium, bis(acetylacetonato)-bis(ethyl acetoacetate) titanium, and tris(acetylacetonato)-mono(ethyl acetoacetate) titanium; zirconium chelate compounds such as triethoxy-mono(acetylacetonato) zirconium, tri-n-propoxy-mono(acetylacetonato) zirconium, tri-i-propoxy-mono(acetylacetonato) zirconium, tri-n-butoxy-mono(acetylacetonato) zirconium, tri-sec-butoxy-mono(acetylacetonato) zirconium, tri-t-butoxy-mono(acetylacetonato) zirconium, diethoxy-bis(acetylacetonato) zirconium, di-n-propoxy-bis(acetylacetonato) zirconium, di-i-propoxy-bis(acetylacetonato) zirconium, di-n-butoxy-bis(acetylacetonato) zirconium, di-sec-butoxy-bis(acetylacetonato) zirconium, di-t-butoxy-bis(acetylacetonato) zirconium, monoethoxy-tris(acetylacetonato) zirconium, mono-n-propoxy-tris(acetylacetonato) zirconium, mono-i-propoxy-tris(acetylacetonato) zirconium, mono-n-butoxy-tris(acetylacetonato) zirconium, mono-sec-butoxy-tris(acetylacetonato) zirconium, mono-t-butoxy-tris(acetylacetonato) zirconium, tetrakis(acetylacetonato) zirconium, triethoxy-mono(ethyl acetoacetate) zirconium, tri-n-propoxy-mono(ethyl acetoacetate) zirconium, tri-i-propoxy-mono(ethyl acetoacetate) zirconium, tri-n-butoxy-mono(ethyl acetoacetate) zirconium, tri-sec-butoxy-mono(ethyl acetoacetate) zirconium, tri-t-butoxy-mono(ethyl acetoacetate) zirconium, diethoxy-bis(ethyl acetoacetate) zirconium, di-n-propoxy-bis(ethyl acetoacetate) zirconium, di-i-propoxy-bis(ethyl acetoacetate) zirconium, di-n-butoxy-bis(ethyl acetoacetate) zirconium, di-sec-butoxy-bis(ethyl acetoacetate) zirconium, di-t-butoxy-bis(ethyl acetoacetate) zirconium, monoethoxy-tris(ethyl acetoacetate) zirconium, mono-n-propoxy-tris(ethyl acetoacetate) zirconium, mono-i-propoxy-tris(ethyl acetoacetate) zirconium, mono-n-butoxy-tris(ethyl acetoacetate) zirconium, mono-sec-butoxy-tris(ethyl acetoacetate) zirconium, mono-t-butoxy-tris(ethyl acetoacetate) zirconium, tetrakis(ethyl acetoacetate) zirconium, mono(acetylacetonato)-tris(ethyl acetoacetate) zirconium, bis(acetylacetonato)-bis(ethyl acetoacetate) zirconium, and tris(acetylacetonato)-mono(ethyl acetoacetate) zirconium; and aluminum chelate compounds such as tris(acetylacetonato) aluminum and tris (ethyl acetoacetate) aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and trifluoromethanesulfonic acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl-monoethanolamine, monomethyl-diethanolamine, triethanolamine, diazabicyclooctane, diazabicyclononane, diazabicycloundecene, tetramethylammonium hydroxide, tetraethylammonium hydroxide, and tetrabutylammonium hydroxide. Examples of the inorganic base include ammonia, sodium hydroxide, potassium hydroxide, barium hydroxide, and calcium hydroxide.

Specifically, in the present invention, the hydrolysis product of the hydrolyzable silane (a4) or the hydrolyzable silane (a4) and the hydrolyzable silane (b) is obtained by hydrolyzing the hydrolyzable silane (a4) or the hydrolyzable silane (a4) and the hydrolyzable silane (b) in the presence of an alkaline substance, in particular the organic base. The hydrolysis condensate (polysiloxane) is preferably formed by further condensing these hydrolysis products.

Here, the alkaline substance is an alkaline catalyst that is added at the time of hydrolysis of the hydrolyzable silane or an amino group existing in the molecule of the hydrolyzable silane.

In the case of an amino group existing in the hydrolyzable silane molecule, the silane containing an amino group in its side chain are exemplified in the examples of the above-described hydrolyzable silane (a4) of Formula (1) or Formula (1-1).

When the alkaline catalyst is added, examples of the alkaline catalyst include the inorganic base and the organic base in the above-described hydrolysis catalyst. In particular, the organic base is preferable.

The hydrolysis product of the hydrolyzable silane is preferably a hydrolysis product obtained by hydrolyzing the hydrolyzable silane in the presence of the alkaline substance.

The composition may further include a hydrolyzable silane, a hydrolysis product obtained by hydrolyzing the hydrolyzable silane in the presence of an alkaline substance, or a mixture thereof.

In the present invention, a silsesquioxane obtained by hydrolyzing a silane having three hydrolyzable groups can be used. This silsesquioxane is a hydrolysis condensate (a6) obtained by hydrolyzing and condensing the silane having three hydrolyzable groups in the presence of an acidic substance. As the acidic substance used here, the acidic catalyst in the above-described hydrolysis catalyst can be used.

As the hydrolysis condensate (a6), a random type, a ladder type, and a cage type silsesquioxane can be used.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; mono-alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, methyl phenyl carbinol, diacetone alcohol, and cresol; polyalcohol solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents such as acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyl-dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol di-acetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents can be used singly or in combination of two or more of them.

The hydrolyzable silane is hydrolyzed and condensed in the solvent using the catalyst, and alcohols as by-products and the used hydrolysis catalyst, and water can be simultaneously removed from the obtained hydrolysis condensate (a polymer) by distillation under reduced pressure or other operations. The acid and the base used for the hydrolysis can be removed by neutralization or ion exchange. To the composition applied to the resist pattern of the present invention, an inorganic acid, an organic acid, water, an alcohol, an organic amine, a photoacid generator, a metal oxide, a surfactant, or a combination thereof can be added in order to stabilize the composition containing the hydrolysis condensate.

Examples of the inorganic acid include hydrochloric acid, nitric acid, sulfuric acid, and phosphoric acid.

Examples of the organic acid include oxalic acid, malonic acid, methylmalonic acid, succinic acid, maleic acid, malic acid, tartaric acid, phthalic acid, citric acid, glutaric acid, citric acid, lactic acid, salicylic acid, and methanesulfonic acid. In particular, methanesulfonic acid, oxalic acid, maleic acid, octanoic acid, decanoic acid, octanesulfonic acid, decanesulfonic acid, dodecylbenzenesulfonic acid, phenolsulfonic acid, sulfosalicylic acid, camphorsulfonic acid, nonafluorobutanesulfonic acid, toluenesulfonic acid, cumenesulfonic acid, p-octylbenzenesulfonic acid, p-decylbenzenesulfonic acid, 4-octyl-2-phenoxybenzenesulfonic acid, 4-carboxybenzenesulfonic acid are preferable. The acid to be added is 0.5 part by mass to 15 parts by mass relative to 100 parts by mass of the condensate (polysiloxane).

As the alcohol to be added, an alcohol that is easy to be evaporated by heating after coating is preferable. Examples of the alcohol include methanol, ethanol, propanol, isopropanol, and butanol. The amount of the alcohol to be added can be 0.001 part by mass to 20 parts by mass relative to 100 parts by mass of the composition applied to the resist pattern.

Example of the organic amine to be added include aminoethanol, methylaminoethanol, N,N,N',N'-tetramethylethylenediamine, N,N,N',N'-tetraethylethylenediamine, N,N,N',N'-tetrapropylethylenediamine, N,N,N',N'-tetraisopropylethylenediamine, N,N,N',N'-tetrabutylethylenediamine, N,N,N',N'-tetraisobutylethylenediamine, N,N,N',N'-tetramethyl-1,2-propylenediamine, N,N,N',N'-tetraethyl-1,2-propylenediamine, N,N,N',N'-tetrapropyl-1,2-propylenediamine, N,N,N',N'-tetraisopropyl-1,2-propylenediamine, N,N,N',N'-tetrabutyl-1,2-propylenediamine, N,N,N',N'-tetraisobutyl-1,2-propylenediamine, N,N,N',N'-tetramethyl-1,3-propylenediamine, N,N,N',N'-tetraethyl-1,3-propylenediamine, N,N,N',N'-tetrapropyl-1,3-propylenediamine, N,N,N',N'-tetraisopropyl-1,3-propylenediamine, N,N,N',N'-tetrabutyl-1,3-propylenediamine, N,N,N',N'-tetraisobutyl-1,3-propylenediamine, N,N,N',N'-tetramethyl-1,2-butylenediamine, N,N,N',N'-tetraethyl-1,2-butylenediamine, N,N,N',N'-tetrapropyl-1,2-butylenediamine, N,N,N',N'-tetraisopropyl-1,2-butylenediamine, N,N,N',N'-tetrabutyl-1,2-butylenediamine, N,N,N',N'-tetraisobutyl-1,2-butylenediamine, N,N,N',N'-tetramethyl-1,3-butylenediamine, N,N,N',N'-tetraethyl-1,3-butylenediamine, N,N,N',N'-tetrapropyl-1,3-butylenediamine, N,N,N',N'-tetraisopropyl-1,3-butylenediamine, N,N,N',N'-tetrabutyl-1,3-butylenediamine, N,N,N',N'-tetraisobutyl-1,3-butylenediamine, N,N,N',N'-tetramethyl-1,4-butylenediamine, N,N,N',N'-tetraethyl-1,4-butylenediamine, N,N,N',N'-tetrapropyl-1,4-butylenediamine, N,N,N',N'-tetraisopropyl-1,4-butylenediamine, N,N,N',N'-tetrabutyl-1,4-butylenediamine, N,N,N',N'-tetraisobutyl-1,4-butylenediamine, N,N,N',N'-tetramethyl-1,5-pentylenediamine, and N,N,N',N'-tetraethyl-1,5-pentylenediamine. The amount of the organic amine to be added can be 0.001 part by mass to 20 parts by mass relative to 100 parts by mass of the composition applied to the resist pattern.

Examples of the photoacid generator to be added include onium salt compounds, sulfonimide compounds, and disulfonyldiazomethane compounds.

Examples of the onium salt compounds include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate, and sulfonium salt compounds such as triphenylsulfonium hexafluoroantimonate, triphenylsulfonium nonafluoro-normal-butanesulfonate, triphenylsulfonium camphorsulfonate and triphenylsulfonium trifluoromethanesulfonate, triphenylsulfonium adamantanecarboxylatetrifluoroethanesulfonate, triphenylsulfonium p-toluenesulfonate, triphenylsulfonium methanesulfonate, triphenylsulfonium phenolsulfonate, triphenylsulfonium nitrate, triphenylsulfonium maleate, bis(triphenylsulfonium) maleate, triphenylsulfonium hydrochloride, triphenylsulfonium acetate, triphenylsulfonium trifluoroacetate, triphenylsulfonium salicylate, triphenylsulfonium benzoate, and triphenylsulfonium hydroxide.

Examples of the sulfonimide compound include N-(trifluoromethanesulfonyloxy) succinimide, N-(nonafluoro-normal-butanesulfonyloxy) succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generator can be used singly or can be used in combination of two or more of them. When the photoacid generator is used, a ratio thereof is 0.01 part by mass to 30 parts by mass, 0.1 part by mass to 20 parts by mass, or 0.5 part by mass to 10 parts by mass relative to 100 parts by mass of the condensate (polysiloxane).

Examples of the surfactant contained in the composition of the present invention include a nonionic surfactant, an anionic surfactant, a cationic surfactant, a silicon-based surfactant, and a UV curable surfactant.

Examples of the surfactant include nonionic surfactants such as polyoxyethylene alkyl ethers such as polyoxyethylene lauryl ethers, polyoxyethylene stearyl ethers, polyoxyethylene cetyl ethers, and polyoxyethylene oleyl ethers; polyoxyethylene alkylaryl ethers such as polyoxyethylene octylphenol ethers and polyoxyethylene nonylphenol ethers; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorochemical surfactants such as Eftop EF301, EF303, and EF352 (trade name, manufactured by TOHKEM PRODUCTS CORPORATION), Megafac F171, F173, R-08, R-30, R-40, and R-40N (trade name, manufactured by DIC Corporation), Fluorad FC430 and FC431 (manufactured by Sumitomo 3M Ltd.), Asahi guard AG710, Surflon S-382, SC101, SC102, SC103, SC104, SC105, and SC106 (trade name, Asahi Glass Co., Ltd.); and silicon-based surfactants such as Organosiloxane Polymer KP341 (trade name, manufactured by Shin-Etsu Chemical Co., Ltd.); BYK302, BYK307, BYK333, BYK341, BYK345, BYK346, BYK347, and BYK348 (trade name, manufactured by BYK-Chemie GmbH). Examples of the surfactant also include cationic surfactants such as distearyldimethylammonium chloride, benzalkonium chloride, benzethonium chloride, cetylpyridinium chloride, hexadecyltrimethylammonium bromide, and decalinium chloride; anionic surfactants such as octanoate, decanoate, octanesulfonate, decanoatesulfonate, palmitate, perfluorobutanesulfonate, and dodecylbenzenesulfonate; and UV curable surfactants such as BYK307, BYK333, BYK381, BYK-UV-3500, BYK-UV-3510, and BYK-UV-3530 (trade name, manufactured by BYK-Chemie GmbH).

These surfactants can be used singly or can be used in combination of two or more of them. When the surfactant is used, the ratio thereof is 0.0001 part by mass to 5 parts by mass, 0.001 part by mass to 5 parts by mass, or 0.01 part by mass to 5 pars by mass relative to 100 parts by mass of the condensate (polyorganosiloxane).

As a solvent used for the composition applied to the resist pattern of the present invention, water is preferably used. Hydrophilic organic solvents soluble in water can be mixed.

The coating composition containing the polymer for pattern forming of the present invention can prevent collapse of the resist pattern by bringing the composition into contact with the resist surface after mask exposure and filling the polymer into the spaces of the resist pattern. Thereafter, the surface at which the polymer is filled into the spaces of the resist pattern is dry etched and the resist pattern is removed, whereby the filled polymer forms a new resist pattern. This process may be called a reverse process.

In this case, the resist and the polymer to be filled are preferably a combination in which the dry etching rates of them vary depending on the type of gas used for dry etching. For example, when an acrylic resist material is used as the resist, a polyorganosiloxane material or an inorganic oxide material is preferably used as the polymer to be filled.

In the present invention, after development after exposure with the development liquid, the spaces of the resist pattern are filled with the polymer that can form a new pattern in a subsequent step by covering the resist with the coating composition of the present invention. Therefore, the initial resist pattern can be filled without collapse and a fine pattern that does not collapse can be formed by the subsequent dry etching process forming a reverse pattern (inverted pattern).

During development after exposure with the development liquid, the composition (coating liquid) of the present invention instead of the development liquid or the rinsing liquid is introduced and fills the spaces of the resist pattern. In such a way a fine pattern that does not collapse can be formed by the subsequent dry etching process to form the reverse pattern.

When the composition for coating is fully applied onto the resist pattern, the coating composition applied to the resist pattern can reverse the pattern by exposing the resist surface that is etched back by dry etching and then dry etching the resist using a gas (oxygen-based gas) having a higher etching rate for the resist in order to reverse the pattern.

More specifically, the present invention include a method for producing a semiconductor device comprising: (1) a step of applying a resist onto a substrate; (2) a step of exposing and developing the resist; (3) a step of applying the composition described above onto a resist pattern during development or after development; and (4) a step of etching and removing the resist pattern to reverse the pattern.

The photoresist used in the step (1) is not particularly limited as long as the photoresist is sensitive to light used for exposure. Both negative type photoresist and positive type photoresist can be used. Examples of the photoresist include a positive type photoresist made of a novolak resin and 1,2-naphthoquinonediazide sulfonic acid ester, a chemically amplified photoresist made of a binder having a group decomposed with an acid to increase an alkali dissolution rate and a photoacid generator, a chemically amplified photoresist made of a low molecular compound decomposed with an acid to increase an alkali dissolution rate of the photoresist, an alkali-soluble binder, and a photoacid generator, and a chemically amplified photoresist made of a binder having a group decomposed with an acid to increase an alkali dissolution rate, a low molecular compound decomposed with an acid to increase an alkali dissolution rate of the photoresist, and a photoacid generator. Examples of commercially available photoresist include APEX-E (trade name, manufactured by Shipley Company L. L. C.), PAR710 (trade name, manufactured by Sumitomo Chemical Company, Limited), and SEPR430 (trade name, manufactured by Shin-Etsu Chemical Co., Ltd.). In addition, fluorine atom-containing polymer-based photoresists as described in Proc. SPIE, Vol. 3999, 330-334 (2000), Proc. SPIE, Vol. 3999, 357-364 (2000), and Proc. SPIE, Vol. 3999, 365-374 (2000) can be included.

Both negative type electron beam resists and positive type electron beam resists can also be used. Examples of the electron beam resist include a chemically amplified resist made of an acid generator and a binder having a group decomposed with an acid to change an alkali dissolution rate, a chemically amplified resist made of an alkali soluble binder, an acid generator, and a low molecular compound decomposed with an acid to change an alkali dissolution rate, a chemically amplified resist made of an acid generator, a binder having a group decomposed with an acid to change an alkali dissolution rate, and a low molecular compound decomposed with an acid to change an alkali dissolution rate of the photoresist, a non-chemically amplified resist made of a binder having a group decomposed with electron beams to change an alkali dissolution rate, and a non-chemically amplified resist made of a binder having a site the chemical bond of which is cut by electron beams to change an alkali dissolution rate. When these electron beam resists are used, similar to the case where photoresist is used, a resist pattern can be formed by using electron beams as an irradiation source.

After applying the resist solution, the resist can be obtained in a resist thickness in a range of 10 nm to 1,000 nm at a baking temperature of 70° C. to 150° C. and a baking time of 0.5 minute to 5 minutes. The resist solution, the development liquid, and the coating material described below can be applied by a spin coating method, a dipping method, a spraying method, or the like. In particular, the spin coating method is preferable. The resist is exposed through a predetermined mask. KrF excimer laser (a wavelength of 248 nm), ArF excimer laser (a wavelength of 193 nm), EUV light (a wavelength of 13.5 nm), electron beams, or the like can be used for the exposure. After exposure, post exposure bake (PEB) can be carried out, if necessary. The post exposure bake is carried out under appropriately selected conditions of a heating temperature of 70° C. to 150° C. and a heating time of 0.3 minute to 10 minutes.

Before the step (1), the step (1-1) of forming a resist underlayer film on the substrate can be included. This resist underlayer film has antireflection and an organic hard mask functions.

Specifically, the step (1-1) of forming a resist underlayer film on the semiconductor substrate is carried out before the step (1) of applying the resist and thereafter, the step (1) of forming a resist on the resist underlayer film can be carried out.

In the step (1-1), the resist underlayer film can be formed on the semiconductor substrate, a silicon hard mask can be further formed thereon, and the resist can be formed thereon.

The resist underlayer film used in the step (1-1) is a film used for preventing diffuse reflection at the time of exposure of the upper layer resist and is used for improving the adhesion to the resist. For example, an acrylic-based resin or a novolak-based resin can be used. As the resist underlayer film, a coating film having a film thickness of 1 nm to 1,000 nm can be formed on a semiconductor substrate. The resist underlayer film used in the step (1-1) is a hard mask using an organic resin and a material having a high carbon content and a low hydrogen content is used. Examples of the material include a polyvinyl naphthalene-based resin, a carbazole novolak resin, a phenol novolak resin, and a naphthol novolak resin. These resins can form a coating film having a film thickness of 5 nm to 1,000 nm on the semiconductor substrate.

As the silicon hard mask used in the step (1-1), a polysiloxane obtained by hydrolyzing a hydrolyzable silane can be used. Examples of the polysiloxane include polysiloxanes obtained by hydrolyzing tetraethoxysilane, methyltrimethoxysilane, and phenyltriethoxysilane. As the mask, a coating film can be formed on the resist underlayer film in a film thickness of 5 nm to 200 nm.

In the step (2), the resist is exposed through the predetermined mask. KrF excimer laser (a wavelength of 248 nm), ArF excimer laser (a wavelength of 193 nm), EUV light (a wavelength of 13.5 nm) or the like can be used for the exposure. After exposure, post exposure bake can be carried out, if necessary. The post exposure bake is carried out under appropriately selected conditions of a heating temperature of 70° C. to 150° C. and a heating time of 0.3 minute to 10 minutes.

Subsequently, development is carried out with a development liquid. This allows an exposed part of the photoresist to be removed to form a pattern of the photoresist when, for example, a positive type photoresist is used.

Examples of the development liquid include aqueous alkali solutions including aqueous solutions of alkali metal hydroxides such as potassium hydroxide and sodium hydroxide, aqueous solutions of quaternary ammonium hydrides such as tetramethylammonium hydroxide, tetraethylammonium hydroxide, and choline, and aqueous solutions of amines such as ethanolamine, propylamine, and ethylenediamine. In addition, a surfactant and the like can be added to the development liquid. The development conditions are appropriately selected from a temperature of 5° C. to 50° C. and a time of 10 seconds to 600 seconds.

In the present invention, organic solvents can also be used as the development liquid. After exposure to light, development is carried out with a development liquid (a solvent). This allows an unexposed part of the photoresist to be removed to form a pattern of the photoresist when, for example, a positive type photoresist is used.

Examples of the development liquid include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. In addition, a surfactant and the like can be added to the development liquid. The development conditions are appropriately selected from a temperature of 5° C. to 50° C. and a time of 10 seconds to 600 seconds.

In the step (3), the coating composition of the present invention is applied onto the resist during development or after development. In the step (3), the coating composition can be heated to form a coating film. The coating composition is heated at a baking temperature of 50° C. to 180° C. for 0.5 minute to 5 minutes.

In the present invention, the step (3-1) of exposing the surface of the resist pattern by etching back the surface of the formed coating film can be included after the step (3). By adding the step (3-1), in the subsequent step (4), the surface of the resist pattern and the surface of the coating composition exist in the same plane. Consequently, the resist component alone is removed due to the difference in gas etching rates between the resist pattern and the coating composition and components of the coating composition remain. As a result, the pattern is reversed. In the etching back, the resist pattern is exposed by a gas (for example, a fluorine-based gas) that can remove the coating composition.

In the step (4), the resist pattern is removed by etching and the pattern is reversed. Examples of gases used for dry etching in the step (4) include tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride. In particular, the dry etching is preferably carried out with an oxygen-based gas.

As a result, the initial resist pattern is removed and a reverse pattern is formed by the component for forming the reversed pattern (component (A)) contained in the coating composition.

The composition for applying to the resist pattern of the present invention can also be applied onto the patterned resist underlayer film.

More specifically, a method for producing a semiconductor device includes (a) a step of forming a resist underlayer film on a substrate; (b) a step of forming a hard mask on the resist underlayer film; (c) a step of forming a resist film on the hard mask; (d) a step of forming a resist pattern by light or electron beam irradiation and development; (e) a step of etching the hard mask using the resist pattern; (f) a step of etching the resist underlayer film using the patterned hard mask; (g) a step of applying the coating composition of the present invention onto the patterned resist underlayer film; and (h) a step of etching and removing the resist underlayer film to reverse the pattern.

The resist underlayer film used here is a hard mask using the above-described organic resin and the hard mask to be used is a silicon hard mask formed of the polysiloxane that is a hydrolysis condensate of the above-described silane. In the step (e) of etching the hard mask using the resist pattern, the etching is carried out with a fluorine-based gas. In the step (f) of etching the resist underlayer film using the patterned hard mask, the etching is carried out with oxygen-based gas. In the step (h) of etching and removing the resist underlayer film to reverse the pattern, etching is carried out with an oxygen-based gas.

In the step (g), the coating composition can be heated to form a coating film. The coating composition is heated at a baking temperature of 50° C. to 500° C. for 0.5 minute to 5 minutes.

In the present invention, a step of exposing the surface of the resist pattern by etching back the surface of the coating film can be included after the step (g). By adding this step, in the subsequent step (h), the surface of the resist underlayer film and the surface of the coating composition exist in the same plane. Consequently, the resist underlayer film alone is removed due to the difference in gas etching rates between the resist underlayer film and the coating composition and components according to the coating composition remain. As a result, the pattern is reversed. In the above-described etching back, the resist underlayer film pattern is exposed by a gas (for example, a fluorine-based gas) that can remove the coating composition.

EXAMPLES

Synthesis Example 1-1

In a 500 ml flask 1.53 g of a 35% by mass tetraethylammonium hydroxide aqueous solution, 4.89 g of water, and 120.54 g of tetrahydrofuran were placed. To the mixed solution 40.18 g of aminopropyltriethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-1).

Synthesis Example 2-1

In a 500 ml flask 5.89 g of water and 120.54 g of tetrahydrofuran were placed. To the mixed solution 40.18 g of aminopropyltriethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 120.54 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution in a concentration of 20% by mass in terms of solid residue at 140° C. as a solvent ratio of 100% water (water solvent alone). The obtained polymer corresponded to Formula (2-1-1).

Synthesis Example 3-1

In a 500 ml flask 1.73 g of a 35% by mass tetraethylammonium hydroxide aqueous solution, 5.54 g of water, and 128.58 g of tetrahydrofuran were placed. To the mixed solution 31.86 g of aminopropyltriethoxysilane (70% by mole in total silane) and 11.0 g of triethoxymethylsilane (30% by mole in total silane) were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 257.16 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-2-1).

Synthesis Example 4-1

In a 500 ml flask 1.81 g of a 35% by mass tetraethylammonium hydroxide aqueous solution, 5.80 g of water, and 131.76 g of tetrahydrofuran were placed. To the mixed solution 28.58 g of aminopropyltriethoxysilane (60% by mole in total silane) and 15.34 g of triethoxymethylsilane (40% by mole in total silane) were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 263.52 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-2-1).

Synthesis Example 5-1

In a 500 ml flask 1.35 g of a 35% by mass tetraethylammonium hydroxide aqueous solution, 4.34 g of water, and 93.38 g of tetrahydrofuran were placed. To the mixed solution 31.13 g of trimethoxy[3-(methylamino)propyl]silane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 172.40 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-3-1).

Synthesis Example 6-1

In a 500 ml flask 1.22 g of a 35% by mass tetraethylammonium hydroxide aqueous solution, 3.90 g of water, and 89.99 g of tetrahydrofuran were placed. To the mixed solution 30.00 g of 3-(N,N-dimethylaminopropyl)trimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 179.98 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-4-1).

Synthesis Example 7-1

In a 500 ml flask 1.10 g of a 35% by mass tetraethylammonium hydroxide aqueous solution, 3.52 g of water, and 87.06 g of tetrahydrofuran were placed. To the mixed solution 29.02 g of 3-(2-aminoethylamino)propyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 174.12 g of water was added to the reaction solution. Ethanol, THF, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-5-1).

Synthesis Example 8-1

In a 500 ml flask 1.03 g of a 35% by mass tetraethylammonium hydroxide aqueous solution, 3.30 g of water, and 100.86 g of tetrahydrofuran were placed. To the mixed solution 33.62 g of N-(3-triethoxysilylpropyl)-4,5-dihydroimidazole (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 201.72 g of water was added to the reaction solution. Ethanol, THF, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-1).

Synthesis Example 9-1

In a 500 ml flask 1.06 g of a 35% by mass tetraethylammonium hydroxide aqueous solution, 3.41 g of water, and 86.20 g of tetrahydrofuran were placed. To the mixed solution 2-(2-pyridylethyl)trimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 172.40 g of water was added to the reaction solution. Ethanol, THF, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-7-1).

Comparative Synthesis Example 1-1

In a 500 ml flask 2.51 g of a 35% by mass tetraethylammonium hydroxide aqueous solution, 8.04 g of water, and 159.39 g of tetrahydrofuran were placed. To the mixed solution 53.13 g of triethoxymethylsilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 318.77 g of water was added to the reaction solution. Ethanol, THF, and water being reaction by-products were removed by distillation under reduced pressure and the reaction solution was concentrated to give an aqueous solution of a hydrolysis condensate (polysiloxane). The aqueous solution, however, became clouded.

Reference Synthesis Example 1-1

In a 500 ml flask 2.48 g of a 35% by mass tetraethylammonium hydroxide aqueous solution, 7.93 g of water, and 158.13 g of tetrahydrofuran were placed. To the mixed solution 1.30 g of aminopropyltriethoxysilane (2% by mole in total silane) and 51.41 g of triethoxymethylsilane (98% by mole in total silane) were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 316.25 g of water was added to the reaction solution. Ethanol, THF, and water being reaction by-products were removed by distillation under reduced pressure and the reaction solution was concentrated to give an aqueous solution of a hydrolysis condensate (polysiloxane). The aqueous solution, however, became clouded.

Synthesis Example 1-2

In a 500 ml flask 3.82 g of a 35% by mass tetraethylammonium hydroxide aqueous solution, 3.41 g of water, and 120.54 g of acetone were placed. To the mixed solution 40.18 g of aminopropyltriethoxysilane (100% by mole in total silane) was added dropwise while stirring the mixed solution with a magnetic stirrer. Thereafter, 9.08 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-2).

Synthesis Example 2-2

In a 500 ml flask 5.89 g of water and 120.54 g of acetone were placed. To the mixed solution 40.18 g of aminopropyltriethoxysilane (100% by mole in total silane) was added dropwise while stirring the mixed solution with a magnetic stirrer. Thereafter, 9.08 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-2).

Synthesis Example 3-2

In a 500 ml flask 5.89 g of water and 120.54 g of acetone were placed. To the mixed solution 40.18 g of aminopropyltriethoxysilane was added dropwise while stirring the mixed solution with a magnetic stirrer. Thereafter, 9.08 g of 1M hydrochloric acid aqueous solution was added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-2-2).

Synthesis Example 4-2

In a 500 ml flask 5.89 g of water and 120.54 g of acetone were placed. To the mixed solution 40.18 g of aminopropyltriethoxysilane was added dropwise while stirring the mixed solution with a magnetic stirrer. Thereafter, 9.08 g of 1M acetic acid aqueous solution was added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-3-2).

Synthesis Example 5-2

In a 500 ml flask 5.89 g of water and 120.54 g of acetone were placed. To the mixed solution 40.18 g of aminopropyltriethoxysilane was added dropwise while stirring the mixed solution with a magnetic stirrer. Thereafter, 9.08 g of a 1M maleic acid aqueous solution was added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-4-2).

Synthesis Example 6-2

In a 500 ml flask 5.89 g of water and 120.54 g of acetone were placed. To the mixed solution 40.18 g of aminopropyltriethoxysilane was added dropwise while stirring the mixed solution with a magnetic stirrer. Thereafter, 9.08 g of 1M nitric acid aqueous solution and 1.82 g of a 1M nonafluorobutanesulfonic acid aqueous solution were added. After the addition, the flask was transferred to an oil bath adjusted to 40° C. and the reaction solution was reacted for 240 minutes. Thereafter, the reaction solution was cooled to room temperature and 241.08 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-5-2).

Synthesis Example 7-2

In a 500 ml flask 5.80 g of water and 131.76 g of acetone were placed. To the mixed solution 28.58 g of aminopropyltriethoxysilane and 15.34 g of methyltriethoxysilane were added dropwise while stirring the mixed solution with a magnetic stirrer. Thereafter, 10.76 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 263.52 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-2).

Synthesis Example 8-2

In a 500 ml flask 5.22 g of water and 93.38 g of acetone were placed. To the mixed solution 31.13 g of methylaminopropyltriethoxysilane was added dropwise while stirring the mixed solution with a magnetic stirrer. Thereafter, 8.05 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 186.77 g of water was added to the reaction solution. Ethanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-7-2).

Synthesis Example 9-2

In a 500 ml flask 6.83 g of water and 86.20 g of acetone were placed. To the mixed solution 28.73 g of pyridylethyltrimethoxysilane was added dropwise while stirring the mixed solution with a magnetic stirrer. Thereafter, 6.32 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 172.40 g of water was added to the reaction solution. Methanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-8-2).

Synthesis Example 10-2

In a 500 ml flask 4.69 g of water and 89.99 g of acetone were placed. To the mixed solution 30.00 g of dimethylaminopropyltrimethoxysilane was added dropwise while stirring the mixed solution with a magnetic stirrer. Thereafter, 7.23 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 179.98 g of water was added to the reaction solution. Methanol, acetone, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-9-2).

Synthesis Example 11-2

In a 500 ml flask 91.16 g of water was placed. To the mixed solution 22.23 g of dimethylaminopropyltrimethoxysilane and 8.16 g of triethoxysilylpropylsuccinic anhydride were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 91.16 g of water was added to the reaction solution. Methanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-10-2).

Synthesis Example 12-2

In a 500 ml flask 92.63 g of water was placed. To the mixed solution 12.51 g of dimethylaminopropyltrimethoxysilane and 18.37 g of triethoxysilylpropylsuccinic anhydride were added dropwise while stirring the mixed solution with a magnetic stirrer. Thereafter, 8.05 g of a 1M nitric acid aqueous solution was added. After the addition, the flask was transferred to an oil bath adjusted to 40° C. and the reaction solution was reacted for 240 minutes. Thereafter, the reaction solution was cooled to room temperature and 92.63 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-10-2).

Synthesis Example 13-2

In a 500 ml flask 90.19 g of water was placed. To the mixed solution 21.54 g of dimethylaminopropyltrimethoxysilane and 8.53 g of triethoxysilylnorbornanedicarboxylic anhydride were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 90.19 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-11-2).

Synthesis Example 14-2

In a 500 ml flask 92.38 g of water was placed. To the mixed solution 23.10 g of dimethylaminopropyltrimethoxysilane and 7.70 g of triethoxysilylethyl-γ-butyrolactone were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 92.38 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-12-2).

Synthesis Example 15-2

In a 500 ml flask 93.70 g of water was placed. To the mixed solution 22.41 g of methylaminopropyltrimethoxysilane and 8.82 g of triethoxysilylpropylsuccinic anhydride were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 93.70 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-13-2).

Synthesis Example 16-2

In a 500 ml flask 85.00 g of water was placed. To the mixed solution 22.78 g of dimethylaminopropyltrimethoxysilane and 8.82 g of a 30% trihydroxysilylpropylsulfonic acid aqueous solution were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 85.00 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-14-2).

Synthesis Example 17-2

In a 500 ml flask 75.93 g of water was placed. To the mixed solution 25.31 g of N-trimethoxysilylpropyldimethylammonium propylsulfonate was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 75.93 g of water was added to the reaction solution. Ethanol and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-15-2).

Synthesis Example 1-3

In a 1,000 ml flask 10.12 g of a 35% by mass tetraethylammonium hydroxide aqueous solution, 1.22 g of water, and 140.26 g of tetrahydrofuran were placed. To the mixed solution 93.50 g of a 50% ethanol solution of hydroxymethyltriethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 280.51 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-3).

Synthesis Example 2-3

In a 1,000 ml flask 84.64 g of water was placed. To the mixed solution 37.62 g of a 75% methanol solution of N-(hydroxyethyl)-N-methylaminopropyltrimethoxysilane (100% by mole in total silane) was added dropwise while stirring the solution with a magnetic stirrer. After the addition, the flask was transferred to an oil bath adjusted to 110° C. and the reaction solution was reacted for 240 minutes. Thereafter, the reaction solution was cooled to room temperature and 169.28 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-2-3).

Synthesis Example 3-3

In a 1,000 ml flask 5.00 g of a 35% by mass tetraethylammonium hydroxide aqueous solution, 0.60 g of water, and 84.64 g of tetrahydrofuran were placed. To the mixed solution 37.62 g of a 75% methanol solution of N-(hydroxyethyl)-N-methylaminopropyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 169.28 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-2-3).

Synthesis Example 4-3

In a 1,000 ml flask 1.53 g of a 35% by mass tetraethylammonium hydroxide aqueous solution, 0.18 g of water, and 72.10 g of tetrahydrofuran were placed. To the mixed solution 48.07 g of a 50% ethanol solution of [hydroxy(polyethyleneoxy)propyl]triethoxysilane (8-12EO: product name) manufactured by Gelest, Inc. (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 144.20 g of water was added to the reaction solution. Ethanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-3-3).

Synthesis Example 5-3

In a 1,000 ml flask 5.03 g of a 35% by mass tetraethylammonium hydroxide aqueous solution, 0.61 g of water, and 84.80 g of tetrahydrofuran were placed. To the mixed solution 28.27 g of (3-glycidoxypropyl)trimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 19.93 g of a M nitric acid and 169.59 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-4-3).

Synthesis Example 6-3

In a 1,000 ml flask 4.75 g of a 35% by mass tetraethylammonium hydroxide aqueous solution, 0.57 g of water and 97.63 g of tetrahydrofuran were placed. To the mixed solution 32.54 g of 2-(3,4-epoxycyclohexyl)ethyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 18.80 g of a 1M nitric acid and 195.27 g of water were added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-5-3).

Synthesis Example 7-3

In a 1,000 ml flask 64.92 g of a 35% by mass tetraethylammonium hydroxide aqueous solution and 91.99 g of tetrahydrofuran were placed. To the mixed solution 30.66 g of 3-chloropropyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 183.97 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-3).

Synthesis Example 8-3

In a 1,000 ml flask 48.34 g of a 35% by mass tetraethylammonium hydroxide aqueous solution and 83.82 g of tetrahydrofuran were placed. To the mixed solution 27.94 g of 3-bromopropyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 167.64 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-3).

Synthesis Example 9-3

In a 1,000 ml flask 38.06 g of a 35% by mass tetraethylammonium hydroxide aqueous solution and 78.75 g of tetrahydrofuran were placed. To the mixed solution 26.25 g of 3-iodopropyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 157.51 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-3).

Synthesis Example 10-3

In a 1,000 ml flask 82.86 g of a 35% by mass tetraethylammonium hydroxide aqueous solution and 100.83 g of tetrahydrofuran were placed. To the mixed solution 33.61 g of chloromethyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 201.66 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-3).

Synthesis Example 11-3

In a 1,000 ml flask 101.24 g of a 35% by mass tetraethylammonium hydroxide aqueous solution and 140.23 g of tetrahydrofuran were placed. To the mixed solution 46.74 g of acetoxymethyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 280.45 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-1-3).

Synthesis Example 12-3

In a 1,000 ml flask 86.62 g of a 35% by mass tetraethylammonium hydroxide aqueous solution and 128.63 g of tetrahydrofuran were placed. To the mixed solution 42.88 g of acetoxyethyltrimethoxysilane (100% by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 257.27 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-7-3).

Synthesis Example 13-3

In a 1,000 ml flask 75.69 g of a 35% by mass tetraethylammonium hydroxide aqueous solution and 119.98 g of tetrahydrofuran were placed. To the mixed solution 39.99 g of acetoxypropyltrimethoxysilane (100%/o by mole in total silane) was added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 239.97 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-6-3).

Synthesis Example 14-3

In a 1,000 ml flask 11.20 g of a 35% by mass tetraethylammonium hydroxide aqueous solution, 1.35 g of water, and 148.80 g of tetrahydrofuran were placed. To the mixed solution 51.73 g of a 50% ethanol solution of hydroxymethyltriethoxysilane (50% by mole in total silane) and 23.74 g of methyltriethoxysilane (50% by mole in total silane) were added dropwise while stirring the mixed solution with a magnetic stirrer. After the addition, the flask was transferred to an oil bath adjusted to 40° C. and the reaction solution was reacted for 240 minutes. Thereafter, the reaction solution was cooled to room temperature and 297.60 g of water was added to the reaction solution. Methanol, tetrahydrofuran, and water being reaction by-products were removed by distillation under reduced pressure and the reaction solution was concentrated to give an aqueous solution of a hydrolysis condensate (polysiloxane). Water was further added to the aqueous solution to adjust the aqueous solution to a concentration of 20% by mass in terms of solid residue at 140° C. as a solvent ratio of 100% water (water solvent alone). The obtained polymer corresponded to Formula (2-8-3).

Reference Synthesis Example 1-3

In a 500 ml flask 19.11 g of (3-glycidoxypropyl)trimethoxysilane was placed. To the mixed solution 80.88 g of a 1M nitric acid aqueous solution was added dropwise while stirring the mixed solution with a magnetic stirrer. After the addition, the flask was transferred to an oil bath adjusted to 110° C. and the reaction solution was reacted for 240 minutes. Thereafter, the reaction solution was cooled to room temperature and 80.88 g of water was added to the reaction solution. Methanol, water, and nitric acid being reaction by-products were removed by distillation under reduced pressure and the reaction solution was concentrated to give an aqueous solution of a hydrolysis condensate (polysiloxane). The aqueous solution was clouded. The obtained polymer corresponded to Formula (2-4-3).

Synthesis Example 1-4

In a 300 ml flask 93.13 g of a 0.5M hydrochloric acid aqueous solution was placed. To the mixed solution 6.87 g of aminopropyltriethoxysilane (100% by mole in total silane) was added dropwise while stirring the mixed solution with a magnetic stirrer. After the addition, the flask was transferred to an oil bath adjusted to 23° C. and the reaction solution was reacted for 5 days. Thereafter, ethanol and water being reaction by-products were removed by distillation under reduced pressure and the reaction solution was concentrated to give a hydrolysis condensate (polysiloxane). Thereafter, ethanol and water being reaction by-products were removed by distillation under reduced pressure and the reaction solution was concentrated to give a hydrolysis condensate (polysiloxane). Water was further added to the aqueous solution to adjust the aqueous solution to a concentration of 20% by mass in terms of solid residue at 140° C. as a solvent ratio of 1000% water (water solvent alone). The obtained polymer corresponded to Formula (2-1-4) that is a ladder type silsesquioxane and R was ammonium chloride propyl group ($R=C_3H_6NH_3^+Cl^-$).

Thereafter, 6.8 g of an anion exchange resin was added to remove chlorine ions. The obtained polymer corresponded to Formula (2-1-4) that is a ladder type silsesquioxane and R was aminopropyl group ($R=C_3H_6NH_2$).

Synthesis Example 2-4

In a 300 ml flask 93.13 g of a 0.5M trifluoromethanesulfonic acid aqueous solution was placed. To the mixed solution 6.87 g of aminopropyltriethoxysilane (100% by mole in total silane) was added dropwise while stirring the mixed solution with a magnetic stirrer. After the addition, the flask was transferred to an oil bath adjusted to 23° C. and the reaction solution was reacted for 2 hours. Thereafter, ethanol and water being reaction by-products were removed by distillation under reduced pressure and the reaction solution was concentrated to give a hydrolysis condensate (polysiloxane). Subsequently, ethanol and water being reaction by-products were removed by distillation under reduced pressure at 50° C. and then at 100° C. and the aqueous solution was concentrated to give a hydrolysis condensate (polysiloxane). Thereafter, water was added to the aqueous solution to adjust the aqueous solution to a concentration of 20% by mass in terms of solid residue at 140° C. as a solvent ratio of 100% water (water solvent alone). The obtained polymer corresponded to Formula (2-2-4) that is a cage type silsesquioxane and R was an ammonium trifluoromethanesulfonate propyl group ($R=C_3H_6NH_3^+CF_3SO_3^-$).

Thereafter, 6.8 g of an anion exchange resin was added to remove trifluoromethanesulfonate ions. The obtained polymer corresponded to Formula (2-2-4) that is a cage type silsesquioxane and R was aminopropyl group ($R=C_3H_6NH_2$).

Synthesis Example 1-5

In a 300 ml flask 14.97 g of a 6 M hydrochloric acid aqueous solution and 177.57 g of ultrapure water were placed. To the mixed solution 3.72 g of dimethylaminopropyltrimethoxysilane (30% by mole in total silane) was added dropwise while stirring the mixed solution with a magnetic stirrer. After stirring at room temperature for 5 minutes, this aqueous solution was added dropwise to 8.73 g of tetraethoxysilane (70% by mole in total silane). After the addition, the flask was transferred to an oil bath adjusted to 23° C. and the reaction solution was reacted for 2 hours. Thereafter, ethanol and water being reaction by-products were removed by distillation under reduced pressure and the reaction solution was concentrated to give a hydrolysis condensate (polysiloxane). Subsequently, ethanol and water being reaction by-products were removed by distillation under reduced pressure at 50° C. and then at 100° C. and the aqueous solution was concentrated to give a hydrolysis condensate (polysiloxane). Thereafter, water was added to the aqueous solution to adjust the aqueous solution to a concentration of 20% by mass in terms of solid residue at 140° C. as a solvent ratio of 100% water (water solvent alone). The obtained polymer corresponded to Formula (2-1-5).

Synthesis Example 2-5

To the polymer obtained in Synthesis Example 1-5, 5 g of an anion exchange resin was added to remove hydrochloric acid anions. The obtained polymer corresponded to Formula (2-2-5).

Synthesis Example 3-5

In a 300 ml flask 16.64 g of a 6M hydrochloric acid aqueous solution and 219.58 g of ultrapure water were placed. To the mixed solution 4.42 g of aminopropyltriethoxysilane (30% by mole in total silane) was added dropwise while stirring the mixed solution with a magnetic stirrer. After stirring at room temperature for 5 minutes, this aqueous solution was added dropwise to 9.71 g of tetraethoxysilane (70% by mole in total silane). After the addition, the flask was transferred to an oil bath adjusted to 23° C. and the reaction solution was reacted for 2 hours. Thereafter, ethanol and water being reaction by-products were removed by distillation under reduced pressure and the reaction solution was concentrated to give a hydrolysis condensate (polysiloxane). Subsequently, ethanol and water being reaction by-products were removed by distillation under reduced pressure at 50° C. and then at 100° C. and the aqueous solution was concentrated to give a hydrolysis condensate (polysiloxane). Thereafter, water was added to the aqueous solution to adjust the aqueous solution to a concentration of 20% by mass in terms of solid residue at 140° C. as a solvent ratio of 100% water (water solvent alone). The obtained polymer corresponded to Formula (2-3-5).

Synthesis Example 4-5

To the polymer obtained in Synthesis Example 3-5, 5 g of an anion exchange resin was added to remove hydrochloric acid anions. The obtained polymer corresponded to Formula (2-4-5).

Synthesis Example 5-5

In a 300 ml flask 5.39 g of acetic acid and 179.58 g of ultrapure water were placed. To the mixed solution 3.72 g of dimethylaminopropyltrimethoxysilane (30% by mole in total silane) was added dropwise while stirring the mixed solution with a magnetic stirrer. After stirring at room temperature for 5 minutes, this aqueous solution was added dropwise to 8.73 g of tetraethoxysilane (70% by mole in total silane). After the addition, the flask was transferred to an oil bath adjusted to 23° C. and the reaction solution was reacted for 2 hours. Thereafter, ethanol and water being reaction by-products were removed by distillation under reduced pressure and the reaction solution was concentrated to give a hydrolysis condensate (polysiloxane). Subsequently, ethanol and water being reaction by-products were removed by distillation under reduced pressure at 50° C. and then at 100° C. and the aqueous solution was concentrated to give a hydrolysis condensate (polysiloxane). Thereafter, water was added to the aqueous solution to adjust the aqueous solution to a concentration of 20% by mass in terms of solid residue at 140° C. as a solvent ratio of 100% water (water solvent alone). The obtained polymer corresponded to Formula (2-5-5).

Synthesis Example 6-5

To the polymer obtained in Synthesis Example 5-5, 5 g of an anion exchange resin was added to remove acetate anions. The obtained polymer corresponded to Formula (2-2-5).

Synthesis Example 7-5

In a 300 ml flask 6.0 g of acetic acid and 199.70 g of ultrapure water were placed. To the mixed solution 4.42 g of aminopropyltriethoxysilane (30% by mole in total silane) was added dropwise while stirring the mixed solution with a magnetic stirrer. After stirring at room temperature for 5 minutes, this aqueous solution was added dropwise to 9.71 g of tetraethoxysilane (70% by mole in total silane). After the addition, the flask was transferred to an oil bath adjusted to 23° C. and the reaction solution was reacted for 2 hours. Thereafter, ethanol and water being reaction by-products were removed by distillation under reduced pressure and the reaction solution was concentrated to give a hydrolysis condensate (polysiloxane). Subsequently, ethanol and water being reaction by-products were removed by distillation under reduced pressure at 50° C. and then at 100° C. and the aqueous solution was concentrated to give a hydrolysis condensate (polysiloxane). Thereafter, water was added to the aqueous solution to adjust the aqueous solution to a concentration of 20% by mass in terms of solid residue at 140° C. as a solvent ratio of 100% water (water solvent alone). The obtained polymer corresponded to Formula (2-6-5).

Synthesis Example 8-5

To the polymer obtained in Synthesis Example 7-5, 5 g of an anion exchange resin was added to remove acetate anions. The obtained polymer corresponded to Formula (2-4-5).

(Preparation of Composition for Applying Resist Pattern)

The polysiloxane (polymer) obtained in Synthesis Examples, inorganic compounds, acids, and solvents each are mixed in ratios listed in Tables 1-1 to 1-6 and the resultant mixtures were filtered with a 0.1 μm fluorocarbon resin filter to prepare each composition for applying to the resist pattern. The addition ratios of the polymer in Tables were not the addition amount of the polymer solution but the addition amount of the polymer itself.

In Tables, ultrapure water was used as water. Each addition amount was listed by parts by mass. APTEOS refers to aminopropyltrimethoxysilane and TPSCS refers to triphenylsulfonium camphorsulfonate.

The following inorganic compounds 1 to 7 were prepared as examples of the inorganic compounds of the metal oxide (a1), the polyacid (a2), and the polyacid salt (a3). Inorganic Compound 1 refers to ammonium metatungstate, Inorganic Compound 2 refers to silicotungstic acid, Inorganic Compound 3 refers to phosphotungstic acid, Inorganic Compound 4 refers to ammonium molybdate, Inorganic Compound 5 refers to phosphomolybdic acid, Inorganic Compound 6 refers to tungstic acid, and Inorganic Compound 7 refers to molybdic acid.

A nonionic surfactant refers to a surfactant that is not ionic and polyoxyethylene polyoxypropylene glycol was used. An anionic surfactant refers to a surfactant having an anion site bonding to the main component and ammonium palmitate was used. A cationic surfactant refers to a surfactant having a cation site bonding to the main component and dodecyltrimethylammonium salt was used. A silicon-based surfactant refers to a surfactant containing a silicon atom in the main component and BYK331 (trade name, manufactured by BYK-Chemie GmbH) was used. A UV curable surfactant refers to a surfactant having a site polymerized by UV irradiation and BYK333 (trade name, manufactured by BYK-Chemie GmbH) was used.

A PSS-octa[(3-propylglycidylether)dimethylsiloxy] substituted product, a PSS-octa[(3-hydroxypropyl)dimethylsiloxy] substituted product, and octakis(tetra methylammonium)pentacyclooctasiloxane-octakis(iloxide) hydrate was used as Cage-type PSQ 1, Cage-type PSQ 2, and Cage-type PSQ 3, respectively.

The polysiloxane aqueous solutions of Comparative Synthesis Example 1-1 and Reference Synthetic Example 1-1 were cloudy and were not sufficiently uniform aqueous solutions, so that these solutions could not be used as compositions applied to the resist pattern of the present invention.

TABLE 1

| | Silane or polysiloxane | Additive | Solvent |
|---|---|---|---|
| Example 1-1 | Synthesis Example 1-1 | | Water |
| (Part by mass) | 5 | | 100 |
| Example 2-1 | Synthesis Example 2-1 | | Water |
| (Part by mass) | 5 | | 100 |
| Example 3-1 | Synthesis Example 3-1 | | Water |
| (Part by mass) | 5 | | 100 |
| Example 4-1 | Synthesis Example 4-1 | | Water |
| (Part by mass) | 5 | | 100 |
| Example 5-1 | Synthesis Example 5-1 | | Water |
| (Part by mass) | 5 | | 100 |
| Example 6-1 | Synthesis Example 6-1 | | Water |
| (Part by mass) | 5 | | 100 |
| Example 7-1 | Synthesis Example 1-1 | Maleic acid | Water |
| (Part by mass) | 5 | 0.05 | 100 |
| Example 8-1 | Synthesis Example 3-1 | Nitric acid | Water |
| (Part by mass) | 5 | 0.05 | 100 |
| Example 9-1 | Synthesis Example 6-1 | Methanesulfonic acid | Water |
| (Part by mass) | 5 | 0.05 | 100 |
| Example 10-1 | Synthesis Example 1-1 | Methylaminoethanol | Water |
| (Part by mass) | 5 | 0.05 | 100 |
| Example 11-1 | APTEOS | | Water |
| (Part by mass) | 10 | | 100 |
| Example 12-1 | Synthesis Example 1-1 | Nonionic surfactant | Water |
| (Part by mass) | 5 | 0.05 | 100 |
| Example 13-1 | Synthesis Example 3-1 | Anionic surfactant | Water |
| (Part by mass) | 5 | 0.05 | 100 |
| Example 14-1 | Synthesis Example 5-1 | Cationic surfactant | Water |
| (Part by mass) | 5 | 0.05 | 100 |
| Example 15-1 | Synthesis Example 6-1 | Silicon-based surfactant | Water |
| (Part by mass) | 5 | 0.05 | 100 |
| Example 16-1 | Synthesis Example 1-1 | UV curable surfactant | Water |
| (Part by mass) | 5 | 0.05 | 100 |
| Example 17-1 | Synthesis Example 7-1 | | Water |
| (Part by mass) | 5 | | 100 |
| Example 18-1 | Synthesis Example 8-1 | | Water |
| (Part by mass) | 5 | | 100 |
| Example 19-1 | Synthesis Example 9-1 | | Water |
| (Part by mass) | 5 | | 100 |
| Example 20-1 | Synthesis Example 6-1 | Cationic surfactant | Water |
| (Part by mass) | 5 | 0.05 | 100 |
| Example 21-1 | Synthesis Example 6-1 | Nonanuorobutanesulfonic acid | Water |
| (Part by mass) | 5 | 0.05 | 100 |
| Example 22-1 | Synthesis Example 6-1 | TPSCS | Water |
| (Part by mass) | 5 | 0.05 | 100 |
| Example 1-2 | Synthesis Example 1-2 | | Water |
| (Part by mass) | 5 | | 100 |
| Example 2-2 | Synthesis Example 2-2 | | Water |
| (Part by mass) | 5 | | 100 |
| Example 3-2 | Synthesis Example 3-2 | | Water |
| (Part by mass) | 5 | | 100 |
| Example 4-2 | Synthesis Example 4-2 | | Water |
| (Part by mass) | 5 | | 100 |
| Example 5-2 | Synthesis Example 5-2 | | Water |
| (Part by mass) | 5 | | 100 |
| Example 6-2 | Synthesis Example 6-2 | | Water |
| (Part by mass) | 5 | | 100 |
| Example 7-2 | Synthesis Example 7-2 | | Water |
| (Part by mass) | 5 | | 100 |
| Example 8-2 | Synthesis Example 8-2 | | Water |
| (Part by mass) | 5 | | 100 |
| Example 9-2 | Synthesis Example 9-2 | | Water |
| (Part by mass) | 5 | | 100 |
| Example 10-2 | Synthesis Example 10-2 | | Water |
| (Part by mass) | 5 | | 100 |
| Example 11-2 | Synthesis Example 11-2 | | Water |
| (Part by mass) | 5 | | 100 |
| Example 12-2 | Synthesis Example 12-2 | | Water |
| (Part by mass) | 5 | | 100 |
| Example 13-2 | Synthesis Example 13-2 | | Water |
| (Part by mass) | 5 | | 100 |
| Example 14-2 | Synthesis Example 14-2 | | Water |
| (Part by mass) | 5 | | 100 |
| Example 15-2 | Synthesis Example 15-2 | | Water |
| (Part by mass) | 5 | | 100 |
| Example 16-2 | Synthesis Example 16-2 | | Water |
| (Part by mass) | 5 | | 100 |

TABLE 1-continued

| | | | |
|---|---|---|---|
| Example 17-2 | Synthesis Example 17-2 | | Water |
| (Part by mass) | 5 | | 100 |
| Example 18-2 | Synthesis Example 11-2 | Maleic acid | Water |
| (Part by mass) | 5 | 0.25 | 100 |
| Example 19-2 | Synthesis Example 12-2 | Nitric acid | Water |
| (Part by mass) | 5 | 0.25 | 100 |
| Example 20-2 | Synthesis Example 13-2 | Methanesulfonic acid | Water |
| (Part by mass) | 5 | 0.25 | 100 |
| Example 21-2 | Synthesis Example 14-2 | Methylaminoethanol | Water |
| (Part by mass) | 5 | 0.25 | 100 |
| Example 22-2 | Synthesis Example 15-2 | Nonafluorobutanesulfonic acid | Water |
| (Part by mass) | 5 | 0.05 | 100 |
| Example 23-2 | Synthesis Example 11-2 | TPSCS | Water |
| (Part by mass) | 5 | 0.25 | 100 |
| Example 24-2 | Synthesis Example 12-2 | Anionic surfactant | Water |
| (Part by mass) | 5 | 0.05 | 100 |
| Example 25-2 | Synthesis Example 13-2 | Cationic surfactant | Water |
| (Part by mass) | 5 | 0.05 | 100 |
| Example 26-2 | Synthesis Example 14-2 | Silicon-based surfactant | Water |
| (Part by mass) | 5 | 0.05 | 100 |
| Example 27-2 | Synthesis Example 15-2 | UV curable surfactant | Water |
| (Part by mass) | 5 | 0.05 | 100 |
| Example 28-2 | Synthesis Example 16-2 | Silicotungstic acid | Water |
| (Part by mass) | 5 | 1.00 | 100 |
| Example 29-2 | APTEOS | Nitric acid | Water |
| (Part by mass) | 10 | 0.25 | 100 |
| Example 1-3 | Synthesis Example 1-3 | | Water |
| (Part by mass) | 5 | | 100 |
| Example 2-3 | Synthesis Example 2-3 | | Water |
| (Part by mass) | 5 | | 100 |
| Example 3-3 | Synthesis Example 3-3 | | Water |
| (Part by mass) | 5 | | 100 |
| Example 4-3 | Synthesis Example 4-3 | | Water |
| (Part by mass) | 5 | | 100 |
| Example 5-3 | Synthesis Example 5-3 | | Water |
| (Part by mass) | 5 | | 100 |
| Example 6-3 | Synthesis Example 6-3 | | Water |
| (Part by mass) | 5 | | 100 |
| Example 7-3 | Synthesis Example 7-3 | | Water |
| (Part by mass) | 5 | | 100 |
| Example 8-3 | Synthesis Example 8-3 | | Water |
| (Part by mass) | 5 | | 100 |
| Example 9-3 | Synthesis Example 9-3 | | Water |
| (Part by mass) | 5 | | 100 |
| Example 10-3 | Synthesis Example 10-3 | | Water |
| (Part by mass) | 5 | | 100 |
| Example 11-3 | Synthesis Example 11-3 | | Water |
| (Part by mass) | 5 | | 100 |
| Example 12-3 | Synthesis Example 12-3 | | Water |
| (Part by mass) | 5 | | 100 |
| Example 13-3 | Synthesis Example 13-3 | | Water |
| (Part by mass) | 5 | | 100 |
| Example 14-3 | Synthesis Example 14-3 | | Water |
| (Part by mass) | 5 | | 100 |
| Example 15-3 | Synthesis Example 1-3 | Maleic acid | Water |
| (Part by mass) | 5 | 0.15 | 100 |
| Example 16-3 | Synthesis Example 6-3 | Nitric acid | Water |
| (Part by mass) | 5 | 0.15 | 100 |
| Example 17-3 | Synthesis Example 7-3 | Methanesulfonic acid | Water |
| (Part by mass) | 5 | 0.15 | 100 |
| Example 18-3 | Synthesis Example 1-3 | Methylaminoethanol | Water |
| (Part by mass) | 5 | 0.25 | 100 |
| Example 19-3 | Synthesis Example 1-3 | Nonionic surfactant | Water |
| (Part by mass) | 5 | 0.05 | 100 |
| Example 20-3 | Synthesis Example 6-3 | Anionic surfactant | Water |
| (Part by mass) | 5 | 0.05 | 100 |
| Example 21-3 | Synthesis Example 7-3 | Cationic surfactant | Water |
| (Part by mass) | 5 | 0.05 | 100 |
| Example 22-3 | Synthesis Example 1-3 | Silicon-based surfactant | Water |
| (Part by mass) | 5 | 0.05 | 100 |
| Example 23-3 | Synthesis Example 6-3 | ITV curable surfactant | Water |
| (Part by mass) | 5 | 0.05 | 100 |
| Example 24-3 | Synthesis Example 1-3 | Dodecylbenzenesulfonic acid | Water |
| (Part by mass) | 5 | 0.25 | 100 |
| Example 25-3 | Synthesis Example 6-3 | Nonafluorobutanesulfonic acid | Water |
| (Part by mass) | 5 | 0.25 | 100 |

TABLE 1-continued

| | | | | |
|---|---|---|---|---|
| Example 26-3 (Part by mass) | Synthesis Example 7-3 5 | TPSCS 0.25 | | Water 100 |

| | Inorganic Compound | Silane or polysiloxane | Additive | Solvent |
|---|---|---|---|---|
| Example 1-4 (Part by mass) | Inorganic Compound 1 5 | | | Water 100 |
| Example 2-4 (Part by mass) | Inorganic Compound 2 5 | | | Water 100 |
| Example 3-4 (Part by mass) | Inorganic Compound 3 5 | | | Water 100 |
| Example 4-4 (Part by mass) | Inorganic Compound 4 5 | | | Water 100 |
| Example 5-4 (Part by mass) | Inorganic Compound 5 5 | | | Water 100 |
| Example 6-4 (Part by mass) | Inorganic Compound 6 5 | | | Water 100 |
| Example 7-4 (Part by mass) | Inorganic Compound 7 5 | | | Water 100 |
| Example 8-4 (Part by mass) | Inorganic Compound 1 3.5 | Synthesis Example 2-1 1.5 | | Water 100 |
| Example 9-4 (Part by mass) | Inorganic Compound 2 3.5 | Synthesis Example 6-1 1.5 | | Water 100 |
| Example 10-4 (Part by mass) | Inorganic Compound 3 3.5 | Synthesis Example 1-3 1.5 | | Water 100 |
| Example 11-4 (Part by mass) | Inorganic Compound 4 3.5 | Synthesis Example 5-3 1.5 | | Water 100 |
| Example 12-4 (Part by mass) | Inorganic Compound 5 3.5 | Synthesis Example 2-1 1.5 | | Water 100 |
| Example 13-4 (Part by mass) | Inorganic Compound 6 3.5 | Synthesis Example 6-1 1.5 | | Water 100 |
| Example 14-4 (Part by mass) | Inorganic Compound 7 3.5 | Synthesis Example 1-3 1.5 | | Water 100 |
| Example 15-4 (part by mass) | Inorganic Compound 1 3.5 | Synthesis Example 2-1 1.5 | Maleic acid 0.25 | Water 100 |
| Example 16-4 (Part by mass) | Inorganic Compound 2 3.5 | Synthesis Example 6-1 1.5 | Nitric acid 0.25 | Water 100 |
| Example 17-4 (Part by mass) | Inorganic Compound 3 3.5 | Synthesis Example 1-3 1.5 | Methanesulfonic acid 0.25 | Water 100 |
| Example 18-4 (Part by mass) | Inorganic Compound 4 3.5 | Synthesis Example 5-3 1.5 | Methylaminoethanol 0.25 | Water 100 |
| Example 19-4 (Part by mass) | Inorganic Compound 5 3.5 | Synthesis Example 2-1 1.5 | Nonionic surfactant 0.05 | Water 100 |
| Example 20-4 (Part by mass) | Inorganic Compound 1 3.5 | Synthesis Example 2-1 1.5 | Anionic surfactant 0.05 | Water 100 |
| Example 21-4 (Part by mass) | Inorganic Compound 2 3.5 | Synthesis Example 6-1 1.5 | Cationic surfactant 0.05 | Water 100 |
| Example 22-4 (Part by mass) | Inorganic Compound 1 3.5 | Synthesis Example 2-1 1.5 | Silicon-based surfactant 0.05 | Water 100 |
| Example 23-4 (Part by mass) | Inorganic Compound 2 3.5 | Synthesis Example 6-1 1.5 | UV curable surfactant 0.05 | Water 100 |
| Example 24-4 (Part by mass) | Inorganic Compound 1 5 | | Dodecylbenzenesulfonic acid 0.25 | Water 100 |
| Example 25-4 (Part by mass) | Inorganic Compound 2 5 | | Nonafluorobutanesulfonic acid 0.25 | Water 100 |
| Example 26-4 (Part by mass) | Inorganic Compound 3 5 | | TPSCS 0.25 | Water 100 |

| | Silane or polysiloxane | Additive | Solvent |
|---|---|---|---|
| Example 1-5 (Part by mass) | Synthesis Example 1-4 5 | | Water 100 |
| Example 2-5 (Part by mass) | Synthesis Example 1-4 5 | | Water 100 |
| Example 3-5 (Part by mass) | Synthesis Example 2-4 5 | | Water 100 |
| Example 4-5 (Part by mass) | Synthesis Example 2-4 5 | | Water 100 |
| Example 5-5 (Part by mass) | Synthesis Example 1-4 5 | Nitric acid 0.25 | Water 100 |

TABLE 1-continued

| | | | |
|---|---|---|---|
| Example 6-5 | Synthesis Example 2-4 | Nitric acid | Water |
| (Part by mass) | 5 | 0.25 | 100 |
| Example 7-5 | Cage type PSQ 1 | Nitric acid | Water |
| (Part by mass) | 5 | 0.25 | 100 |
| Example 8-5 | Cage type PSQ 2 | Nitric acid | Water |
| (Part by mass) | 5 | 0.25 | 100 |
| Example 9-5 | Cage type PSQ 3 | Nitric acid | Water |
| (Part by mass) | 5 | 0.25 | 100 |
| Example 10-5 | Synthesis Example 1-4 | Nonafluorobutanesulfonic acid | Water |
| (Part by mass) | 5 | 0.25 | 100 |
| Example 11-5 | Synthesis Example 2-4 | Nonalluorobutanesulfonic acid | water |
| (Part by mass) | 5 | 0.25 | 100 |
| Example 12-5 | Cage type PSQ 1 | Nonafluorobutanesulfonic acid | Water |
| (Part by mass) | 5 | 0.25 | 100 |
| Example 1-6 | Synthesis Example 1-5 | Nonafluorobutanesulfonic acid | Water |
| (Part by mass) | 5 | 0.05 | 100 |
| Example 2-6 | Synthesis Example 2-5 | Nonafluorobutanesulfonic acid | Water |
| (Part by mass) | 5 | 0.05 | 100 |
| Example 3-6 | Synthesis Example 3-5 | Nonafluorobutanesulfonic acid | Water |
| (Part by mass) | 5 | 0.05 | 100 |
| Example 4-6 | Synthesis Example 4-5 | Nonafluorobutanesulfonic acid | Water |
| (Part by mass) | 5 | 0.05 | 100 |
| Example 5-6 | Synthesis Example 5-5 | Nonafluorobutanesulfonic acid | Water |
| (Part by mass) | 5 | 0.05 | 100 |
| Example 6-6 | Synthesis Example 6-5 | Nonafluorobutanesulfonic acid | Water |
| (Part by mass) | 5 | 0.05 | 100 |
| Example 7-6 | Synthesis Example 7-5 | Nonafluorobutanesulfonic acid | Water |
| (Part by mass) | 5 | 0.05 | 100 |
| Example 8-6 | Synthesis Example 8-5 | Nonafluorobutanesulfonic acid | Water |
| Part by mass | 5 | 0.05 | 100 |

(Preparation of Organic Resist Underlayer Film Forming Composition)

Under nitrogen atmosphere, carbonazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and para-toluene sulfonic acid monohydrate (0.76 g, 0.0040 mol, manufactured by Tokyo Chemical Industry Co., Ltd.) were placed into a 100 ml four-necked flask and 1,4-dioxane (6.69 g, manufactured by KANTO CHEMICAL CO., INC.) was charged. The resultant mixture was stirred and dissolved by heating to 100° C. to start polymerization. After 24 hours, the resultant mixture was allowed to cool to 60° C., diluted with chloroform (34 g, manufactured by KANTO CHEMICAL CO., INC.), and reprecipitated in methanol (168 g, manufactured by KANTO CHEMICAL CO., INC.). The obtained precipitate was filtered and dried at 80° C. for 24 hours in a reduced pressure drier to give 9.37 g of the target polymer (Formula (3-1), hereinafter abbreviated as PCzFL).

Formula (3-1)

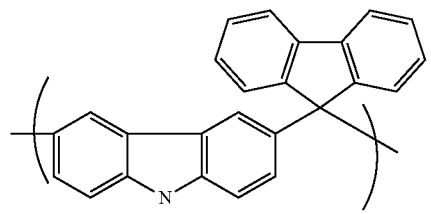

The measurement result of $^1$H-NMR of PCzFL was as follows. $^1$H-NMR (400 MHz, DMSO-$d_6$): δ 7.03-7.55 (br, 12H), δ 7.61-8.10 (br, 4H), δ 11.18 (br, 1H)

The weight average molecular weight Mw and the degree of distribution Mw/Mn of PCzFL measured by GPC in terms of polystyrene were 2,800 and 1.77, respectively.

As a crosslinking agent 3.0 g of tetramethoxymethylglycoluril (trade name POWDERLINK 1174 manufactured by Mitsui Cytec, Ltd.), 0.30 g of pyridinium paratoluenesulfonate as a catalyst, 0.06 g of Megafac R-30 (trade name, manufactured by Dainippon Ink and Chemicals, Inc.) as a surfactant were mixed to 20 g of the obtained resin and the resultant mixture was dissolved in 88 g of propylene glycol monomethyl ether acetate to prepare a solution. Thereafter, the solution was filtered using a polyethylene microfilter having a pore diameter of 0.10 μm and further filtered using a polyethylene microfilter having a pore diameter of 0.05 μm to prepare a solution of an organic resist underlayer film forming composition to be used in a lithographic process using a multilayer film.

(Measurement of Dry Etching Rate)

Etchers and etching gases used for the measurement of the dry etching rate were as follows.

ES 401 (manufactured by Nippon Scientific Co., Ltd.): $CF_4$

RIE-10 NR (manufactured by Samco Inc.): $O_2$

Silicon wafers were coated with the compositions for applying to the resist pattern prepared in Examples using a spinner. Each of coating films containing Si (a coating film for measuring an etching rate with $CF_4$ gas having a film thickness of 0.1 μm and a coating film for measuring an etching rate with $O_2$ gas having a film thickness of 0.1 μm) was formed by heating the coated wafers on a hot plate at 100° C. for 1 minute. Similarly, the coating film of the organic resist underlayer film forming composition was formed on a silicon wafer (film thickness: 0.20 μm) by using a spinner. The dry etching rates were measured using $CF_4$ gas and $O_2$ gas as the etching gases and compared with the dry etching rates of the Si-containing coating films prepared from Examples. The results are listed in Tables 2-1 to 2-6.

TABLE 2-1

|  | Etch rate using fluorine-based gas (nm/min) | Resistance to oxygen-based gas (relative to organic resist underlayer film) |
| --- | --- | --- |
| Example 1-1 | 29 | 0.08 |
| Example 2-1 | 29 | 0.08 |
| Example 3-1 | 29 | 0.04 |
| Example 4-1 | 30 | 0.03 |
| Example 5-1 | 30 | 0.05 |
| Example 6-1 | 29 | 0.07 |
| Example 7-1 | 29 | 0.08 |
| Example 8-1 | 29 | 0.04 |
| Example 9-1 | 29 | 0.07 |
| Example 10-1 | 29 | 0.08 |
| Example 11-1 | 29 | 0.06 |
| Example 12-1 | 29 | 0.08 |
| Example 13-1 | 29 | 0.04 |
| Example 14-1 | 30 | 0.05 |
| Example 15-1 | 29 | 0.07 |
| Example 16-1 | 29 | 0.08 |
| Example 17-1 | 30 | 0.10 |
| Example 18-1 | 35 | 0.10 |
| Example 19-1 | 35 | 0.14 |
| Example 20-1 | 29 | 0.08 |
| Example 21-1 | 29 | 0.08 |
| Example 22-1 | 29 | 0.08 |

TABLE 2-2

|  | Etch rate using fluorine-based gas (nm/min) | Resistance to oxygen-based gas (relative to organic resist underlayer film) |
| --- | --- | --- |
| Example 1-2 | 29 | 0.08 |
| Example 2-2 | 29 | 0.08 |
| Example 3-2 | 29 | 0.08 |
| Example 4-2 | 30 | 0.08 |
| Example 5-2 | 30 | 0.08 |
| Example 6-2 | 29 | 0.08 |
| Example 7-2 | 29 | 0.04 |
| Example 8-2 | 29 | 0.08 |
| Example 9-2 | 26 | 0.10 |
| Example 10-2 | 28 | 0.09 |
| Example 11-2 | 28 | 0.10 |
| Example 12-2 | 27 | 0.12 |
| Example 13-2 | 28 | 0.10 |
| Example 14-2 | 28 | 0.10 |
| Example 15-2 | 28 | 0.10 |
| Example 16-2 | 29 | 0.10 |
| Example 17-2 | 26 | 0.13 |
| Example 18-2 | 28 | 0.10 |
| Example 19-2 | 27 | 0.12 |
| Example 20-2 | 28 | 0.10 |
| Example 21-2 | 28 | 0.10 |
| Example 22-2 | 28 | 0.10 |
| Example 23-2 | 28 | 0.10 |
| Example 24-2 | 27 | 0.12 |
| Example 25-2 | 28 | 0.10 |
| Example 26-2 | 27 | 0.10 |

TABLE 2-2-continued

|  | Etch rate using fluorine-based gas (nm/min) | Resistance to oxygen-based gas (relative to organic resist underlayer film) |
| --- | --- | --- |
| Example 27-2 | 28 | 0.10 |
| Example 28-2 | 32 | 0.05 |
| Example 29-2 | 28 | 0.08 |

TABLE 2-3

|  | Etch rate using fluorine-based gas (nm/min) | Resistance to oxygen-based gas (relative to organic resist underlayer film) |
| --- | --- | --- |
| Example 1-3 | 27 | 0.05 |
| Example 2-3 | 29 | 0.08 |
| Example 3-3 | 29 | 0.08 |
| Example 4-3 | 32 | 0.14 |
| Example 5-3 | 28 | 0.07 |
| Example 6-3 | 29 | 0.07 |
| Example 7-3 | 29 | 0.07 |
| Example 8-3 | 29 | 0.07 |
| Example 9-3 | 29 | 0.07 |
| Example 10-3 | 27 | 0.05 |
| Example 11-3 | 27 | 0.05 |
| Example 12-3 | 29 | 0.06 |
| Example 13-3 | 29 | 0.07 |
| Example 14-3 | 27 | 0.03 |
| Example 15-3 | 27 | 0.05 |
| Example 16-3 | 29 | 0.07 |
| Example 17-3 | 29 | 0.07 |
| Example 18-3 | 27 | 0.05 |
| Example 19-3 | 27 | 0.05 |
| Example 20-3 | 29 | 0.07 |
| Example 21-3 | 29 | 0.07 |
| Example 22-3 | 27 | 0.05 |
| Example 23-3 | 29 | 0.07 |
| Example 24-3 | 27 | 0.05 |
| Example 25-3 | 29 | 0.07 |
| Example 26-3 | 29 | 0.07 |

TABLE 2-4

|  | Etch rate using fluorine-based gas (nm/min) | Resistance to oxygen-based gas (relative to organic resist underlayer film) |
| --- | --- | --- |
| Example 1-4 | 24 | 0.01 |
| Example 2-4 | 22 | 0.00 |
| Example 3-4 | 18 | 0.00 |
| Example 4-4 | 20 | 0.00 |
| Example 5-4 | 54 | 0.00 |
| Example 6-4 | 20 | 0.00 |
| Example 7-4 | 20 | 0.00 |
| Example 8-4 | 28 | 0.02 |
| Example 9-4 | 24 | 0.02 |
| Example 10-4 | 20 | 0.02 |
| Example 11-4 | 22 | 0.02 |
| Example 12-4 | 40 | 0.02 |
| Example 13-4 | 24 | 0.02 |
| Example 14-4 | 24 | 0.02 |
| Example 15-4 | 28 | 0.02 |
| Example 16-4 | 24 | 0.02 |
| Example 17-4 | 20 | 0.02 |
| Example 18-4 | 22 | 0.02 |
| Example 19-4 | 40 | 0.02 |
| Example 20-4 | 28 | 0.02 |
| Example 21-4 | 24 | 0.02 |
| Example 22-4 | 27 | 0.02 |

TABLE 2-4-continued

|  | Etch rate using fluorine-based gas (nm/min) | Resistance to oxygen-based gas (relative to organic resist underlayer film) |
|---|---|---|
| Example 23-4 | 29 | 0.02 |
| Example 24-4 | 27 | 0.01 |
| Example 25-4 | 29 | 0.00 |
| Example 26-4 | 29 | 0.00 |

TABLE 2-5

|  | Etch rate using fluorine-based gas (nm/min) | Resistance to oxygen-based gas (relative to organic resist underlayer film) |
|---|---|---|
| Example 1-5 | 28 | 0.12 |
| Example 2-5 | 30 | 0.08 |
| Example 3-5 | 28 | 0.12 |
| Example 4-5 | 30 | 0.08 |
| Example 5-5 | 28 | 0.08 |
| Example 6-5 | 28 | 0.08 |
| Example 7-5 | 26 | 0.10 |
| Example 8-5 | 26 | 0.12 |
| Example 9-5 | 26 | 0.12 |
| Example 10-5 | 28 | 0.08 |
| Example 11-5 | 27 | 0.08 |
| Example 12-5 | 29 | 0.10 |

TABLE 2-6

|  | Etch rate using fluorine-based gas (nm/min) | Resistance to oxygen-based gas (relative to organic resist underlayer film) |
|---|---|---|
| Example 1-6 | 24 | 0.07 |
| Example 2-6 | 24 | 0.06 |
| Example 3-6 | 24 | 0.06 |
| Example 4-6 | 24 | 0.05 |
| Example 5-6 | 24 | 0.08 |
| Example 6-6 | 24 | 0.06 |
| Example 7-6 | 24 | 0.07 |
| Example 8-6 | 24 | 0.05 |

[Embedding Resist Pattern by ArF Exposure]

A silicon substrate was coated with the prepared organic resist underlayer film forming composition using a spinner and the coated composition was heated at 240° C. for 60 seconds to form a resist underlayer film having a film thickness of 400 nm. The resist underlayer film was coated with a resist solution (Trade name: AR2772JN, manufactured by JSR Corporation) for ArF using a spinner. By heating the coated resist solution on a hot plate at 110° C. for 90 seconds, a resist film having a film thickness of 210 nm was formed. Using the exposure apparatus for ArF excimer laser (S307E, manufactured by Nikon Corporation), the resist film was exposed under predetermined conditions. After the exposure of a target line width of 65 nm and a space width of 195 nm, heating (PEB) was carried out at 110° C. for 90 seconds and then the silicon substrate was cooled to room temperature on a cooling plate. Thereafter, the exposed resist film was developed using a 2.38% by mass tetramethylammonium aqueous solution to form a resist pattern. Subsequently, each of the coating compositions (coating liquids) of Examples was applied onto this resist pattern and the 2.38% by mass tetramethylammonium aqueous solution used for the development was replaced with this coating composition. Thereafter, the silicon substrate was spun at 1,500 rpm for 60 seconds to dry the solvent in the coating composition and then heated at 100° C. for 60 seconds to form a coating film to embed the resist pattern.

The coating films formed using the coating compositions of Examples were etched back by dry etching using a mixed gas of $CF_4$ (flow rate: 50 sccm) and Ar (flow rate: 200 sccm) to expose the upper part of the resist pattern. Thereafter, the resist pattern was removed by dry etching using a mixed gas of $O_2$ (flow rate: 10 sccm) and $N_2$ (flow rate: 20 sccm) to give a reverse pattern.

The results of embedding with the coating compositions of Examples were observed with a cross-sectional SEM. The pattern shapes of the reversed patterns obtained after the dry etching were also observed with the cross-sectional SEM. As Comparative Example 1, instead of coating the resist pattern after development with the coating compositions of Examples, the pattern shape of the resist pattern after rinsing after development using pure water as a conventional rinsing liquid was also observed with the cross-sectional SEM. Evaluation results of pattern embeddability and pattern shapes are listed in Tables 3-1 to 3-6. In Tables 3-1 to 3-6, "Good" means that the resist pattern can be embedded without generation of voids with respect to pattern embedding properties and means that the reversed pattern is formed without collapsing the pattern with respect to the pattern shapes.

In Comparative Example 1, photoresist pattern collapse was observed.

TABLE 3-1

|  | Pattern embedding property | Pattern shape |
|---|---|---|
| Example 1-1 | Good | Good |
| Example 2-1 | Good | Good |
| Example 3-1 | Good | Good |
| Example 4-1 | Good | Good |
| Example 5-1 | Good | Good |
| Example 6-1 | Good | Good |
| Example 7-1 | Good | Good |
| Example 8-1 | Good | Good |
| Example 9-1 | Good | Good |
| Example 10-1 | Good | Good |
| Example 11-1 | Good | Good |
| Example 12-1 | Good | Good |
| Example 13-1 | Good | Good |
| Example 14-1 | Good | Good |
| Example 15-1 | Good | Good |
| Example 16-1 | Good | Good |
| Example 17-1 | Good | Good |
| Example 18-1 | Good | Good |
| Example 19-1 | Good | Good |
| Example 20-1 | Good | Good |
| Example 21-1 | Good | Good |
| Example 22-1 | Good | Good |

TABLE 3-2

|  | Pattern embedding property | Pattern shape |
|---|---|---|
| Example 1-2 | Good | Good |
| Example 2-2 | Good | Good |
| Example 3-2 | Good | Good |
| Example 4-2 | Good | Good |
| Example 5-2 | Good | Good |

TABLE 3-2-continued

| | Pattern embedding property | Pattern shape |
|---|---|---|
| Example 6-2 | Good | Good |
| Example 7-2 | Good | Good |
| Example 8-2 | Good | Good |
| Example 9-2 | Good | Good |
| Example 10-2 | Good | Good |
| Example 11-2 | Good | Good |
| Example 12-2 | Good | Good |
| Example 13-2 | Good | Good |
| Example 14-2 | Good | Good |
| Example 15-2 | Good | Good |
| Example 16-2 | Good | Good |
| Example 17-2 | Good | Good |
| Example 18-2 | Good | Good |
| Example 19-2 | Good | Good |
| Example 20-2 | Good | Good |
| Example 21-2 | Good | Good |
| Example 22-2 | Good | Good |
| Example 23-2 | Good | Good |
| Example 24-2 | Good | Good |
| Example 25-2 | Good | Good |
| Example 26-2 | Good | Good |
| Example 27-2 | Good | Good |
| Example 28-2 | Good | Good |
| Example 29-2 | Good | Good |

TABLE 3-3

| | Pattern embedding property | Pattern shape |
|---|---|---|
| Example 1-3 | Good | Good |
| Example 2-3 | Good | Good |
| Example 3-3 | Good | Good |
| Example 4-3 | Good | Good |
| Example 5-3 | Good | Good |
| Example 6-3 | Good | Good |
| Example 7-3 | Good | Good |
| Example 8-3 | Good | Good |
| Example 9-3 | Good | Good |
| Example 10-3 | Good | Good |
| Example 11-3 | Good | Good |
| Example 12-3 | Good | Good |
| Example 13-3 | Good | Good |
| Example 14-3 | Good | Good |
| Example 15-3 | Good | Good |
| Example 16-3 | Good | Good |
| Example 17-3 | Good | Good |
| Example 18-3 | Good | Good |
| Example 19-3 | Good | Good |
| Example 20-3 | Good | Good |
| Example 21-3 | Good | Good |
| Example 22-3 | Good | Good |
| Example 23-3 | Good | Good |
| Example 24-3 | Good | Good |
| Example 25-3 | Good | Good |
| Example 26-3 | Good | Good |

TABLE 3-4

| | Pattern embedding property | Pattern shape |
|---|---|---|
| Example 1-4 | Good | Good |
| Example 2-4 | Good | Good |
| Example 3-4 | Good | Good |
| Example 4-4 | Good | Good |
| Example 5-4 | Good | Good |
| Example 6-4 | Good | Good |
| Example 7-4 | Good | Good |
| Example 8-4 | Good | Good |
| Example 9-4 | Good | Good |
| Example 10-4 | Good | Good |
| Example 11-4 | Good | Good |
| Example 12-4 | Good | Good |
| Example 13-4 | Good | Good |
| Example 14-4 | Good | Good |
| Example 15-4 | Good | Good |
| Example 16-4 | Good | Good |
| Example 17-4 | Good | Good |
| Example 18-4 | Good | Good |
| Example 19-4 | Good | Good |
| Example 20-4 | Good | Good |
| Example 21-4 | Good | Good |
| Example 22-4 | Good | Good |
| Example 23-4 | Good | Good |
| Example 24-4 | Good | Good |
| Example 25-4 | Good | Good |
| Example 26-4 | Good | Good |

TABLE 3-5

| | Pattern embedding property | Pattern shape |
|---|---|---|
| Example 1-5 | Good | Good |
| Example 2-5 | Good | Good |
| Example 3-5 | Good | Good |
| Example 4-5 | Good | Good |
| Example 5-5 | Good | Good |
| Example 6-5 | Good | Good |
| Example 7-5 | Good | Good |
| Example 8-5 | Good | Good |
| Example 9-5 | Good | Good |
| Example 10-5 | Good | Good |
| Example 11-5 | Good | Good |
| Example 12-5 | Good | Good |

TABLE 3-6

| | Pattern embedding property | Pattern shape |
|---|---|---|
| Example 1-6 | Good | Good |
| Example 2-6 | Good | Good |
| Example 3-6 | Good | Good |
| Example 4-6 | Good | Good |
| Example 5-6 | Good | Good |
| Example 6-6 | Good | Good |
| Example 7-6 | Good | Good |
| Example 8-6 | Good | Good |

INDUSTRIAL APPLICABILITY

The composition for applying to the resist pattern of the present invention does not cause collapse of the resist pattern by applying the composition onto the resist pattern to fill the spaces of the pattern with the composition when a fine pattern is formed in the lithographic process. After drying, a coating film of a polymer is formed in the spaces of the resist pattern and the pattern can be reversed by utilizing a difference in gas etching rates between the resist pattern and the polymer coating film formed in the spaces of the resist pattern.

The invention claimed is:
1. A composition for applying to a resist pattern comprising:
 a component (A), which is at least one compound selected from the group consisting of a metal oxide (a1), a polyacid (a2), a polyacid salt (a3), a hydrolyzable silane (a4), a hydrolysis product (a5) of the hydrolyzable silane, and a hydrolysis condensate (a6) of the hydrolyzable silane; and a component (B), which is an aqueous solvent, wherein the metal oxide (a1) is an oxide of titanium, zirconium, aluminum, or hafnium, the polyacid (a2) is an isopolyacid selected from molybdic acid or is a heteropolyacid selected from phosphomolybdic acid, the polyacid salt (a3) is an ammonium salt of an isopolyacid selected from molybdic acid or an ammonium salt of a heteropolyacid selected from phosphomolybdic acid, and the hydrolyzable silane (a4) is (i) a hydrolyzable silane containing an organic group having an amino group, (ii) a hydrolyzable silane containing an organic group having an ionic functional group, (iii) a hydrolyzable silane containing an organic group having hydroxy group, or (iv) a hydrolyzable silane containing an organic group having a functional group convertible to hydroxy group.

2. The composition according to claim 1, wherein a hydrolysis product of the hydrolyzable silane (a4) is a product obtained by hydrolyzing the hydrolyzable silane (a4) in the presence of an alkaline substance.

3. The composition according to claim 2, wherein the alkaline substance is an alkaline catalyst to be added at the time of hydrolysis of the hydrolyzable silane or is an amino group present in molecule of the hydrolyzable silane.

4. The composition according to claim 1, wherein the hydrolysis product of the hydrolyzable silane (a4) is a product obtained by hydrolyzing the hydrolyzable silane (a4) in the presence of an acidic substance.

5. The composition according to claim 1, wherein the hydrolyzable silane (a4) is a hydrolyzable silane of Formula (1) or Formula (1-1):

$$[R^1_{a0}Si(R^2)_{3-a0}]_{b0}R^3_{c0} \quad \text{Formula (1)}$$

$$[[Si(R^{10})_2O]_{n0}Si(R^{20})_2]R^{30}_2 \quad \text{Formula (1-1)}$$

wherein $R^3$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom; $R^1$ is an alkyl group, an aryl group, a halogenated alkyl group, a halogenated aryl group, an alkenyl group, or an organic group having an epoxy group, acryloyl group, methacryloyl group, mercapto group, or cyano group and bonding to a silicon atom through a Si—C bond; $R^2$ is an alkoxy group, an acyloxy group, or a halogen group; $a_0$ is an integer of 0 or 1; $b_0$ is an integer of 1 to 3; $c_0$ is an integer of 1 or 2;

$R^{10}$ and $R^{20}$ each are hydroxy group, an alkoxy group, an acyloxy group, or a halogen group; $R^{30}$ is an organic group having an amino group, an organic group having an ionic functional group, an organic group having hydroxy group, or an organic group having a functional group convertible to hydroxy group by hydrolysis, bonding to a silicon atom through a Si—C bond or a Si—N bond, and optionally forming a ring and bonding to a silicon atom; and n0 is an integer of 1 to 10.

6. The composition according to claim 5, wherein the composition comprises a combination of the hydrolyzable silane (a4) of Formula (1) or Formula (1-1) and at least one hydrolyzable silane (b) selected from the group consisting of hydrolyzable silanes of Formula (2):

$$R^4_a Si(R^5)_{4-a} \quad \text{Formula (2)}$$

wherein $R^4$ is an alkyl group, an aryl group, a halogenated alkyl group, a halogenated aryl group, an alkenyl group, or an organic group having acryloyl group, methacryloyl group, mercapto group, or cyano group and bonding to a silicon atom through a Si—C bond; $R^5$ is an alkoxy group, an acyloxy group, or a halogen group; and a is an integer of 0 to 3 and Formula (3):

$$[R^6_c Si(R^7)_{3-c}]_2 Z_b \quad \text{Formula (3)}$$

wherein $R^6$ is an alkyl group; $R^7$ is an alkoxy group, an acyloxy group, or a halogen group; Z is an alkylene group or an arylene group; b is an integer of 0 or 1; and c is an integer of 0 or 1.

7. The composition according to claim 6, wherein the hydrolyzable silane is a hydrolyzable silane containing the hydrolyzable silane (a4) and the hydrolyzable silane (b) in a molar ratio of (a4):(b)=3:97 to 100:0.

8. The composition according to claim 1, wherein the hydrolysis condensate (a6) of the hydrolyzable silane is a random-type, ladder-type, or cage-type silsesquioxane.

9. The composition according to claim 1, further comprising an acid or a base.

10. The composition according to claim 1, further comprising a surfactant.

11. The composition according to claim 1, further comprising a photoacid generator.

12. A method for producing a semiconductor device comprising:
  (1) a step of applying a resist onto a substrate;
  (2) a step of exposing and developing the resist;
  (3) a step of applying the composition as claimed in claim 1 to the resist pattern during development or after development; and
  (4) a step of etching and removing the resist pattern to reverse the pattern.

13. The method for producing a semiconductor device according to claim 12, further comprising (1-1) a step of forming a resist underlayer film on the substrate before the step (1).

14. The method for producing a semiconductor device according to claim 12, further comprising (3-1) a step of exposing a surface of the resist pattern by etching back a surface of a formed coating film after the step (3).

15. A method for producing a semiconductor device comprising:
  (a) a step of forming a resist underlayer film on a substrate;
  (b) a step of forming a hard mask on the resist underlayer film;
  (c) a step of forming a resist film on the hard mask;
  (d) a step of forming a resist pattern by light or electron beam irradiation and development;
  (e) a step of etching the hard mask using the resist pattern;
  (f) a step of etching the resist underlayer film using the patterned hard mask;
  (g) a step of applying the composition as claimed in claim 1 to the patterned resist underlayer film; and
  (h) a step of etching and removing the resist underlayer film to reverse the pattern.

* * * * *